(12) United States Patent
Shimada et al.

(10) Patent No.: US 8,303,860 B2
(45) Date of Patent: *Nov. 6, 2012

(54) COLORED CURABLE COMPOSITION, COLOR FILTER AND SOLID-STATE IMAGING DEVICE

(75) Inventors: Kazuto Shimada, Haibara-gun (JP); Atsushi Sugasaki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/921,648

(22) PCT Filed: Mar. 5, 2009

(86) PCT No.: PCT/JP2009/054216
§ 371 (c)(1),
(2), (4) Date: Sep. 9, 2010

(87) PCT Pub. No.: WO2009/113447
PCT Pub. Date: Sep. 17, 2009

(65) Prior Publication Data
US 2011/0017962 A1  Jan. 27, 2011

(30) Foreign Application Priority Data
Mar. 10, 2008 (JP) ................. 2008-059741

(51) Int. Cl.
*G02B 5/20* (2006.01)
*G02F 1/1335* (2006.01)

(52) U.S. Cl. ............... 252/586; 106/31.28; 349/106; 349/107; 349/138; 428/1.1; 428/220; 430/7; 430/270.1; 430/284.1; 430/286.1; 430/905; 522/78; 522/79; 522/90; 522/92; 522/100; 522/101; 522/169; 522/182

(58) Field of Classification Search ............... 252/586; 524/100, 101, 169, 90, 92, 93; 430/7, 285.1, 430/270.1, 284.1, 286.1, 287.1, 311, 905; 522/74, 75, 77, 78, 79, 96, 90, 92, 93, 100, 522/101, 169, 182; 106/31.28; 349/106, 349/107, 138; 428/1.1, 220

See application file for complete search history.

(56) References Cited

U.S. PATENT DOCUMENTS

| | | | | |
|---|---|---|---|---|
| 2003/0082464 | A1 | 5/2003 | Takashima et al. | |
| 2007/0049650 | A1* | 3/2007 | Araki | 522/6 |
| 2009/0085018 | A1* | 4/2009 | Shimada | 252/586 |

FOREIGN PATENT DOCUMENTS

| | | |
|---|---|---|
| EP | 0725285 A1 | 8/1996 |
| EP | 1826200 A2 | 8/2007 |
| EP | 1884543 A1 | 2/2008 |
| JP | 02-127602 A | 5/1990 |
| JP | 2002194244 A | 7/2002 |
| JP | 2003-043680 A | 2/2003 |
| JP | 2004347915 A | 12/2004 |
| JP | 2006-016545 A | 1/2006 |
| JP | 2006-030541 A | 2/2006 |
| JP | 2006-201730 A | 8/2006 |
| JP | 2006-215452 A | 8/2006 |
| JP | 2008020602 A | 1/2008 |
| JP | 2008033206 A | 2/2008 |
| JP | 2009 019169 A | 1/2009 |
| WO | WO 2005080337 A1 | 9/2005 |
| WO | 2007/147782 A2 | 12/2007 |

OTHER PUBLICATIONS

European Patent Office Communication issued in corresponding EP Application No. 09719268.6, dated Sep. 6, 2011.
Office Action dated Feb. 1, 2012 on Chinese Application No. 20090108178.5.

* cited by examiner

*Primary Examiner* — Bijan Ahvazi
(74) *Attorney, Agent, or Firm* — Sughrue Mion, PLLC

(57) ABSTRACT

A colored curable composition including: (A) a pigment dispersion containing (a-1) a pigment, (a-2) a compound having a pigment mother nucleus structure and an amino group in a molecule, and (a-3) a resin having an acid group and a polymerizable group; (B) an oxime ester initiator; and (C) a polymerizable compound.

9 Claims, No Drawings

COLORED CURABLE COMPOSITION, COLOR FILTER AND SOLID-STATE IMAGING DEVICE

TECHNICAL FIELD

The present invention relates to a colored curable composition suitable for preparing a color filter to be used for a liquid crystal display device (LCD), a solid-state imaging device (CCD, CMOS, and the like), or the like, a color filter having a colored region prepared from the composition, and a solid-state imaging device provided with the color filter.

BACKGROUND ART

A color filter is an essential constituent part for a liquid crystal display or a solid-state imaging device.

Since the liquid crystal display is compact and has equivalent or superior performance as compared with the CRT as a display device, it is replacing the CRT as a television screen, a PC screen, and other display devices. Moreover, recently, as to the trend in the development of the liquid crystal display, it is changing from the conventional monitor application having a screen of a relatively small area to the TV application having a large screen and a higher image quality.

In the applications of a color filter for a liquid crystal display (LCD), its substrate size is enlarged for the production of the large scale TV, and for improvement in productivity where a large substrate is used, curability with low energy is required. Further, the liquid crystal displays for use in the TV are required to have image quality at higher levels than those for use in conventional monitors. That is, improvements in contrast and color purity are required. For improvement in contrast, it is desirable that the curable compositions used in the preparation of color filters use coloring agents (organic pigments and the like) of finer particles (see, for example, Japanese Patent Application Laid-Open (JP-A) No. 2006-30541). As a consequence, the amount of a dispersant to be added for dispersing pigments tends to increase. For improvement in color purity, it is desirable that the content of a coloring agent (organic pigment) in a curable composition with respect to a total solid content of the curable composition is higher. Accordingly, the content ratios of a photopolymerization initiator and a photopolymerizable monomer in the curable composition with respect to a total solid content of the curable composition tend to decrease.

Even in the applications for a color filter for a solid-state imaging device, curing with low energy is desired. In addition, a pattern film is thinning, which is accompanied with increase in the concentration of a pigment in the composition. In the pigment-based color filters, the pigments are becoming finer, and as a consequence, the proportion of a pigment dispersant in the composition tends to increase. To cope with problems such as color unevenness and the like caused by relatively coarse particles of the pigment, techniques wherein an organic solvent-soluble dye is used as a coloring agent in place of the pigment are proposed (see, for example, JP-A No. 2-127602). In such dye-based color filters, however, a polymerization inhibiting effect originating from the dye is becoming prominent as the concentration of the dye in the composition is increased.

Due to these factors, even in the case of any of a liquid crystal display and a solid-state imaging device, the contents of the photopolymerization initiator and photopolymerizable monomer that are components necessary for curing a curable composition are limited, then the concentration of the coloring agent therein is increased, and layer thinning is made difficult. In addition, desired sensitivity is hardly achieved due to a low proportion of polymerizable components, and desired developability is difficult to secure since there is no room for incorporation of a development regulating agent.

That is, thinning of a colored region, particularly, a colored pattern, is accompanied by an increase in the proportion of a pigment and a pigment dispersant in a curable composition, so that the content ratio of curable components (polymerizable materials) is made relatively low, rendering maintenance of high sensitivity difficult, and consequently the addition amounts of other components not involved in coloring or curing, such as a polymer of high acid value, and a development accelerator to be added for the purpose of securing developability, and the like, are necessarily reduced, resulting in a problem of inferior development.

Additionally, there have been attempts at securing sensitivity without reducing color property by reducing the amount of a pigment dispersant to be added while maintaining the content of a pigment, but here a new problem arises in that the stability of a pigment dispersion deteriorates to increase viscosity over time thus making formation of a uniform coating film difficult.

When the colored curable composition is thus used in formation of colored regions in color filters, particularly in color filters for solid-state imaging devices, it is necessary to satisfy both film thinning and color value, and therefore a colored curable composition having a higher pigment concentration and capable of achieving both sensitivity and developability is highly desirable.

DISCLOSURE OF INVENTION

Problems to be Solved by the Invention

The present invention has been made in view of the above problems accompanying thinning of a colored region in a color filter. It is an object of the present invention to provide a colored curable composition which, even with a high content of a pigment, is capable of curing with high sensitivity, is excellent in developability and is capable of forming a thin-layer high-definition colored region excellent in hue, particularly a colored curable composition useful for formation of a colored region in a color filter.

It is another object of the present invention to provide a color filter provided with a thin-layer high-definition colored region excellent in color property formed from the colored curable composition, and a solid-state imaging device provided with the color filter excellent in color property.

Means for Solving Problems

The present inventors have made extensive studies, and as a result, they have found that the above-described problems can be solved by combining a pigment dispersion composition having guaranteed high dispersion stability of pigments obtained by combining a compound having a pigment mother nucleus structure and an amino group with a resin having an acid group and a polymerizable group, with an oxime ester initiator, thereby completing the present invention.

That is, the constitutions of the present invention are as follows.

<1> A colored curable composition comprising:

(A) a pigment dispersion containing (a-1) a pigment, (a-2) a compound having a pigment mother nucleus structure and an amino group in a molecule, and (a-3) a resin having an acid group and a polymerizable group;

(B) an oxime ester initiator; and (C) a polymerizable compound.

<2> The colored curable composition of <1>, wherein (a-2) the compound having a pigment mother nucleus structure and an amino group in a molecule is a compound having at least one of an amide structure or a urea structure.

<3> The colored curable composition of <1> or <2>, wherein (a-2) the compound having a pigment mother nucleus structure and an amino group in a molecule is a compound having a heterocyclic structure.

<4> The colored curable composition of any of <1> to <3>, which is used for formation of a colored region of a color filter.

<5> A color filter having a colored region formed by using the colored curable composition of <4>.

<6> A solid-state imaging device comprising the color filter of <5>.

The working mechanism of the present invention is not evident, but is deduced as follows:

When the curable composition of the present invention is prepared, (A) a pigment dispersion including (a-1) a pigment, (a-2) a compound having a pigment mother nucleus structure and an amino group in the molecule, and (a-3) a resin having an acid group and a polymerizable group is first obtained, and (A) the pigment dispersion is mixed with (B) an oxime ester initiator and (C) a polymerizable compound to prepare the colored curable composition of the present invention.

In (a-2) the compound having a pigment mother nucleus structure and an amino group in a molecule (hereinafter referred to sometimes as (a-2) a specific pigment derivative) contained in the pigment dispersion, the pigment mother nucleus structure forms an interaction with (a-1) the pigment having a mother nucleus structure similar thereto, so that (a-2) the specific pigment derivative is adsorbed onto the surface of (a-1) the pigment. The amino group in (a-2) the specific pigment derivative forms an interaction with (a-3) the coexisting resin having an acidic group and a polymerizable group [hereinafter appropriately referred to as (a-3) the specific dispersion resin], so that in (A) the pigment dispersion, (a-3) the specific dispersion resin is strongly bonded through (a-2) the specific pigment derivative to the surface of (a-1) the pigment, thereby making it difficult to eliminate (a-3) the specific dispersion resin from the surfaces of the pigments, and suppressing aggregation of the fine pigments for a long period.

In the preparation of a generally-used pigment dispersion, for exhibiting high dispersion stability, a large amount of a dispersant having an amino group is necessary for exhibiting interaction with an acid group of a dispersion resin and/or a pigment mother nucleus, and a predetermined amount of an acid group-containing resin is necessary for securing alkali developability, and therefore, the concentration of a pigment that is a coloring component in the pigment dispersion is difficult to increase, and making a thinner layer is hard to realize. In the present invention, since a pigment dispersion prepared using a pigment derivative having an amino group in the molecule and a resin having an acid group and a polymerizable group is used, an acid-base interaction is formed with the resin having an acid group and a polymerizable group, which is used for securing alkali developability, thereby allowing dispersion stability easily to be exhibited. Therefore, the content of a compound contributing to dispersion can be lower and a resin of a higher acid value can be used compared to the cases where conventionally-used acid group-containing pigment derivatives are used, and also, even when a high-definition pattern is prepared with high sensitivity, an oxime ester initiator (oxime ester compound) can be used therewith to effectively suppress a generally-observed reduction in sensitivity even if the concentration of a pigment in a pigment dispersion is increased. Since the oxime ester compound is neutral, it has good compatibility with a polymerizable compound or dispersant in the photosensitive layer, and therefore, it provides good sensitivity, particularly in this system.

Further, if the pigment concentration in the photosensitive layer is high, in order to attain a desired color value and film thickness, a large amount of the polymerizable compound cannot be added to the composition, and thus, the sensitivity is reduced. However, in the present invention, by using a resin having a polymerizable group as a resin for dispersing the pigment, high sensitivity can be achieved.

In the present invention, the "pigment mother nucleus structure" is a structure containing a chromophore in an organic pigment, and refers to a main skeleton structure of the pigment, which usually includes a heterocyclic structure containing a nitrogen atom, an oxygen atom, a sulfur atom, or the like, an amide group, a urea structure, or the like. In the present invention, "pigment mother nucleus structures" include "a structure similar to a pigment skeleton" and "a partial structure of a pigment skeleton", which are each capable of forming an interaction with the pigment skeleton possessed by the organic pigment due to having a structure similar to such a pigment main skeleton or having a partial structure of the pigment main skeleton.

Effects of Invention

According to the present invention, a colored curable composition which, even with a high content of a pigment, is capable of curing with high sensitivity, is excellent in developability and is capable of forming a thin-layer high-definition colored region excellent in hue, particularly a colored curable composition useful for formation of a colored region in a color filter, can be provided.

Further, a color filter provided with a thin-layer high-definition colored region excellent in color property formed from the colored curable composition and a solid-state imaging device provided with the color filter excellent in color property can be provided.

BEST MODE FOR CARRYING OUT THE INVENTION

Hereinafter, the present invention will be described in detail.

The colored curable composition of the present invention includes (A) a pigment dispersion containing (a-1) a pigment, (a-2) a compound having a pigment mother nucleus structure and an amino group in the molecule, and (a-3) a resin having an acid group and a polymerizable group, (B) an oxime ester initiator, and (C) a polymerizable compound. That is, (A) the specific pigment dispersion with excellent pigment dispersion stability is prepared, and (B) the oxime ester initiator and (C) the polymerizable compound are added thereto, whereby a colored region excellent in color property can be formed even in the form of a thin layer. Hereinafter, the respective components contained in the colored curable composition are described.

[(A) Pigment Dispersion]

(A) The pigment dispersion included in the colored curable composition of the present invention contains (a-1) a pigment, (a-2) a compound having a pigment mother nucleus structure and an amino group in the molecule, (a-3) a resin having an acid group and a polymerizable group, and further (a-4) a solvent.

<(a-2) Compound Having a Pigment Mother Nucleus Structure and an Amino Group in the Molecule ((a-2) Specific Pigment Derivative)>

(a-2) The specific pigment derivative is used to form an interaction between the pigment mother nucleus structure and (a-1) the pigment, thus securing adsorption therebetween, and to exhibit an interaction with (a-3) the specific dispersion resin by the amino group, thereby securing the dispersion stability of the pigment in (A) the pigment dispersion.

(a-2) The specific pigment derivative used in the present invention is preferably a compound including the following general formula (A) as a partial structure.

General Formula (A)

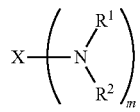

In the general formula (A), $R^1$ and $R^2$ each independently represent a hydrogen atom or a monovalent organic group. Preferable examples of the monovalent organic group include a saturated or unsaturated alkyl group having 1 to 20 carbon atoms, a saturated or unsaturated cycloalkyl group having 3 to 20 carbon atoms, and an aryl group.

These organic groups may further have a substituent, and examples of the substituent that can be introduced thereinto include a halogen atom, a hydroxyl group, an alkyl group, an alkenyl group, an alkynyl group, a cycloalkyl group, a cycloalkenyl group, a cycloalkynyl group, an aryl group, a heterocyclic group, a cyano group, an alkoxy group, an aryloxy group, a thioalkoxy group, a thioaryloxy group, a carboxyl group, an alkoxycarbonyl group, a sulfo group, a sulfonamide group, a urea group, a thiourea group, an amino group, an amide group, a carbonyl group, a nitro group, and substituents having these groups.

Further, $R^1$ and $R^2$ may be bonded to each other to form a ring.

The compound represented by the general formula (A) is preferably a compound having at least one structure selected from an amide structure or a urea structure in the molecule.

Also, the compound represented by the general formula (A) is preferably a compound having a heterocyclic structure.

X is a group having a valence of m, which contains a pigment mother nucleus structure.

As described above, the pigment mother nucleus structure may be a chromophore in the organic pigment, a structure similar thereto or a partial structure thereof. A specific example is a structure containing one or more partial structures selected from the group consisting of a skeleton having an azo group, a skeleton having a urea structure, a skeleton having an amide structure, a skeleton having a cyclic amide structure, an aromatic ring having a heteroatom-containing 5-membered ring, and an aromatic ring having a heteroatom-containing 6-membered ring, and X is a substituent containing such a pigment mother nucleus structure.

In the present invention, X preferably has a pigment mother nucleus structure, or a pigment mother nucleus structure and an aromatic ring, or a nitrogen-containing aromatic ring, or an oxygen-containing aromatic ring, or a sulfur-containing aromatic ring, and the amino group is bonded directly or via a connecting group to any of a pigment mother nucleus structure, an aromatic ring, a nitrogen-containing aromatic ring, an oxygen-containing aromatic ring, or a sulfur-containing aromatic ring.

Most preferably, X has a pigment mother nucleus structure and an aromatic ring, or a nitrogen-containing aromatic ring, and is preferably bonded via a divalent connecting group to the amino group.

m is an integer of 1 to 8, preferably from 1 to 6, and more preferably 2 to 6, from the viewpoints of dispersibility and storage stability of a dispersion.

Preferable examples of (a-2) the specific pigment derivative used in the present invention are shown below, but the present invention is not limited thereto.

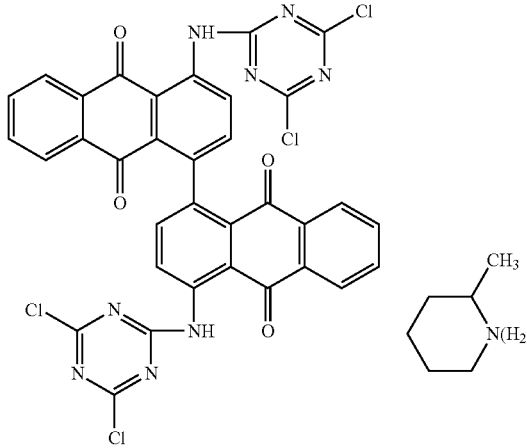

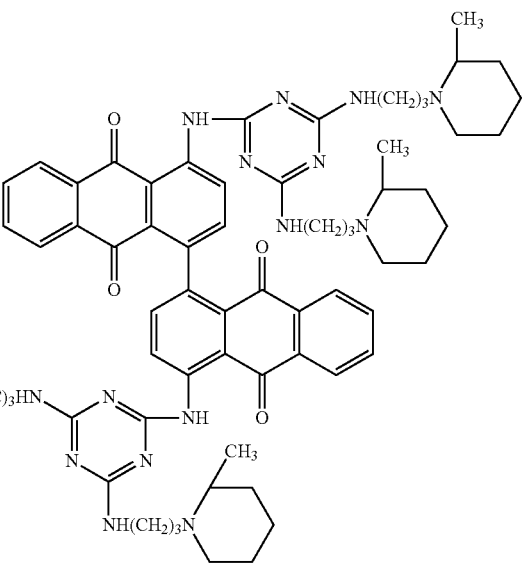

-continued
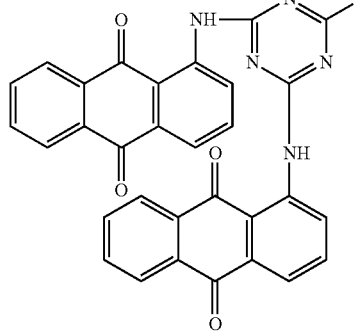
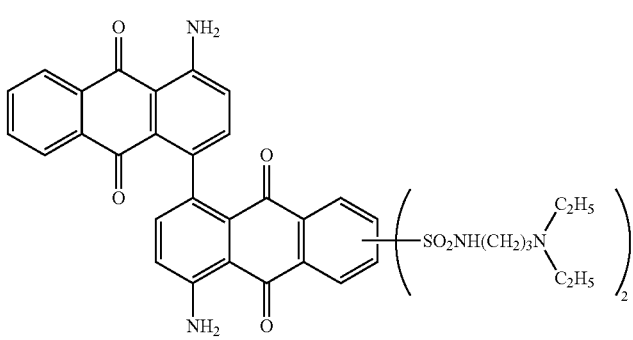
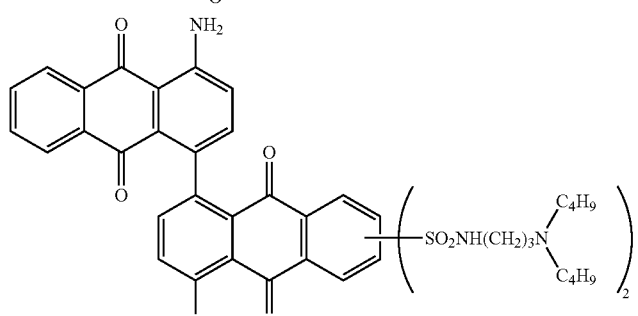
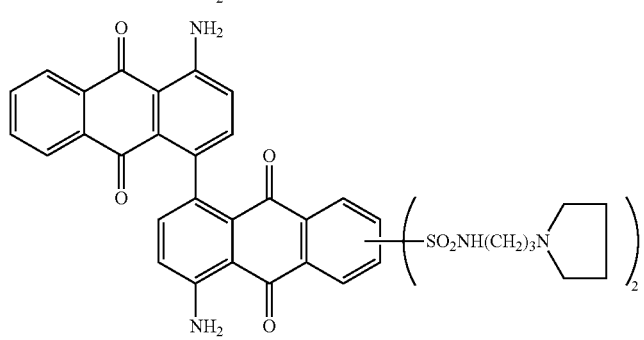
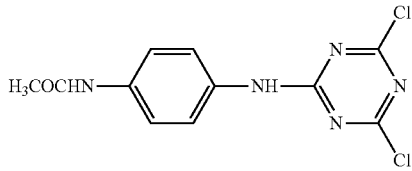
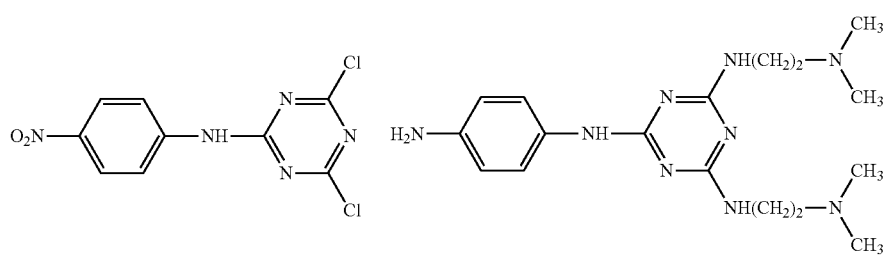
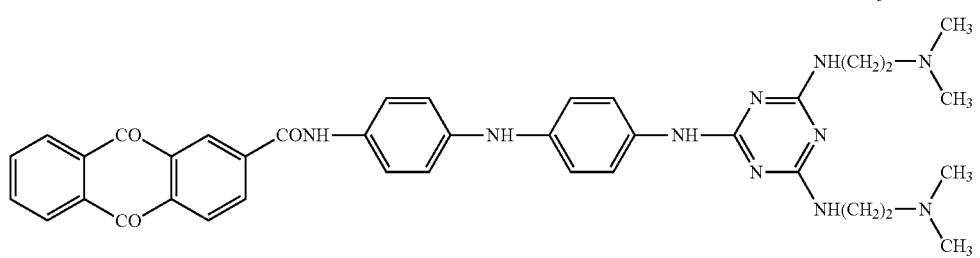
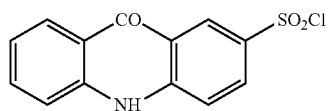

-continued
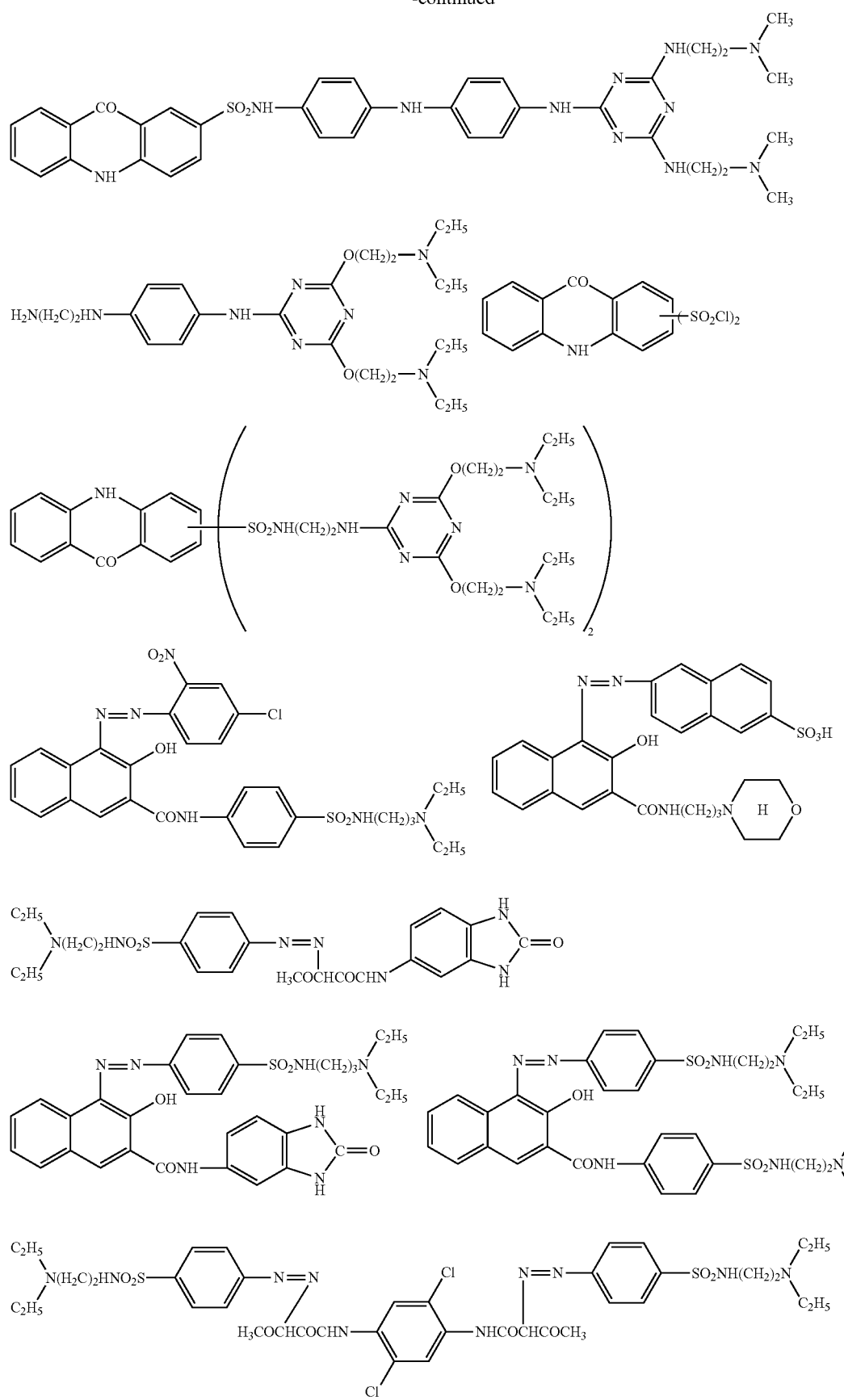

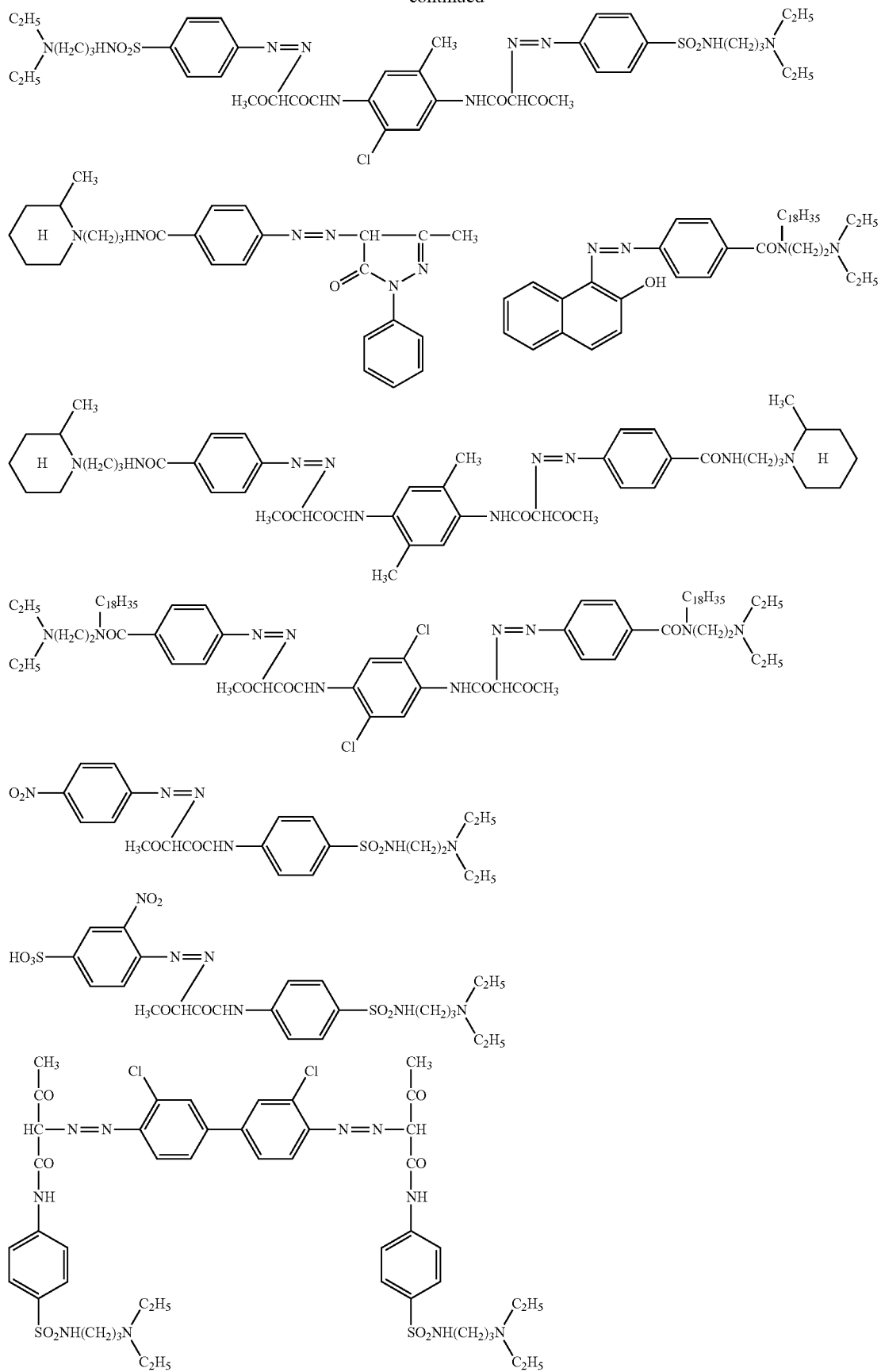

-continued
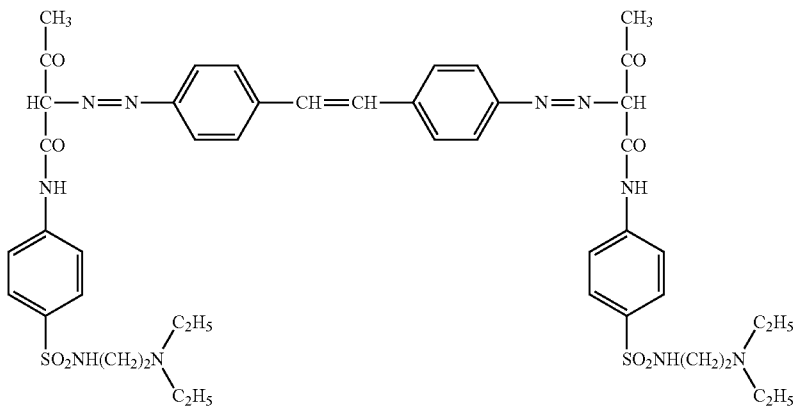
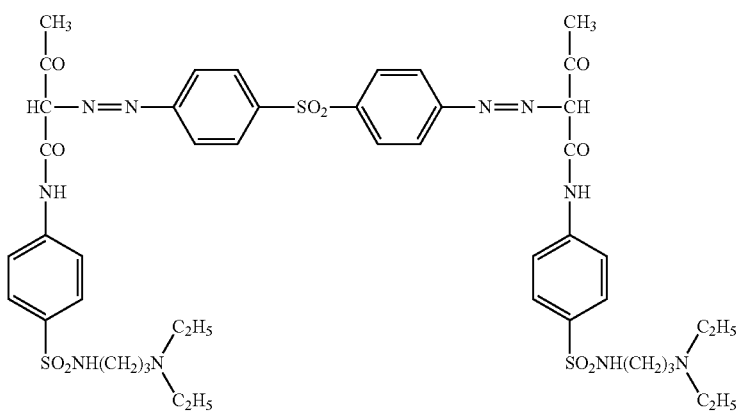
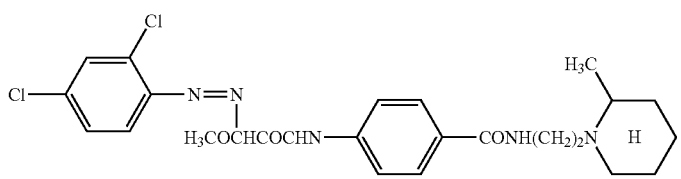
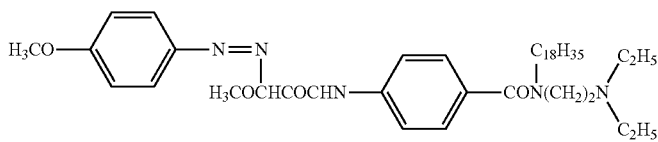
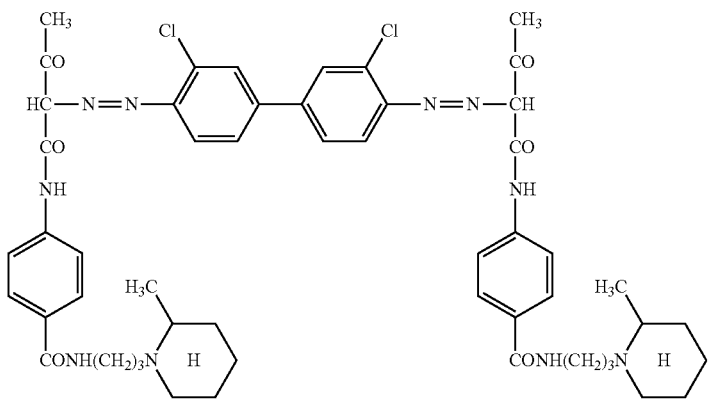

-continued
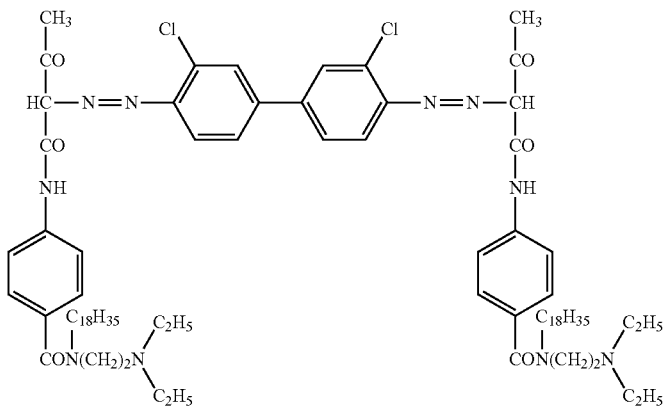
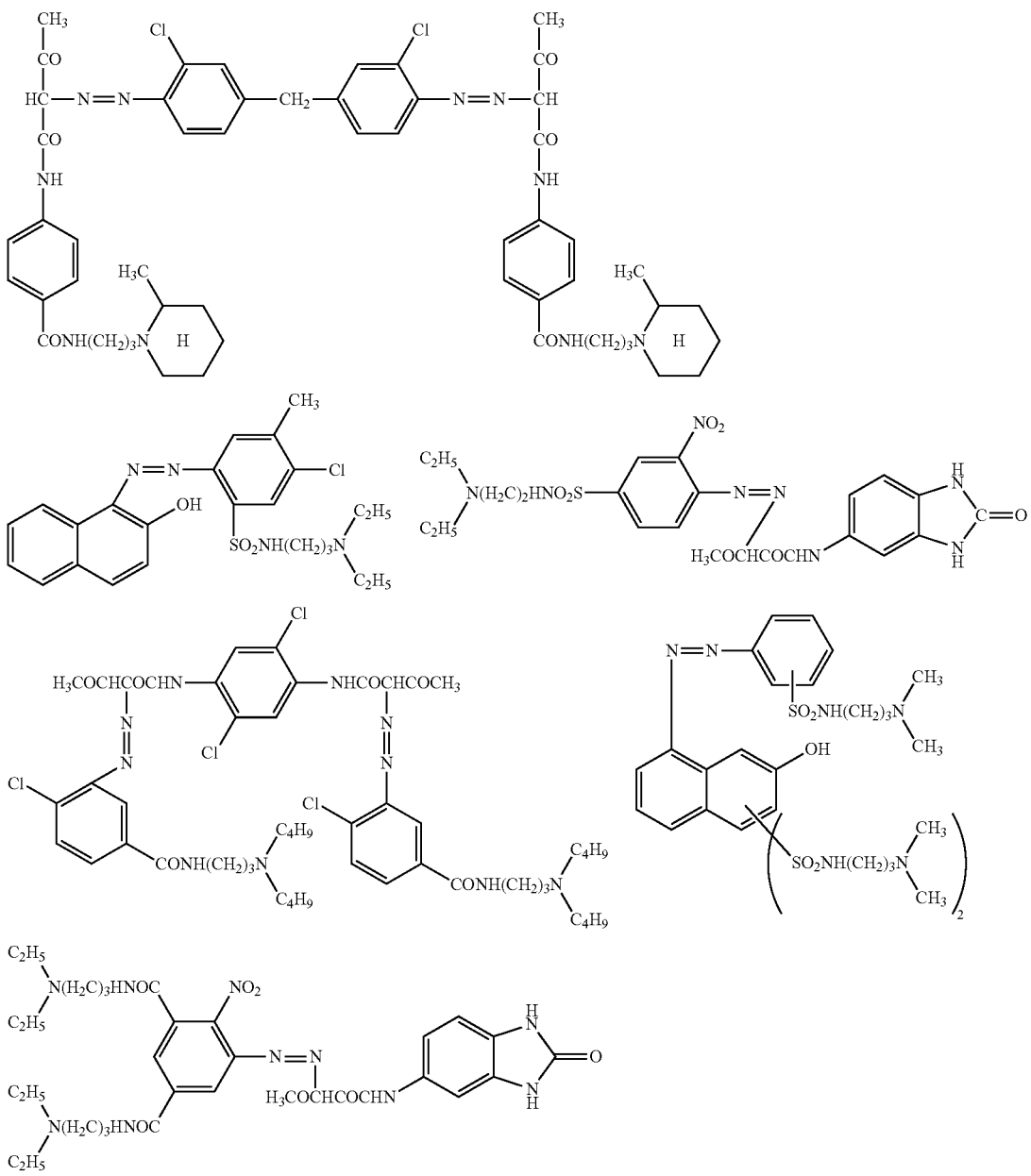

-continued
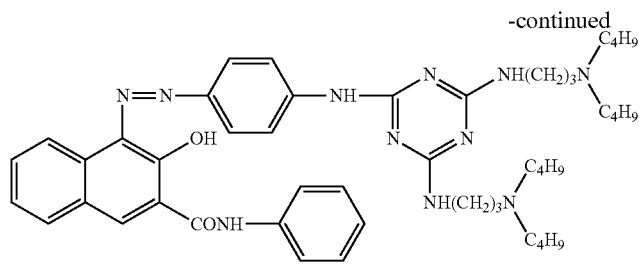
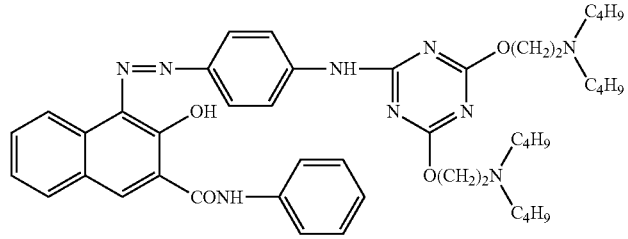
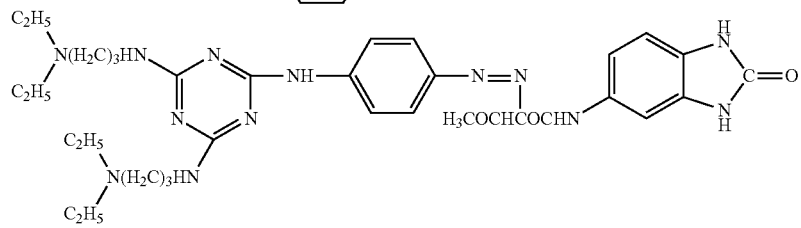
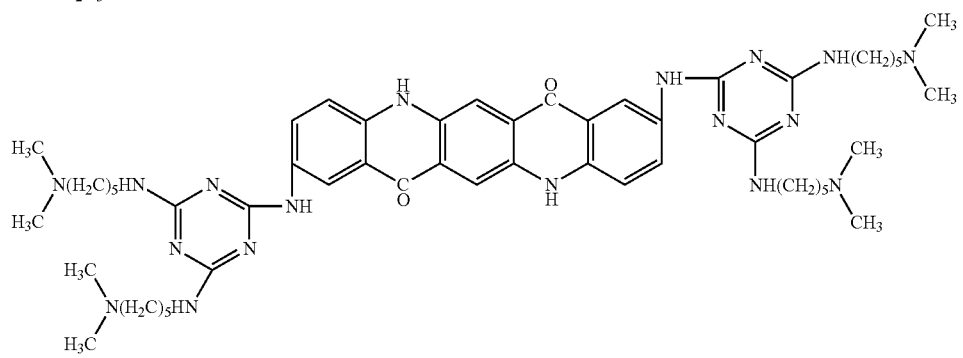
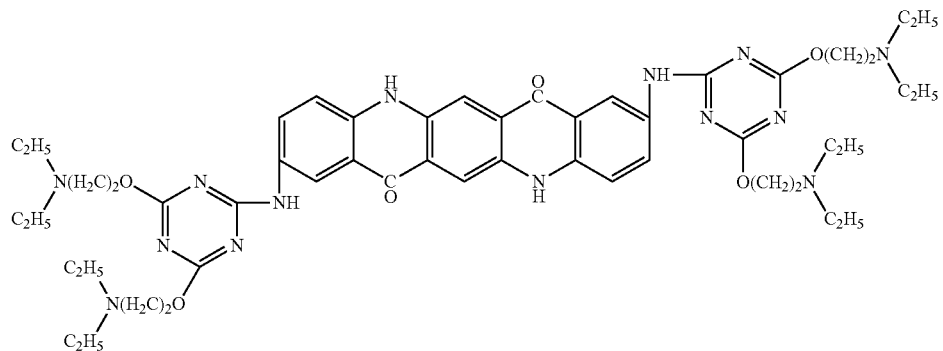
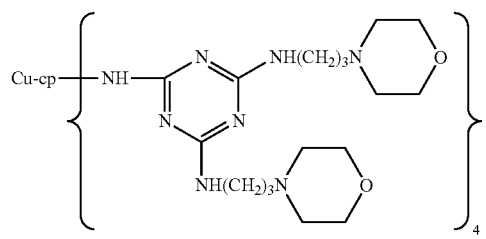

Cu-cp: Copper phthalocyanine residue
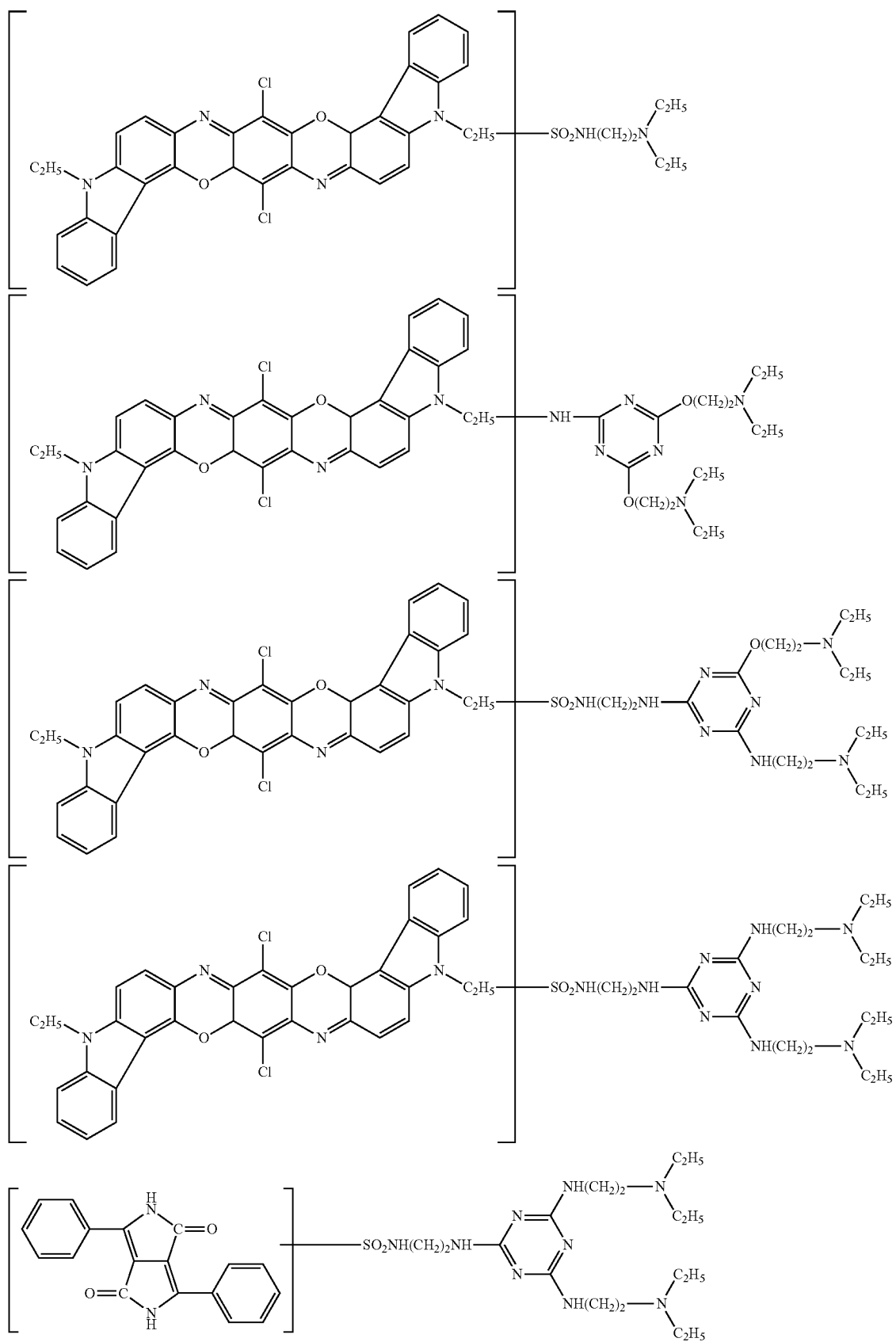

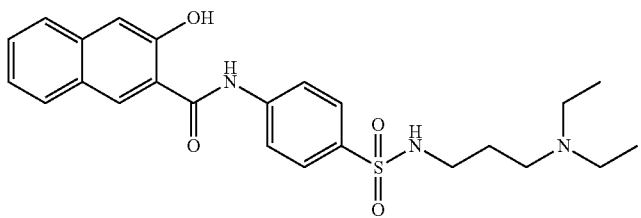
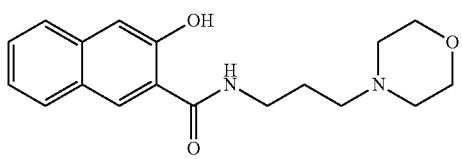
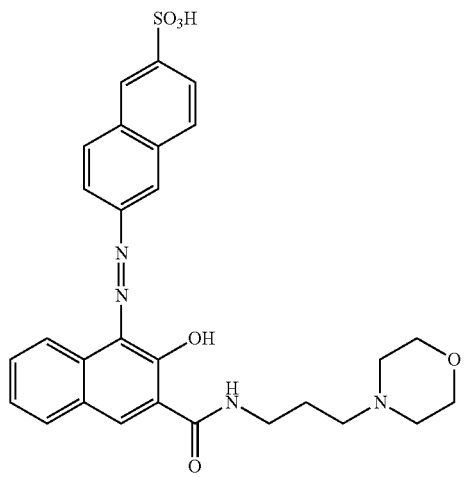
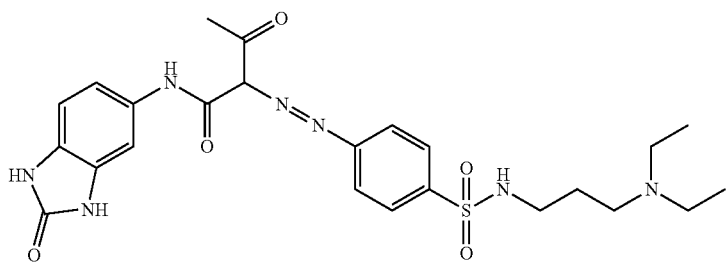
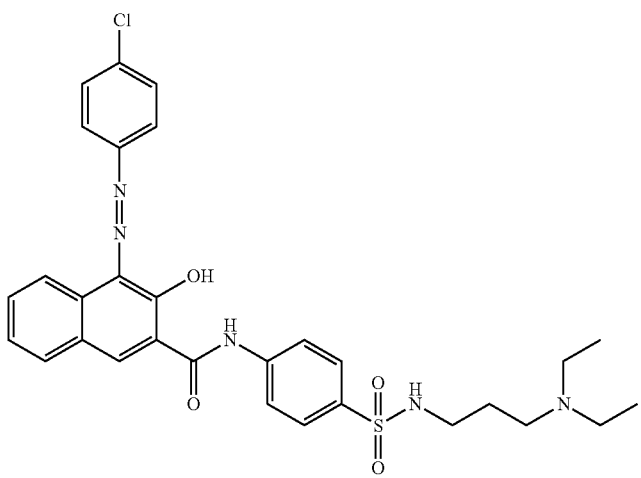

23 24
-continued
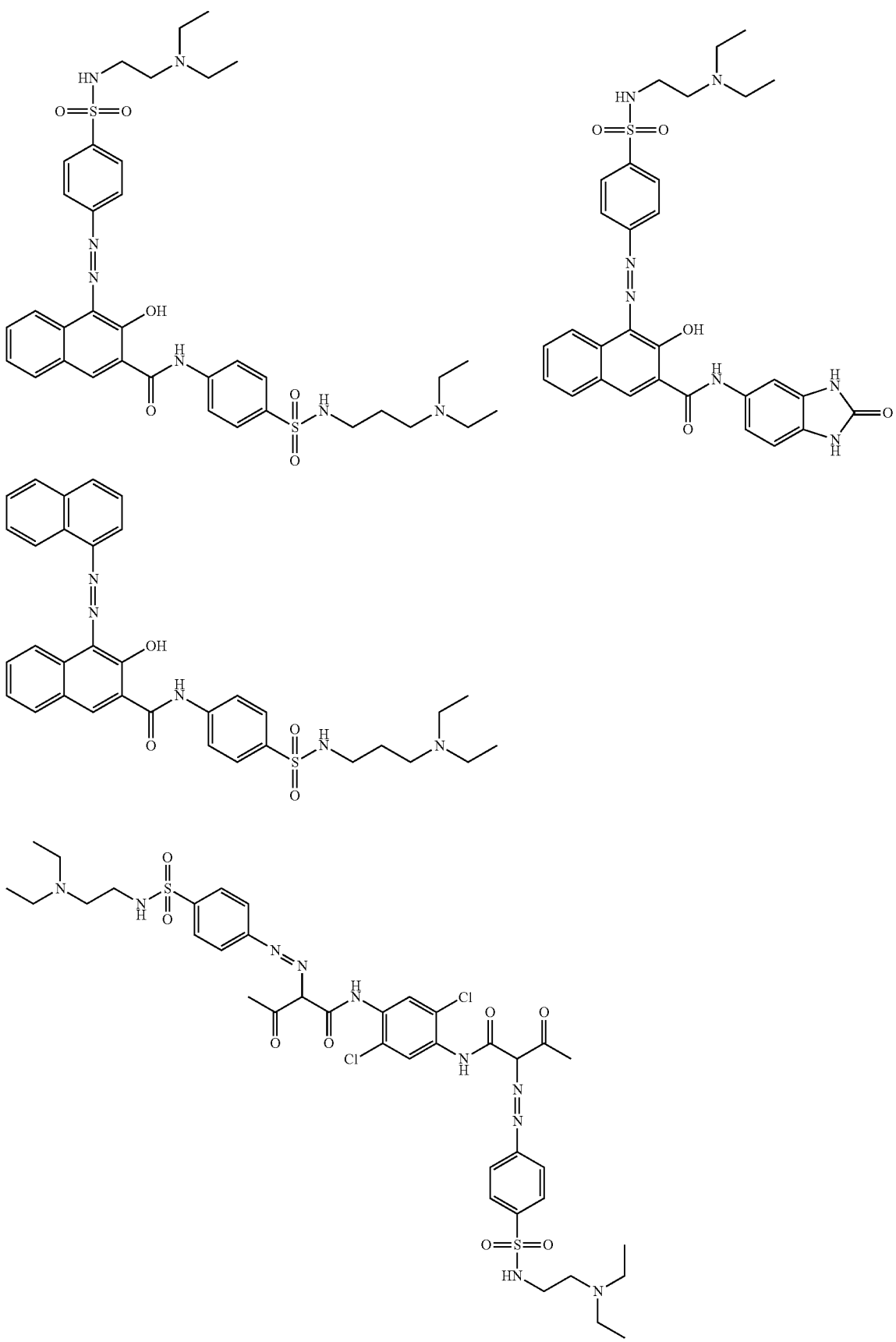

-continued
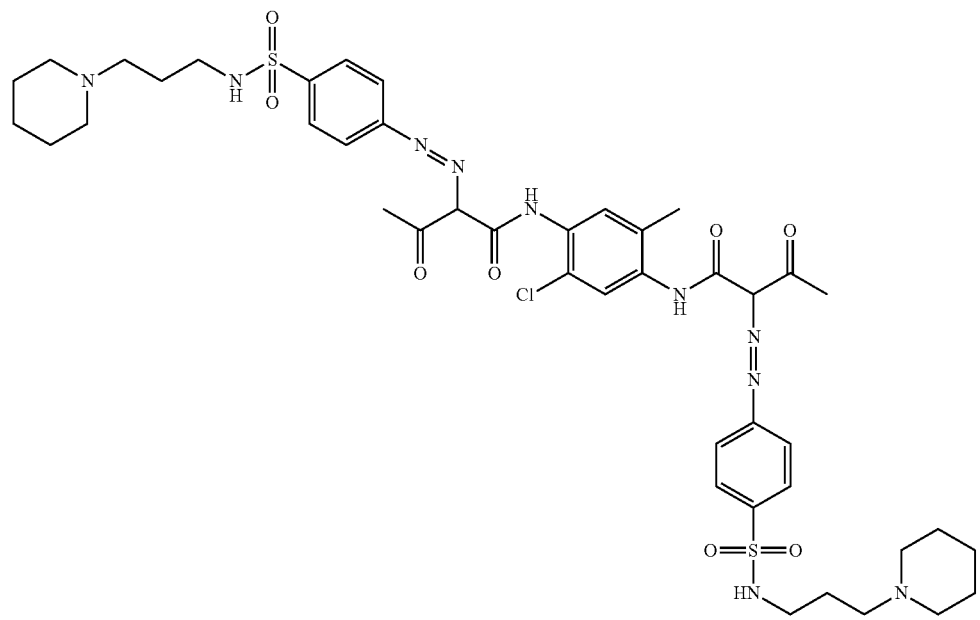
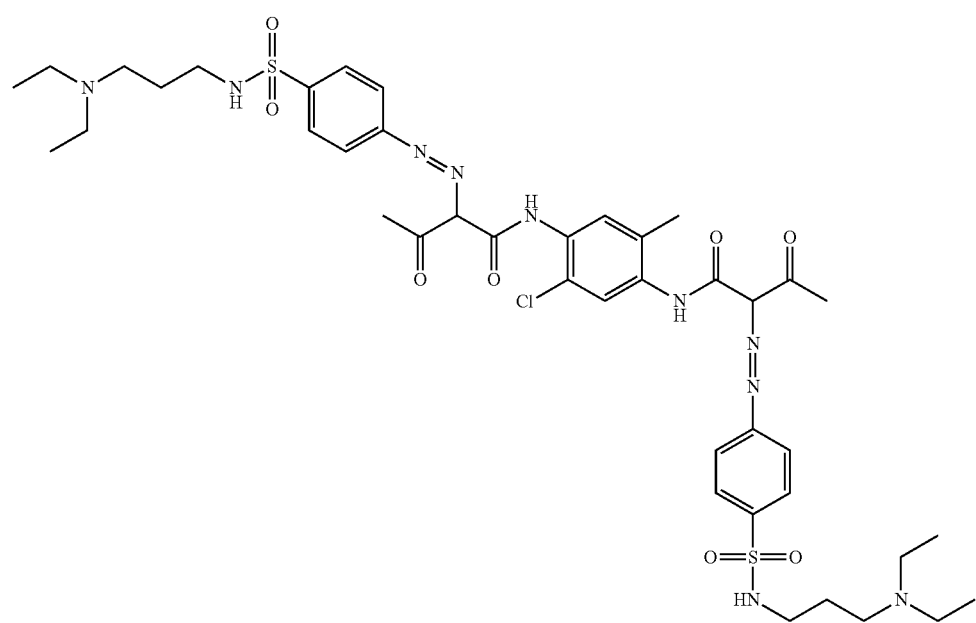

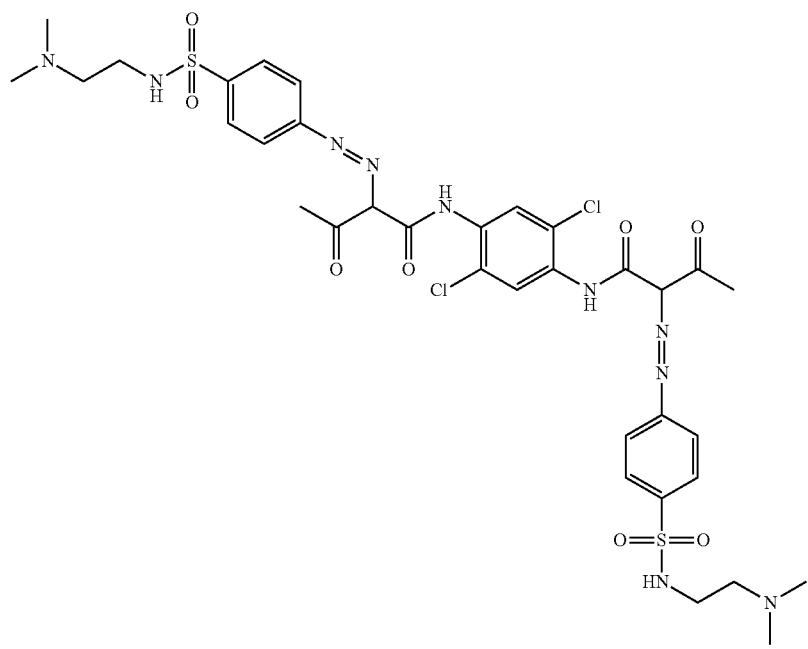
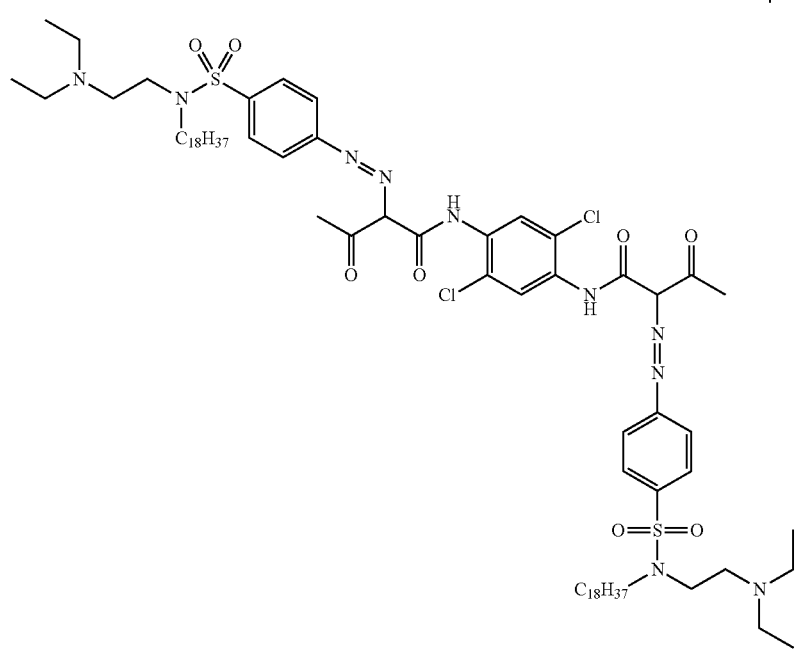
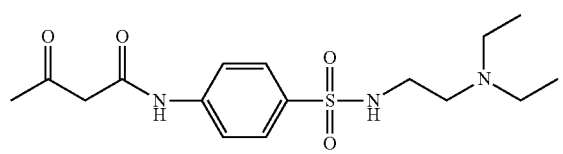
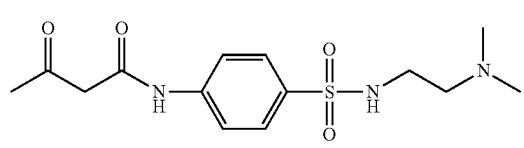
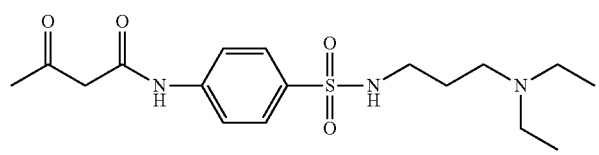

-continued
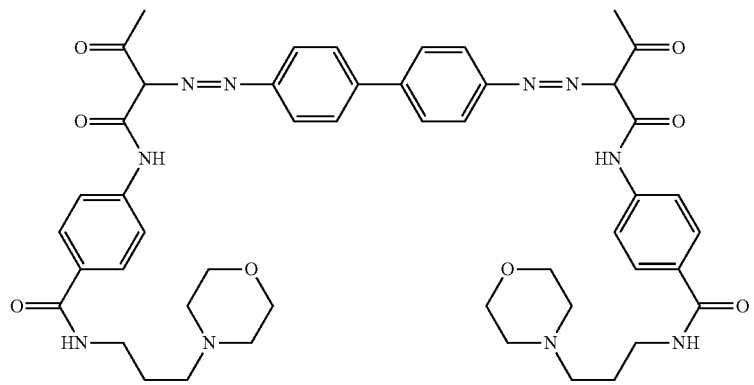
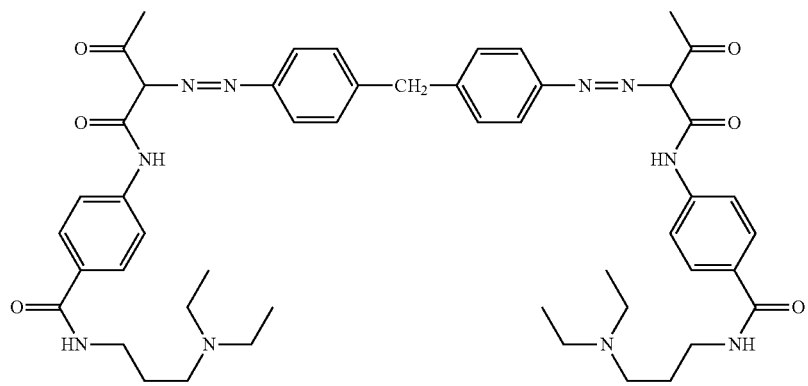
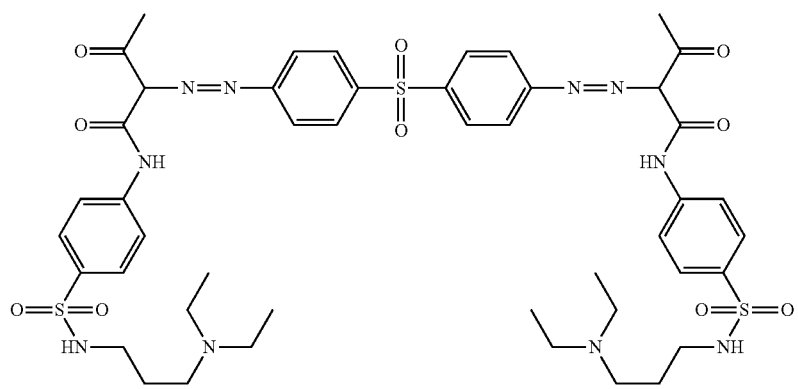

-continued
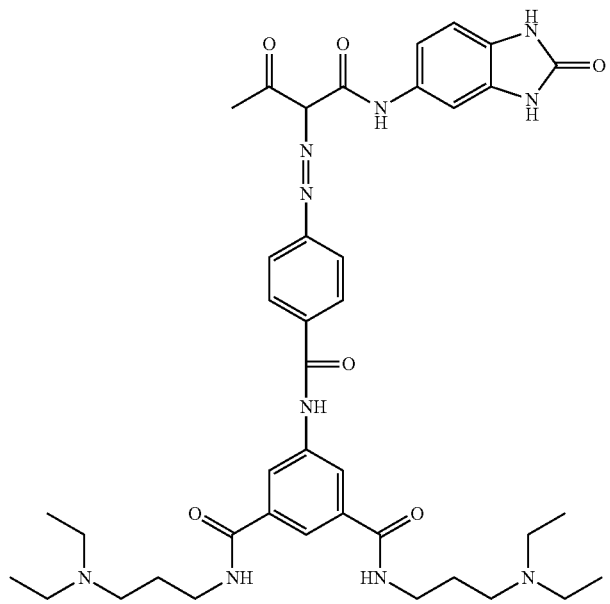
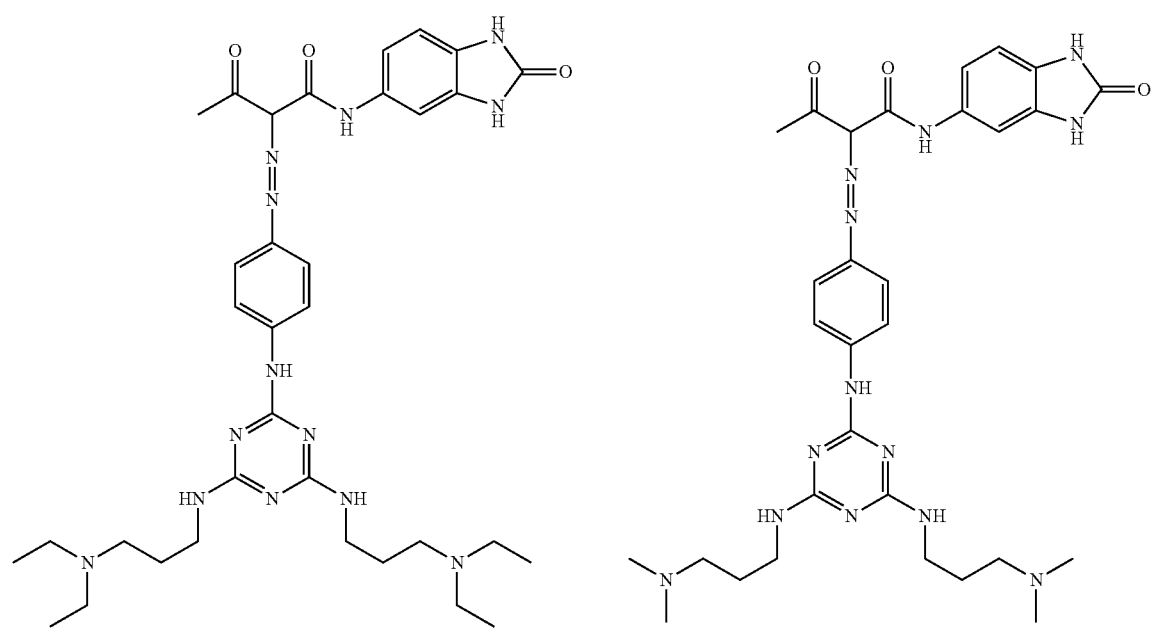

33 34
-continued
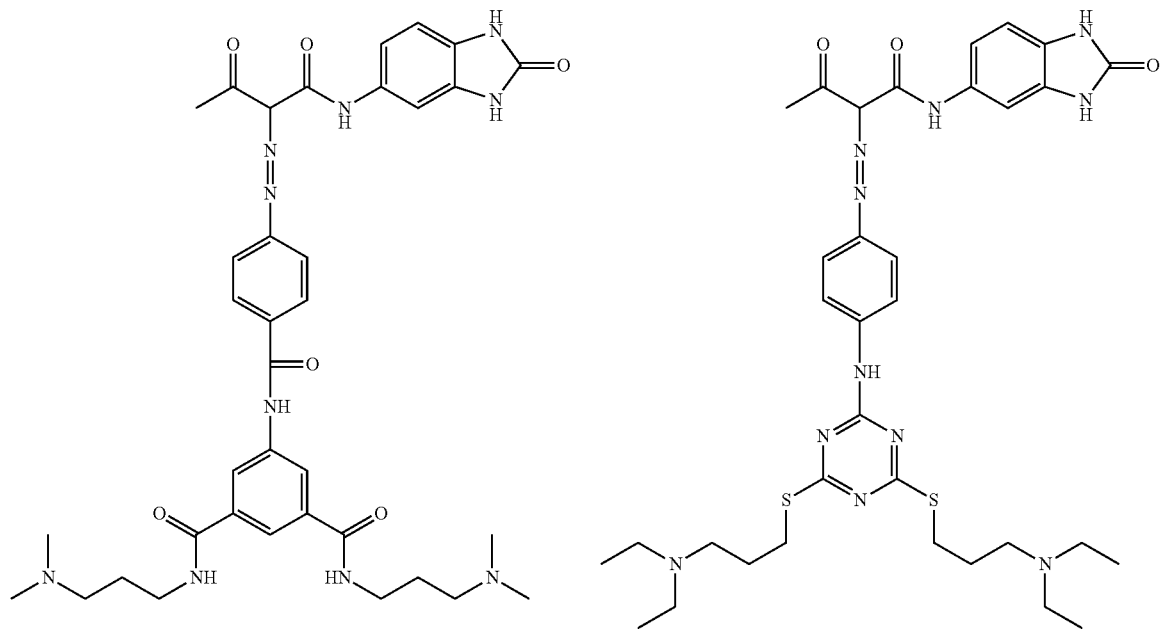
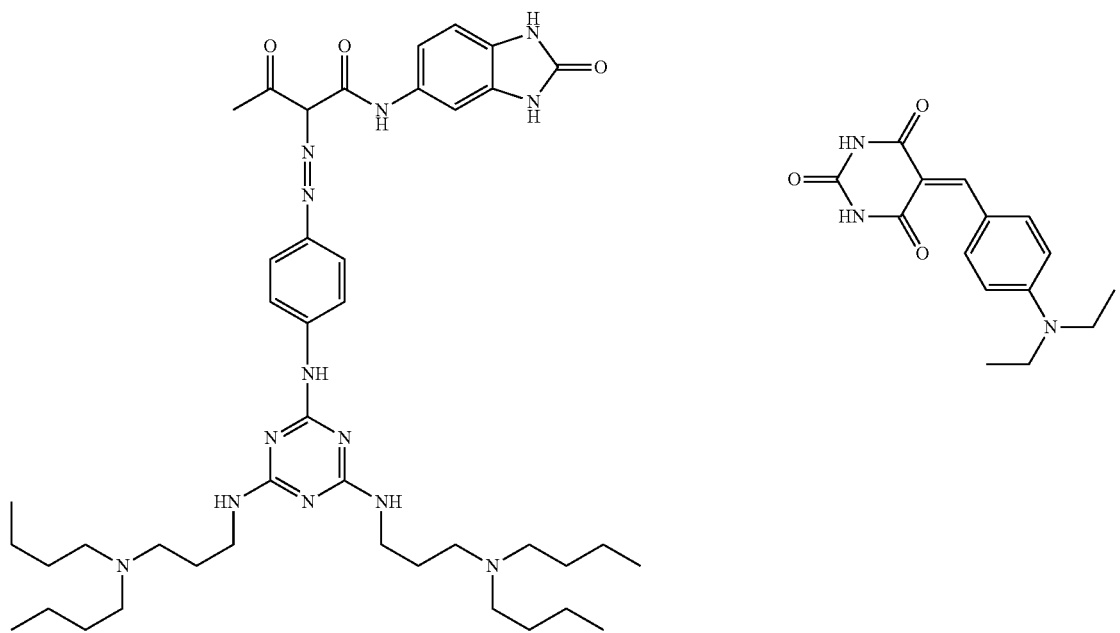
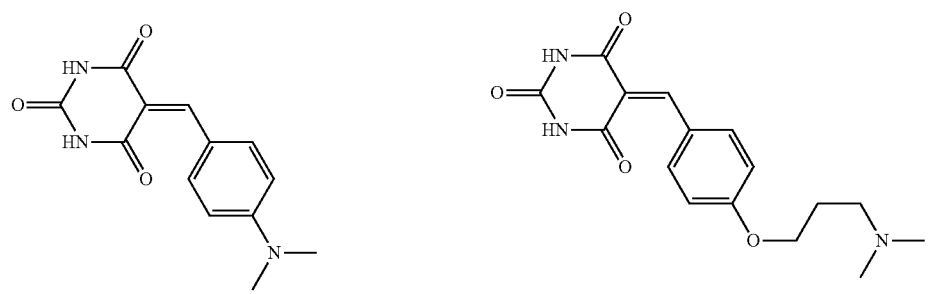

-continued

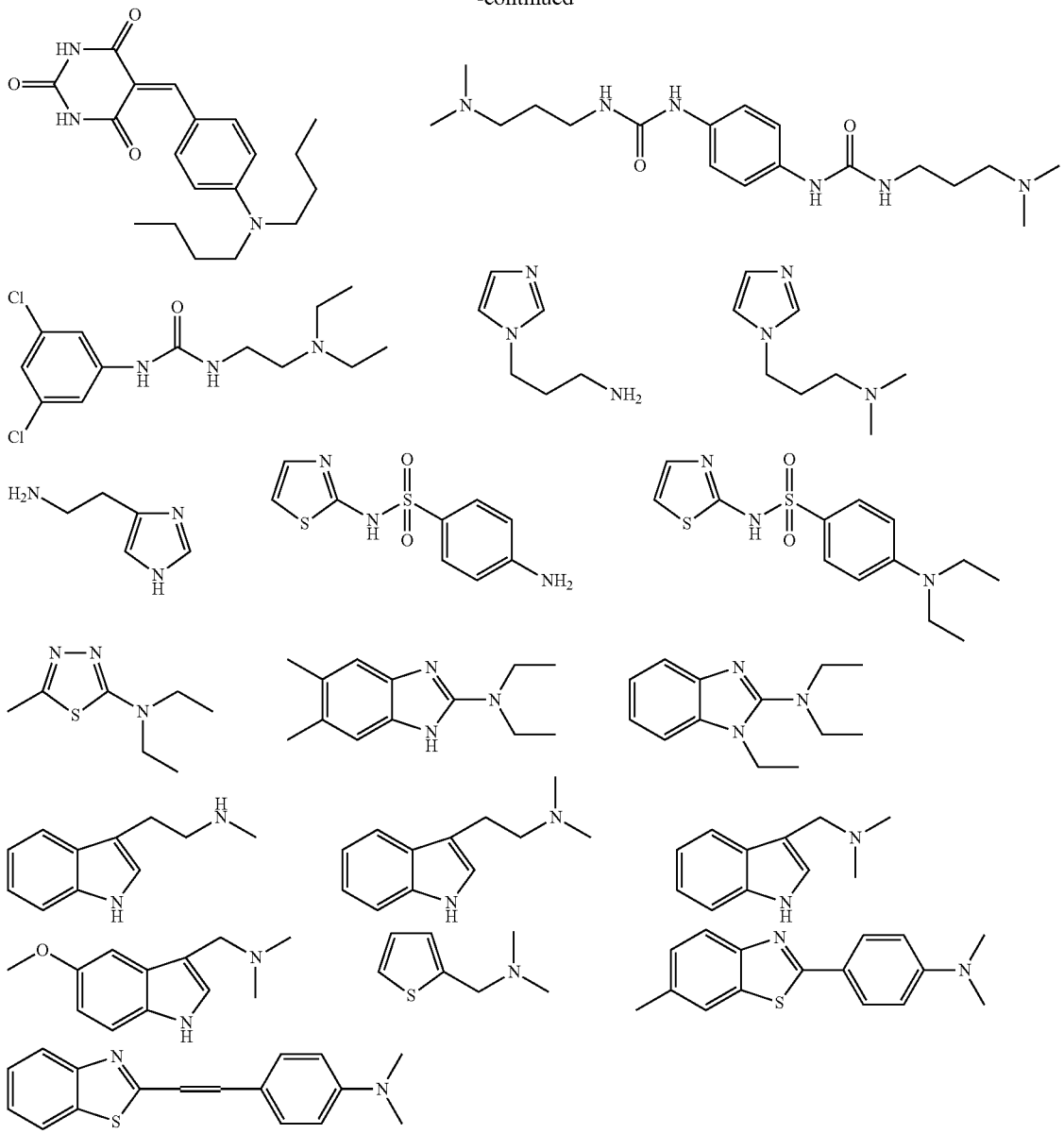

(a-2) These specific pigment derivatives are suitably selected in consideration of the type of a pigment used, and those having a structure identical with or similar to the pigment mother nucleus structure of an organic pigment required to be dispersed are preferably selected. Further, the amino group which exists together with the pigment mother nucleus structure in the molecule preferably has a tertiary amino structure such as a dialkylamino group, from the viewpoint of the interaction property with a polymer.

When (A) the pigment dispersion is prepared in the present invention, the content of (a-2) the specific pigment derivative in the pigment dispersion is preferably from 0.5% by mass to 40% by mass, and more preferably from 1% by mass to 15% by mass with respect to the solid content of the pigment dispersion.

Further, the content of the specific pigment derivative is preferably from 0.5 part by mass to 50 parts by mass, and more preferably from 1 part by mass to 25 parts by mass, based on 100 parts by mass of (a-1) the pigment described later.

<(a-1) Pigment>

Examples of the pigment which can be used in (A) the pigment dispersion according to the present invention may include various conventionally known inorganic pigments and organic pigments. Whether the pigment is an organic pigment or an inorganic pigment, the pigment preferably has a high transmittance. In consideration of high transmittance, it is preferable to use a pigment with a particle diameter as small as possible and with a small and minute particle size. Also in consideration of a handling property, a mean primary particle diameter of the pigment is preferably from 0.01 μm to 0.3 μM, and more preferably 0.01 μm to 0.15 μm. When the particle diameter is within the above range, the pigment has a high transmittance, and is excellent in color property as well as effective in forming a color filter with high contrast.

The mean primary particle diameter is determined by observing the primary particles through an SEM or a TEM, measuring particle sizes of 100 particles in the portion where no particles are aggregated, and calculating an average value of the obtained particle sizes.

Examples of the inorganic pigments include metal compounds such as metal oxides, metal complex salts, and the like. Specific examples thereof include oxides of metals such as iron, cobalt, aluminum, cadmium, lead, copper, titanium, magnesium, chromium, zinc, antimony, and the like, and complex oxides of these metals.

Examples of the organic pigment include:

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279, C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214, C. I. Pigment Orange 2, 5, 13, 16, 17:1, 31, 34, 36, 38, 43, 46, 48, 49, 51, 52, 55, 59, 60, 61, 62, 64, 71, and 73, C. I. Pigment Green 7, 10, 36, 37, and 58, C. I. Pigment Blue 1, 2, 15, 15:1, 15:2, 15:3, 15:4, 15:6, 16, 22, 60, 64, 66, 79, C. I. Pigment Blue 79 in which the substituent Cl is replaced by OH, and C. I. Pigment Blue 80, C. I. Pigment Violet 1, 19, 23, 27, 32, 37, and 42, C. I. Pigment Brown 25 and 28, C. I. Pigment Black 1 and 7, and the like.

Among these, the pigments which can be preferably used include the following. However, the present invention is not limited thereto.

C. I. Pigment Yellow 11, 24, 108, 109, 110, 138, 139, 150, 151, 154, 167, 180, and 185, C. I. Pigment Orange 36 and 71, C. I. Pigment Red 122, 150, 171, 175, 177, 209, 224, 242, 254, 255, and 264, C. I. Pigment Violet 19, 23, and 32, C. I. Pigment Blue 15:1, 15:3, 15:6, 16, 22, 60, and 66, C. I. Pigment Green 7, 36, and 37; and C. I. Pigment Black 1 and 7.

—Pulverization of Pigment—

In the present invention, a fine and granulated organic pigment may be used, if necessary. Pulverization of the pigment can be achieved through a process including preparing a viscous liquid composition of the pigment together with a water-soluble organic solvent and a water-soluble inorganic salt and then applying stress to the composition using a wet grinding apparatus or the like to finely pulverize the pigment.

Examples of the water-soluble organic solvent used in the step of finely pulverizing the pigment include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, propylene glycol monomethyl ether acetate, and the like.

Further, another solvent having low solubility to water or a water-insoluble solvent may be used as long as the solvent is used in such a small amount that it is adsorbed onto the pigment and not discharged into waste water, and examples of such solvents include benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methyl cyclohexane, halogenated hydrocarbons, acetone, methyl ethyl ketone, methyl isobutyl ketone, cyclohexanone, dimethylformamide, dimethylsulfoxide, N-methylpyrrolidone, and the like.

The solvent used in the step of finely pulverizing the pigment may be a single solvent or a mixture of two or more kinds, if necessary.

In the present invention, examples of the water-soluble inorganic salt used in the step of finely pulverizing the pigment includes sodium chloride, potassium chloride, calcium chloride, barium chloride, sodium sulfate, and the like.

The amount of the water-soluble inorganic salt used in the finely pulverizing step is from 1 to 50 times by mass as much as the amount of the pigment and exhibits a higher pulverizing effect when used in a larger amount. From the viewpoint of productivity, the amount of the water-soluble inorganic salt is more preferably from 1 to 10 times by mass. The water content of the inorganic salt used is preferably 1% or less.

The amount of the water-soluble organic solvent used in the finely pulverizing step is in a range from 50 parts by mass to 300 parts by mass, and more preferably in a range from 100 parts by mass to 200 parts by mass, based on 100 parts by mass of the pigment.

The operation conditions of a wet grinding apparatus in the step of finely pulverizing the pigment are not particularly limited. When the apparatus is a kneader, the operation conditions are that the number of revolutions of a blade in the apparatus is preferably from 10 to 200 rpm for efficient progress of grinding with grinding media, and the revolution ratio between two screws is preferably relatively higher for a higher grinding effect. The total operation time including the dry grinding time is preferably from 1 hour to 8 hours, and the temperature in the apparatus is preferably from 50 to 150° C. The water-soluble inorganic salt that is a grinding medium is preferably spherical with a grinding particle size of 5 to 50 μm having a sharp particle-size distribution.

—Blending of Pigments—(Color Combination)

These organic pigments may be used singly or in a combination of several kinds thereof for increasing the color purity. Specific examples of such combinations are as follows. For example, mixtures of at least one red pigment such as an anthraquinone-based pigment, a perylene-based pigment, or a diketopyrrolopyrrole-based pigment and a disazo-based yellow pigment, an isoindoline-based yellow pigment, a quinophthalone-based yellow pigment, a perylene-based red pigment, an anthraquinone-based red pigment, a diketopyrrolopyrrole-based red pigment, or the like can be used. Examples of the anthraquinone-based pigment include C. I. Pigment Red 177, examples of the perylene-based pigment include C. I. Pigment Red 155 and C. I. Pigment Red 224, and examples of the diketopyrrolopyrrole-based pigment include C. I. Pigment Red 254. From the viewpoint of color reproducibility, a mixture with C. I. Pigment Yellow 83, C. I. Pigment Yellow 139, or C. I. Pigment Red 177 is preferable. Further, the mass ratio of the red pigment to another pigment is preferably from 100:5 to 100:80. In this range, the light transmission rate at 400 nm to 500 nm is suppressed, color purity is improved, and sufficient coloring power is achieved. Particularly, the mass ratio is optimally in a range from 100:10 to 100:65. Further, a combination of red pigments can be adjusted in accordance with chromaticity.

Furthermore, as the green pigment, a halogenated phthalocyanine pigment may be used singly or as a mixture with a disazo yellow pigment, a quinophthalone yellow pigment, an azomethine yellow pigment or an isoindoline yellow pigment. Preferable examples of such mixtures include mixtures of C. I. Pigment Green 7, 36, or 37 and C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185. The mass ratio of the green pigment to the yellow pigment is preferably from 100:5 to 100:200. In this mass ratio range, the light transmission in a wavelength region from 400 to 450 nm can be suppressed, color purity can be improved, and hues in the vicinity of target NTSC hues can be obtained as designed without shifting the main wavelength toward longer wavelengths. The mass ratio is particularly preferably in a range from 100:20 to 100:150.

As the blue pigment, a phthalocyanine pigment may be used alone or as a mixture with a dioxazine violet pigment. Particularly preferable examples include a mixture of C. I. Pigment Blue 15:6 and C. I. Pigment Violet 23.

The mass ratio of the blue pigment to the violet pigment is preferably from 100:0 to 100:100, and more preferably 100:70 or less.

As a pigment preferable for use in a black matrix, carbon black, graphite, titanium black, iron oxide or titanium oxide may be used alone or as a mixture thereof, and a combination of carbon black and titanium black is preferable.

Further, the mass ratio of carbon black to titanium black is preferably in a range from 100:0 to 100:60. When the ratio is 100:61 or more, dispersion stability may be reduced in some cases.

—Dye—

In the present invention, a dye may be used as a coloring agent together with the pigment in order to adjust color tone.

The dye usable as a coloring agent is not particularly limited, and known dyes used conventionally in color filters may be used. Examples of such dyes includes those described in JP-A No. 64-90403, JP-A No. 64-91102, JP-A No. 1-94301, JP-A No. 6-11614, Japanese Patent No. 2592207, U.S. Pat. No. 4,808,501, U.S. Pat. No. 5,667,920, U.S. Pat. No. 5,059,500, JP-A No. 5-333207, JP-A No. 6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, JP-A No. 8-151531, and the like.

Dyes having chemical structures based on pyrazole azo, anilinoazo, triphenylmethane, anthraquinone, anthrapyridone, benzylidene, oxonol, pyrazolotriazole azo, pyridone azo, cyanine, phenothiazine, pyrrolopyrazole azomethine, xanthene, phthalocyanine, benzopyran, indigo, or the like can be used in the present invention.

In the present invention, the content of (a-1) the pigment in (A) the pigment dispersion is preferably from 10 to 60% by mass, and more preferably from 15 to 50% by mass, based on the total solid content (mass) of (A) the pigment dispersion. A content of the pigment in this range is effective in securing excellent color property with sufficient color density.

<(a-3) Resin Having Acid Group and Polymerizable Group>

In the present invention, (A) the pigment dispersion contains at least one of (a-3) a resin having an acid group and a polymerizable group [(a-3) a specific dispersion resin]. By the incorporation of this resin, high dispersibility can be exhibited and further, the sensitivity can be improved when used in combination with an initiator and a polymerizable compound.

The acid group as used herein means a group having a dissociable group having a pKa of 14 or less, and specific examples thereof include —COOH, —SO$_3$H, —PO$_3$H$_2$, —OSO$_3$H, —OPO$_2$H$_2$, -PhOH, —SO$_2$H, —SO$_2$NH$_2$, —SO$_2$NHCO—, —SO$_2$NHSO$_2$—, and the like. Among these, —COOH, —SO$_3$H, and —PO$_3$H$_2$ are preferable, and —COOH is most preferable.

(a-3) The specific dispersion resin of the present invention has a double bond (ethylenically unsaturated bond) in the side chain, and the double bond in the side chain can be obtained, for example, by adding an ethylenically unsaturated group-containing epoxy compound to the carboxyl group of an alkali-soluble resin having a carboxyl group.

Examples of the resin having a carboxyl group include 1) a resin formed by subjecting a monomer having a carboxyl group to radical polymerization or ion polymerization, 2) a resin formed by subjecting a monomer having an acid anhydride to radical or ion polymerization, and then subjecting the acid anhydride unit to hydrolysis or half-esterification, 3) an epoxy acrylate formed by modifying an epoxy resin with an unsaturated monocarboxylic acid and acid anhydride, and the like.

Specific examples of the vinyl-based resin having a carboxyl group include resins prepared by subjecting monomers having a carboxyl group, for example, unsaturated carboxylic acids such as (meth)acrylic acid, 2-succinoloyloxyethyl methacrylate, 2-maleinoloyloxyethyl methacrylate, 2-phthaloyloxyethyl methacrylate, 2-hexahydrophthaloyloxyethyl methacrylate, maleic acid, fumaric acid, itaconic acid, crotonic acid, and the like to homopolymerization, and resins prepared by copolymerizing such unsaturated carboxylic acids with vinyl monomers having no carboxyl group, such as styrene, α-methyl styrene, methyl (meth)acrylate, ethyl (meth)acrylate, propyl(meth)acrylate, isopropyl(meth)acrylate, butyl(meth)acrylate, vinyl acetate, acrylonitrile, (meth)acryl amide, glycidyl (meth)acrylate, allyl glycidyl ether, glycidyl ethyl acrylate, crotonic glycidyl ether, (meth)acrylic acid chloride, benzyl (meth)acrylate, hydroxyethyl (meth)acrylate, N-methylol acryl amide, N,N-dimethyl acryl amide, N-methacryloylmorpholine, N,N-dimethylaminoethyl (meth)acrylate, N,N-dimethylaminoethyl acrylamide, and the like.

Further, resins formed by compolymerizing an anhydrous maleic acid with styrene, α-methyl styrene, or the like, and then rendering the anhydrous maleic acid unit moiety to be half-esterified with a monohydric alcohol such as methanol, ethanol, propanol, butanol, hydroxyethyl (meth)acrylate, and the like, or hydrolyzing the anhydrous maleic acid unit moiety with water are also included.

Further, a resin can be obtained by allowing a resin having an epoxy group to react with a compound having a nucleophilic group and a polymerizable group. The resin of the present invention can also be obtained by reacting a polymer formed by the copolymerization of glycidyl methacrylate with an acrylic acid, a methacrylic acid, a hydroxyethyl methacrylate, or the like. In addition, in this case, it may be considered that the acid value is lowered, but a resin having a desired acid value can be obtained by reacting a hydroxyl group generated by the reaction of an epoxy and a carboxylic acid with an acid anhydride such as succinic acid, anhydrous maleic acid, cyclohexane dicarboxylic acid anhydride, itaconic acid anhydride, and the like.

Further, resins formed by adding unsaturated carboxylic acids such as (meth)acrylic acid, 2-succinoloyloxyethyl methacrylate, 2-maleinoloyloxyethyl methacrylate, 2-phthaloyloxyethyl methacrylate, 2-hexahydrophthaloyloxyethyl methacrylate, maleic acid, fumaric acid, itaconic acid, crotonic acid, and the like, or saturated carboxylic acids such as acetic acid, propionic acid, stearic acid, and the like to a novolak epoxy acrylate resin, a bisphenol epoxy resin, or the like, and then denaturing it with an acid anhydride such as anhydrous maleic acid, anhydrous itaconic acid, anhydrous tetrahydrophthalic acid, anhydrous phthalic acid, and the like.

Among these, from the viewpoint of developability, a resin having a carboxyl group, in particular, a (meth)acrylic acid (co)polymerization resin containing a (meth)acrylic acid is preferable, and specific examples of the copolymer include a methyl methacrylate/methacrylic acid copolymer described in JP-A No. 60-208748, a methyl methacrylate/methyl acrylate/methacrylic acid copolymer described in JP-A No. 60-214354, a benzyl methacrylate/methyl methacrylate/methacrylic acid/2-ethylhexyl acrylate copolymer described in JP-A No. 5-36581, a methyl methacrylate/n-butyl methacrylate/2-ethylhexyl acrylate/methacrylic acid copolymer described in JP-A No. 5-333542, a styrene/methyl methacrylate/methyl acrylate/methacrylic acid copolymer described in JP-A No. 7-261407, a methyl methacrylate/n-butyl acrylate/2-ethylhexyl acrylate/methacrylic acid copolymer described in JP-A No. 10-110008, a methyl methacrylate/n-butyl acrylate/2-ethylhexyl acrylate/styrene/methacrylic acid copolymer described in JP-A No. 10-198031, and the like.

As the epoxy unsaturated compound, one having a glycidyl group as an epoxy group, such as glycidyl (meth)acrylate, allyl glycidyl ether, and the like can be used, but an unsaturated compound having an alicyclic epoxy group is preferable. Examples of such a compound include the following.

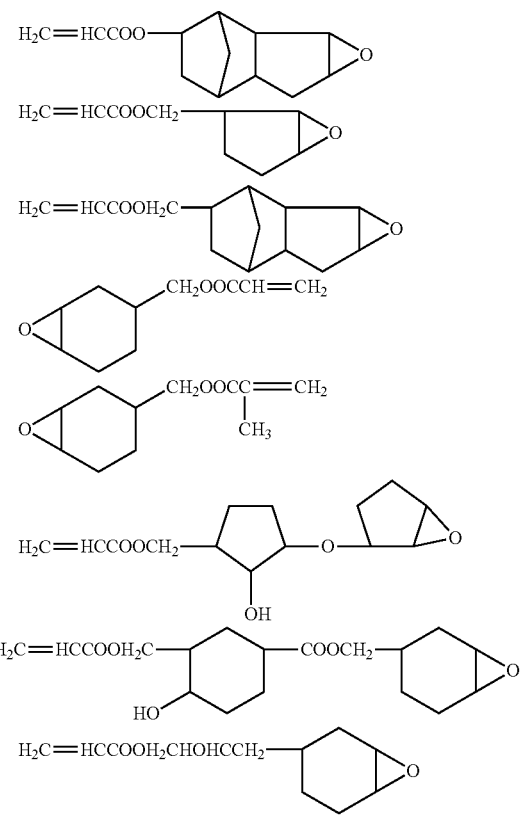

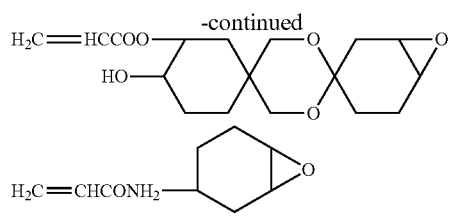

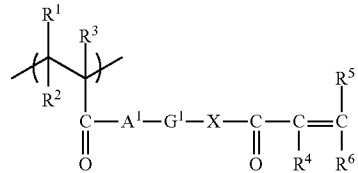

The reaction for introduction into the side chain of the resin may be carried out in an organic solvent at a reaction temperature from 50 to 150° C. for from a few hours to a few tens of hours in the presence of a catalyst, for example, a tertiary amine such as triethylamine, benzylmethylamine, and the like, a quaternary ammonium salt such as dodecyltrimethylammonium chloride, tetramethylammonium chloride, tetraethylammonium chloride, and the like, pyridine, triphenylphosphine, or the like. If the amount of an alicyclic epoxy unsaturated compound to be introduced is controlled so that the acid value of the resin be in the range from 5 to 200 KOH.mg/g, it will be preferable from the viewpoint of the alkali developability. Further, the weight-average molecular weight of (a-3) the specific dispersion resin is preferably in the range from 500 to 5,000,000, and more preferably in the range from 1000 to 500,000.

(a-3) The specific dispersion resin of the present invention is preferably a polymer compound having at least one selected from the structural units represented by the following general formulae (1) to (3) as an unsaturated double bond moiety.

General Formula (1)

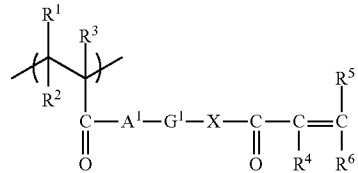

General Formula (2)

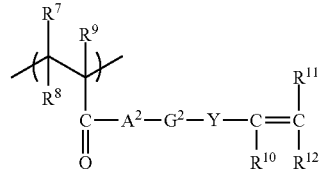

General formula (3)

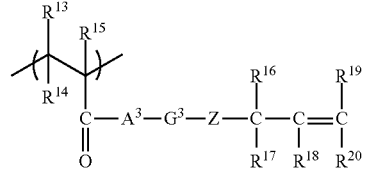

In the general formulae (1) to (3), $A^1$, $A^2$, and $A^3$ each independently represent an oxygen atom, a sulfur atom, or —N($R^{21}$)—, wherein $R^{21}$ represents an alkyl group which may have a substituent; $G^1$, $G^2$, and $G^3$ each independently represent a divalent organic group. X and Z each independently represent an oxygen atom, a sulfur atom, or —N($R^{22}$)—, wherein $R^{22}$ represents an alkyl group which may have a substituent. Y represents an oxygen atom, a sulfur atom, a phenylene group which may have a substituent, or —N($R^{23}$)—, wherein $R^{23}$ represents an alkyl group which may have a substituent. $R^1$ to $R^{20}$ each independently represent a monovalent substituent.

In the general formula (1), $R^1$ to $R^3$ each independently represent a monovalent substituent, and examples thereof include a hydrogen atom, an alkyl group which may further have a substituent, and the like. Among these, $R^1$ and $R^2$ are preferably hydrogen atoms, while $R^3$ is preferably a hydrogen atom or a methyl group.

$R^4$ to $R^6$ each independently represent a monovalent substituent, and examples of $R^4$ include a hydrogen atom, an alkyl group which may further have a substituent, and the like. Among these, a hydrogen atom, a methyl group, or an ethyl group is preferred. Examples of $R^5$ and $R^6$ each independently include a hydrogen atom, a halogen atom, an alkoxycarbonyl group, a sulfo group, a nitro group, a cyano group, an alkyl group which may further have a substituent, an aryl group which may further have a substituent, an alkoxy group which may further have a substituent, an aryloxy group which may further have a substituent, an alkylsulfonyl group which may further have a substituent, an arylsulfonyl group which may further have a substituent, or the like. Among these, a hydrogen atom, an alkoxycarbonyl group, an alkyl group which may further have a substituent, and an aryl group which may further have a substituent are preferred.

Here, examples of the substituent which may be introduced include a methoxycarbonyl group, an ethoxycarbonyl group, an isopropyloxycarbonyl group, a methyl group, an ethyl group, a phenyl group, and the like.

$A^1$ represents an oxygen atom, a sulfur atom, or —N($R^{21}$)— and X represents an oxygen atom, a sulfur atom, or —N($R^{22}$)—, wherein $R^{21}$ and $R^{22}$ may be an alkyl group which may have a substituent.

$G^1$ represents a divalent organic group, but it is preferably an alkylene group which may have a substituent. More preferably, $G^1$ may be an alkylene group having 1 to 20 carbon atoms, which may have a substituent, a cycloalkylene group having 3 to 20 carbon atoms, which may have a substituent, an aromatic group having 6 to 20 carbon atoms, which may have a substituent, and the like, and among them, a linear or branched alkylene group having 1 to 10 carbon atoms, which may have a substituent, a cycloalkylene group having 3 to 10 carbon atoms, which may have a substituent, and an aromatic group having 6 to 12 carbon atoms, which may have a substituent, are preferable in view of performance such as strength, developability, and the like.

Here, the substituent for $G^1$ is preferably a hydroxyl group.

In the general formula (2), $R^7$ to $R^9$ each independently represent a monovalent substituent, and examples thereof include a hydrogen atom, an alkyl group which may further have a substituent, and the like. Among these, $R^7$ and $R^8$ are preferably hydrogen atoms, while $R^9$ is preferably a hydrogen atom or a methyl group.

$R^{10}$ to $R^{12}$ each independently represent a monovalent substituent, and specific examples of this substituent include a hydrogen atom, a halogen atom, a dialkylamino group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylsulfonyl group which may have a substituent, an arylsulfonyl group which may have a substituent, and the like. Among these, a hydrogen atom, an alkoxycarbonyl group, an alkyl group which may have a substituent, and an aryl group which may have a substituent are preferred.

Here, examples of the substituents which may be introduced include the same groups as those mentioned for the formula (1).

$A^2$ represents an oxygen atom, a sulfur atom, or —N($R^{21}$)—, and $R^{21}$ may be a hydrogen atom, an alkyl group which may have a substituent, and the like.

$G^2$ represents a divalent organic group, but is preferably an alkylene group which may have a substituent. Preferably, $G^2$ is an alkylene group having 1 to 20 carbon atoms, which may have a substituent, a cycloalkylene group having 3 to 20 carbon atoms, which may have a substituent, an aromatic group having 6 to 20 carbon atoms, which may have a substituent, and the like, and among them, a linear or branched alkylene group having 1 to 10 carbon atoms, which may have a substituent, a cycloalkylene group having 3 to 10 carbon atoms, which may have a substituent, and an aromatic group having 6 to 12 carbon atoms, which may have a substituent are preferable in view of performance such as strength and developability.

Here, the substituent for $G^2$ is preferably a hydroxyl group.

Y represents an oxygen atom, a sulfur atom, —N($R^{23}$)—, or a phenylene group which may have a substituent, wherein $R^{23}$ may be a hydrogen atom, an alkyl group which may have a substituent, and the like.

In the general formula (3), $R^{13}$ to $R^{15}$ each independently represent a monovalent substituent, and examples thereof include a hydrogen atom, an alkyl group which may have a substituent, and the like. Among these, $R^{13}$ and $R^{14}$ are preferably hydrogen atoms, while $R^{15}$ is preferably a hydrogen atom or a methyl group.

$R^{16}$ to $R^{20}$ each independently represent a monovalent substituent, and examples of $R^{16}$ to $R^{20}$ include a hydrogen atom, a halogen atom, a dialkylamino group, an alkoxycarbonyl group, a sulfo group, a nitro group, a cyano group, an alkyl group which may further have a substituent, an aryl group which may further have a substituent, an alkoxy group which may further have a substituent, an aryloxy group which may further have a substituent, an alkylsulfonyl group which may further have a substituent, an arylsulfonyl group which may further have a substituent, and the like. Among these, a hydrogen atom, an alkoxycarbonyl group, an alkyl group which may have a substituent, and an aryl group which may have a substituent are preferred. Examples of the substituents which may be introduced include the same groups as those mentioned for the general formula (1).

$A^3$ represents an oxygen atom, a sulfur atom, or —N($R^{21}$)—, while Z represents an oxygen atom, a sulfur atom, or —N($R^{22}$)—. Examples of $R^{21}$ and $R^{22}$ may be the same groups as those mentioned for the general formula (1).

$G^3$ represents a divalent organic group, but it is preferably an alkylene group which may have a substituent. Preferably, $G^3$ may be an alkylene group having 1 to 20 carbon atoms, which may have a substituent, a cycloalkylene group having 3 to 20 carbon atoms, which may have a substituent, an aromatic group having 6 to 20 carbon atoms, which may have a substituent, and the like. Among these, a linear or branched alkylene group having 1 to 10 carbon atoms, which may have a substituent, a cycloalkylene group having 3 to 10 carbon atoms, which may have a substituent, and an aromatic group having 6 to 12 carbon atoms, which may have a substituent, are preferable in view of performance such as strength and developability.

Here, the substituent for $G^3$ is preferably a hydroxyl group.

As (a-3) the specific dispersion resin of the present invention, a compound containing the structural units represented by the general formulae (1) to (3) in an amount ranging from 20% by mole or more to less than 95% by mole in one molecule, is preferred from the viewpoints of improved curability and reduced development residue. The amount of the structural units is more preferably in the range from 25 to 90% by mole, and even more preferably from 30% by mole or more to less than 85% by mole.

The synthesis of the polymer compound having a structural unit represented by any of the general formulae (1) to (3) can be carried out on the basis of the synthesis methods described in Paragraph Nos. [0027] to [0057] of JP-A No. 2003-262958. Among these, synthesis method 1) in the same publication is preferred, and this method will be described in (1) as follows.

Specific compound examples of the polymer compound having a structural unit represented by any of the general formulae (1) to (3) include the following polymer compounds 1 to 17.

| Polymer Compound | Composition (% by mole) | Mw |
|---|---|---|
| 1 | 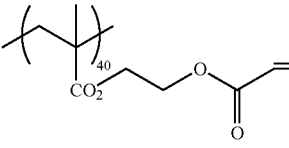 | 2980 |
| 2 | 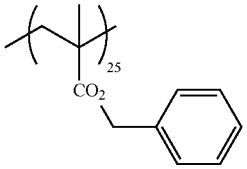 | 13400 |
| 3 | 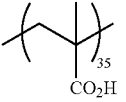 | 11950 |
| 4 | 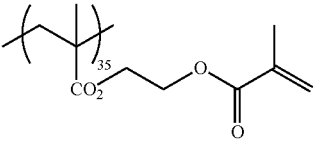 | 9600 |

-continued
| Polymer Compound | Composition (% by mole) | Mw |
|---|---|---|
| 5 | 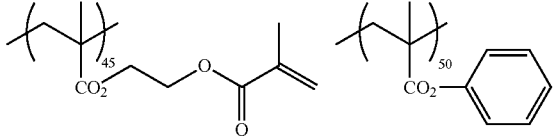 | 3560 |
| 6 | 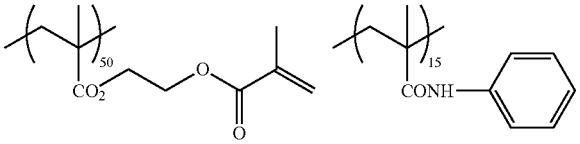 | 24600 |
| 7 | 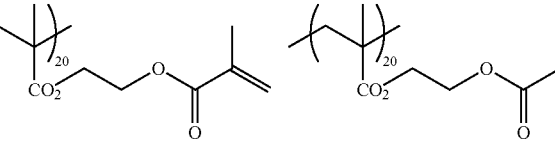 | 3980 |
| 8 | 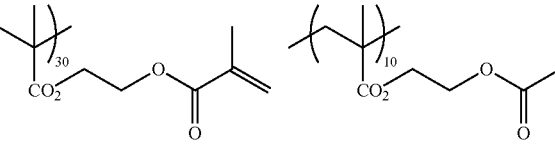 | 3350 |
| 9 | 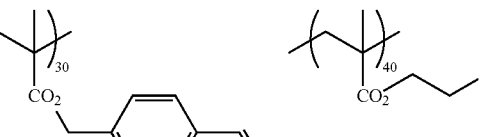 | 2860 |

| Polymer Compound | Composition (% by mole) | Mw |
|---|---|---|
| 10 | 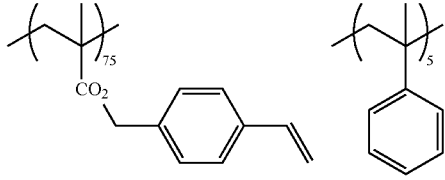 | 12130 |
| 11 | 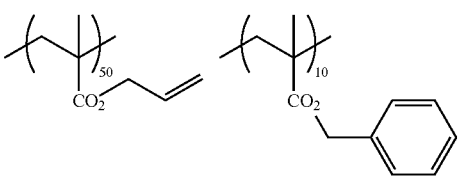 | 3720 |
| 12 | 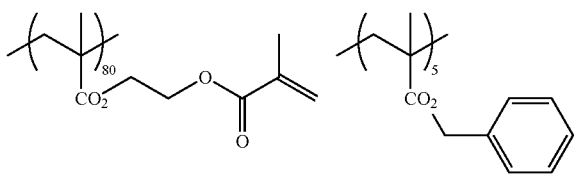 | 31100 |
| 13 | 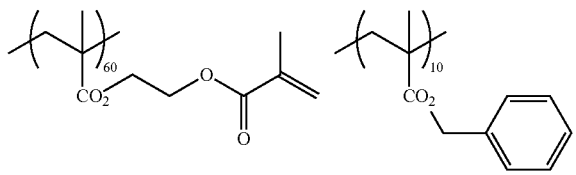 | 3730 |
| 14 | 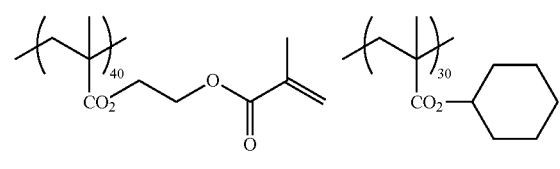 | 2760 |

| Polymer Compound | Composition (% by mole) | Mw |
|---|---|---|
| 15 | 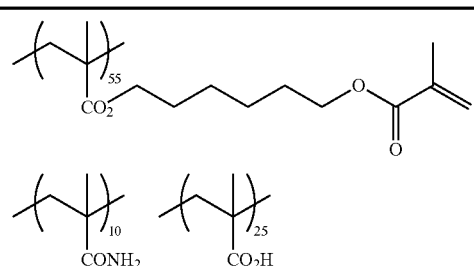 | 3240 |
| 16 | 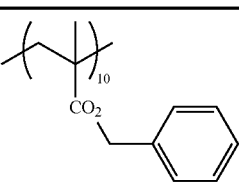 | 16500 |
| 17 | 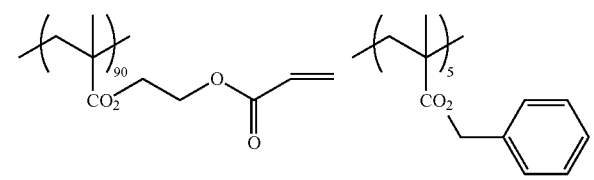 | 2530 |

Moreover, the resins obtained by the following synthesis method (1) or (2) may be preferably mentioned.

(1) A method of extracting a proton using a base from a polymer in which a compound represented by the following general formula (4) is used as a copolymerizing component, and eliminating L to obtain a desired polymer compound having the structure represented by the general formula (1).

Further, in the general formula (4), L represents an anionic leaving group, and may be preferably a halogen atom, a sulfonic acid ester, or the like. $R^3$ to $R^6$, $A^1$, $G^1$, and X have the same definitions as defined above for the general formula (1), and as the base used to generate an elimination reaction, either inorganic compounds or organic compounds may be used. In addition, the details and preferred embodiments of this method are described in Paragraph Nos. [0028] to [0033] of JP-A No. 2003-262958.

Examples of the preferred inorganic compound bases include sodium hydroxide, potassium hydroxide, sodium carbonate, sodium hydrogen carbonate, potassium carbonate, potassium hydrogen carbonate, and the like. Examples of the organic compound bases include metal alkoxides such as sodium methoxide, sodium ethoxide, and potassium t-butoxide, organic amine compounds such as triethylamine, pyridine, and diisopropylethylamine, and the like.

(2) A method of subjecting a polymer in which a compound represented by the following general formula (5) is used as a copolymerization component, to an elimination reaction for a specific functional group involving a treatment with base, and thus removing $X^{10}$ to obtain a radical reactive group.

Further, in the general formula (5), $A^5$ represents an oxygen atom, a sulfur atom, or —N($R^{54}$)—, $A^6$ represents an oxygen atom, a sulfur atom, or —N$R^{58}$—, $R^{51}$, $R^{52}$, $R^{53}$, $R^{54}$, $R^{55}$, $R^{56}$, $R^{57}$, and $R^{58}$ each independently represent a hydrogen atom or a monovalent organic group, $X^{10}$ represents a group which is removed by the elimination reaction, $G^5$ represents an organic linking group, and n represents an integer of 1 to 10. Further, the detailed and preferred embodiments of this method are described in detail in JP-A No. 2003-335814.

Preferable examples of the resin obtained by the synthesis method (2) include the polymer compounds described in JP-A No. 2003-335814, specifically, for example, (i) polyvinyl-based polymer compounds, (ii) polyurethane-based polymer compounds, (iii) polyurea-based polymer compounds, (iv) poly(urethane-urea)-based polymer compounds, (v) polyester-based polymer compounds, (vi) polyamide-based polymer compounds, (vii) acetal-modified polyvinyl alcohol-based polymer compounds, and specific compounds obtained from each of these descriptions.

General Formula (4)
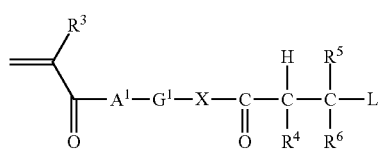
General Formula (5)
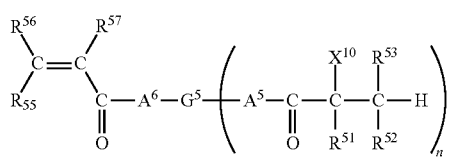
Examples of the compound represented by the general formula (4) include, but are not limited to, the compounds (M-1) to (M-12) as set forth below.
(M-1)
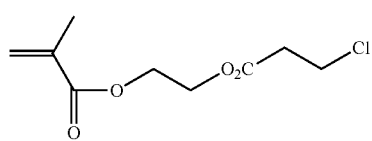
(M-2)
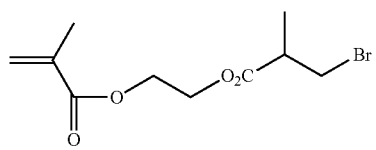
(M-3)
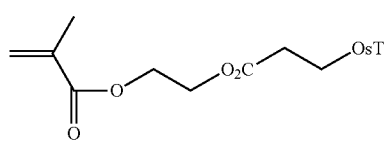
(M-4)
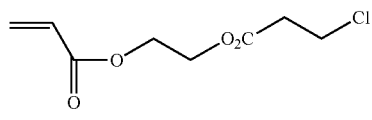
(M-5)
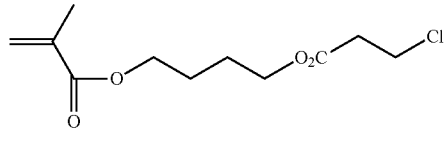
(M-6)
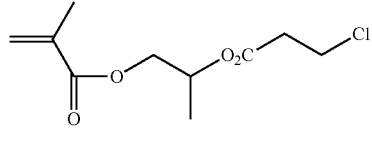
(M-7)
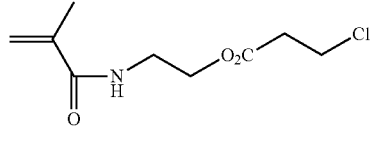
-continued
(M-8)
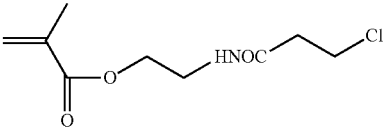
(M-9)
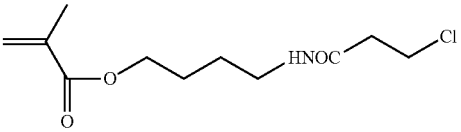
(M-10)
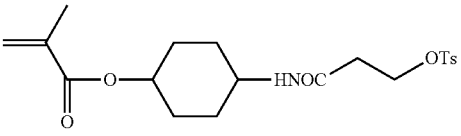
(M-11)
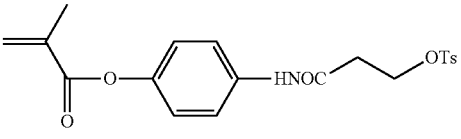
(M-12)
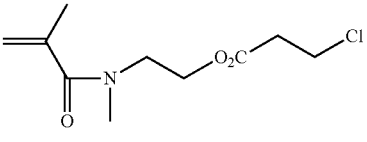
Next, examples (i-1 to i-52) of the compound represented by the general formula (5) above will be listed below.
i-1
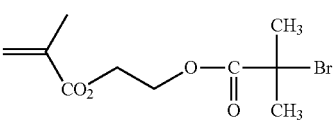
i-2
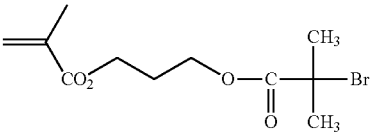
i-3
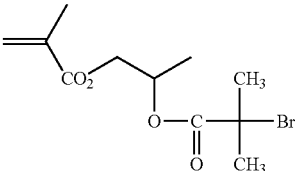
i-4
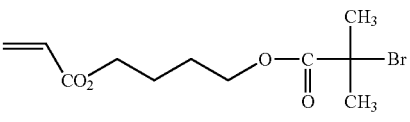
i-5
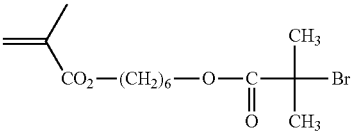

-continued
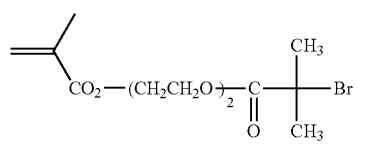 i-6
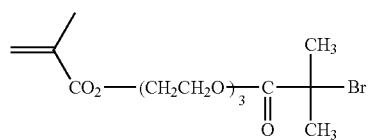 i-7
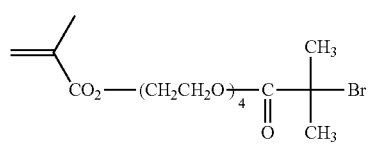 i-8
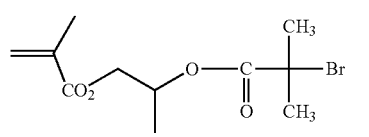 i-9
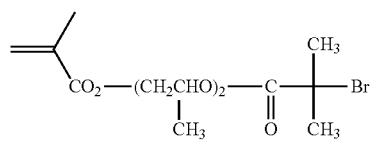 i-10
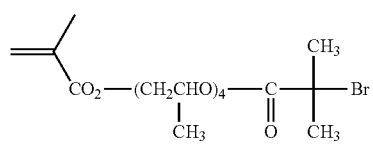 i-11
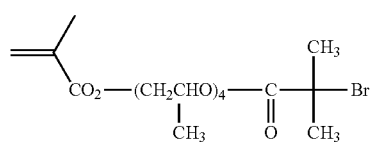 i-12
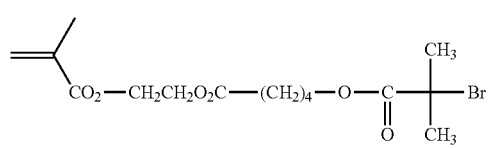 i-13
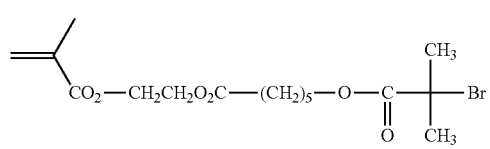 i-14
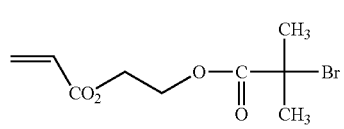 i-15
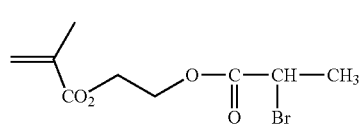 i-16
-continued
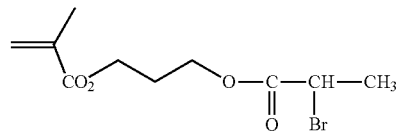 i-17
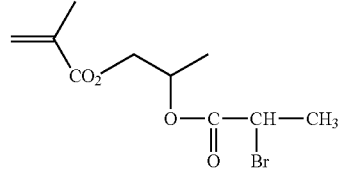 i-18
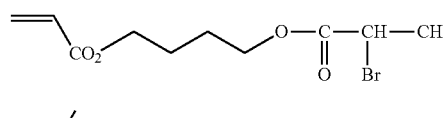 i-19
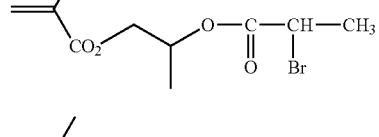 i-20
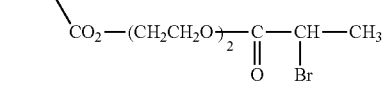 i-21
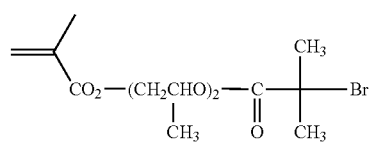 i-22
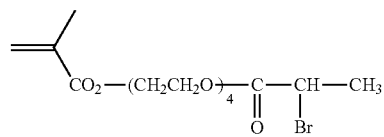 i-23
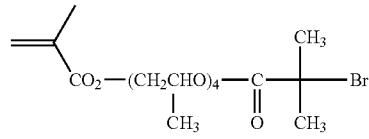 i-24
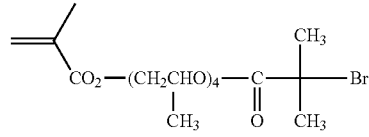 i-25
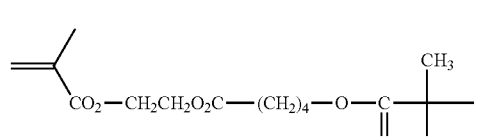 i-26
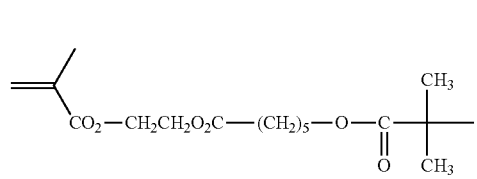 i-27

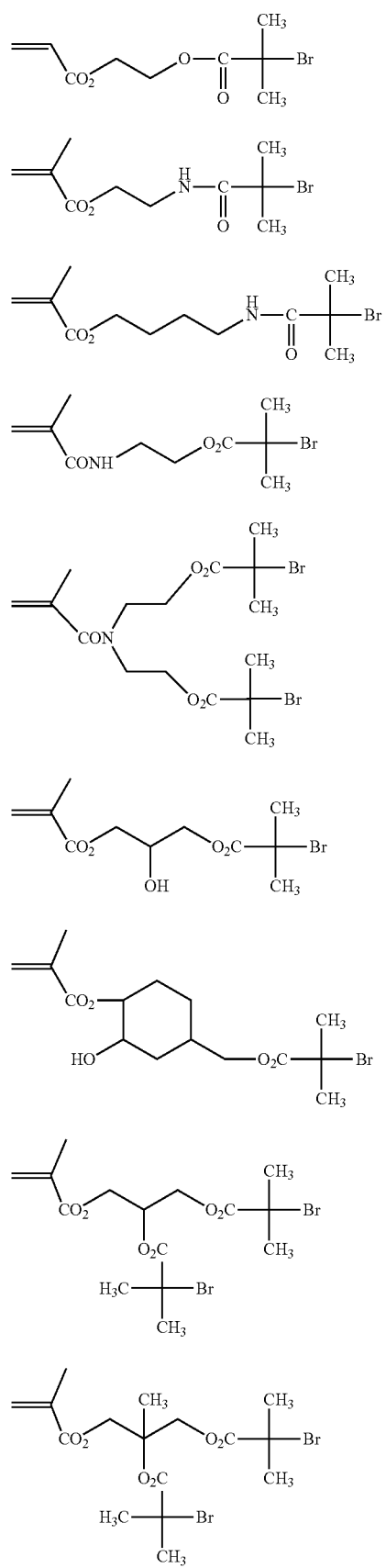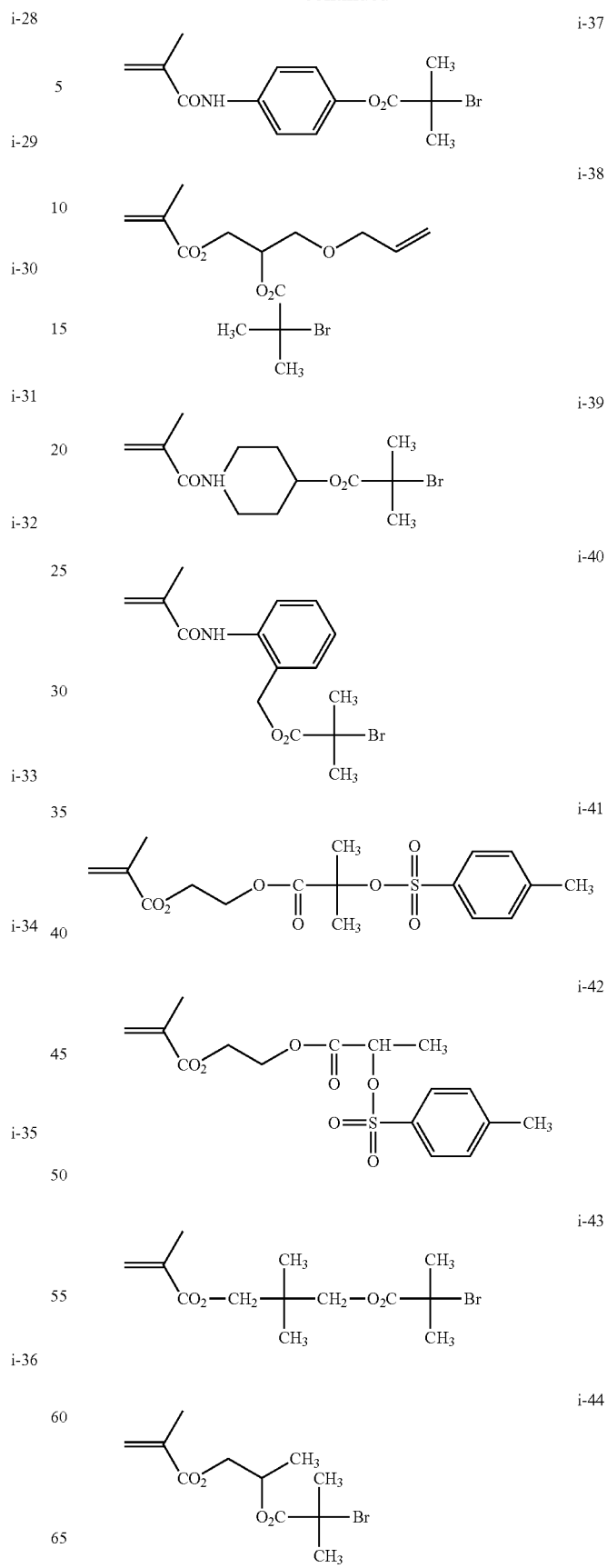

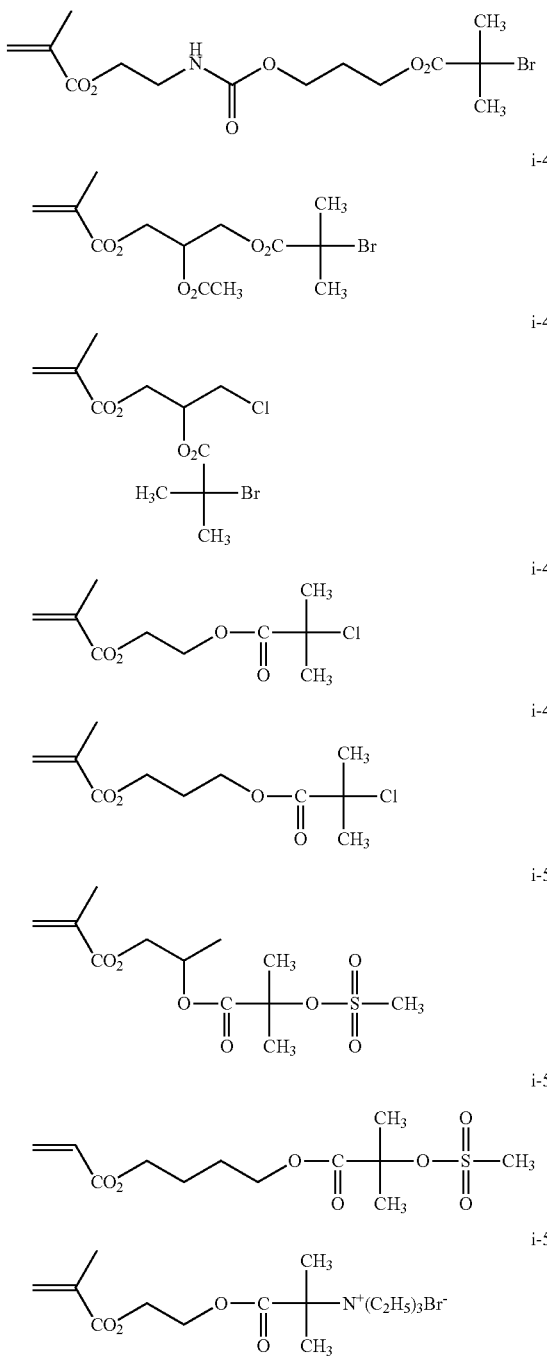

(a-3) The specific dispersion resin of the present invention is required to have a photopolymerizable unsaturated bond from the viewpoint of improving photosensitivity, and is required to have an acidic group such as COOH, $SO_3H$, $PO_3H_2$, $OSO_3H$, or $OPO_2H_2$ from the viewpoint of enabling alkali development. Further, (a-3) the specific dispersion resin of the present invention also preferably has an acid value in the range from 20 to 300 KOH.mg/g, preferably from 40 to 200 KOH.mg/g, and more preferably from 60 to 150 KOH.mg/g, from the viewpoint of the balance among dispersion stability, developability, and sensitivity.

Examples of the monomer which can be used as a copolymerization monomer in the synthesis of (a-3) the specific dispersion resin of the present invention include the following (1) to (13).

(1) Monomers having a carboxyl group, such as acrylic acid, methacrylic acid, itaconic acid, crotonic acid, maleic acid, fumaric acid, 4-carboxylstyrene and the like. Acidic cellulose derivatives having a carboxyl group in the side chain may also be used.

(2) Monomers having a hydroxyl group, such as acrylic acid esters and methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, 4-hydroxybutyl methacrylate, and the like, and ethyleneoxy-modified products thereof, hydroxystyrene, and the like.

(3) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, propargyl acrylate, and the like.

(4) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, propargyl methacrylate, and the like.

(5) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide, allyl methacrylamide, and the like.

(6) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, and the like.

(7) Vinyl esters such as vinyl acetate, vinyl chloroacetate, vinyl butyrate, vinyl benzoate, and the like.

(8) Styrenes such as styrene, α-methylstyrene, methylstyrene, chloromethylstyrene, p-acetoxystyrene, and the like.

(9) Vinyl ketones such as methyl vinyl ketone, ethyl vinyl ketone, propyl vinyl ketone, phenyl vinyl ketone, and the like.

(10) Olefins such as ethylene, propylene, isobutylene, butadiene, isoprene, and the like.

(11) N-vinylpyrrolidone, acrylonitrile, methacrylonitrile, and the like.

(12) Unsaturated imides such as maleimide, N-acryloyl acrylamide, N-acetyl methacrylamide, N-propionyl methacrylamide, N-(p-chlorobenzoyl) methacrylamide, and the like.

(13) Methacrylic acid monomers having a heteroatom bound at the α-position. For example, the compounds described in JP-A No. 2002-309057, JP-A No. 2002-311569, and the like.

Further, non-acryl-based resins having a polymerizable group in the side chain can also be used in the present invention, in addition to the (meth)acryl-based resins.

Specific examples of the resin include a urethane resin, a novolak resin, an acetal resin, a styrene-based resin, a polyester-based resin, a polyamide-based resin, a polyurea resin, and a polyimide resin, which each have an ethylenically unsaturated bond in the side chain, and among these, a urethane resin (hereinafter suitably referred to as a "specific urethane resin") and a styrene-based resin (hereinafter suitably referred to as a "specific styrene-based resin") are particularly preferable in view of the efficacy thereof.

First, as a preferred embodiment of the present invention, specific urethane resins will be described in detail.

(Urethane Resin Having Ethylenically Unsaturated Bond in Side Chain)

Examples of the specific urethane resin used in the present invention include those having at least one functional group represented by the following general formulae (1) to (3) in the side chain. First, the functional groups represented by the following general formulae (1) to (3) will be described.

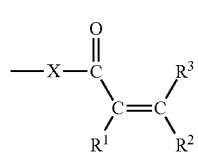

General Formula (1)

In the general formula (1), $R^1$ to $R^3$ each independently represent a hydrogen atom or a monovalent organic group. Examples of $R^1$ preferably include a hydrogen atom, an alkyl group which may have a substituent, and the like. Among these, a hydrogen atom and a methyl group are more preferred in view of high radical reactivity. Examples of $R^2$ and $R^3$ include each independently a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, and the like. Among these, a hydrogen atom, a carboxyl group, an alkoxycarbonyl group, an alkyl group which may have a substituent, and an aryl group which may have a substituent are preferred in view of high radical reactivity.

X represents an oxygen atom, a sulfur atom, or —N($R^{12}$)—, and $R^{12}$ represents a hydrogen atom or a monovalent organic group. Examples of $R^{12}$ include an alkyl group which may have a substituent, and the like. Among these, a hydrogen atom, a methyl group, an ethyl group, and an isopropyl group are preferred in view of high radical reactivity.

Herein, examples of the substituent which can be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group, an arylsulfonyl group, and the like.

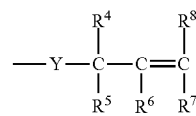

General Formula (2)

In the general formula (2), $R^4$ to $R^8$ each independently represent a hydrogen atom or a monovalent organic group. $R^4$ to $R^8$ each preferably represent a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, or the like. Among these, a hydrogen atom, a carboxyl group, an alkoxycarbonyl group, an alkyl group which may have a substituent, and an aryl group which may have a substituent are more preferred.

Examples of the substituent which can be introduced are the same as those for the general formula (1). Y represents an oxygen atom, a sulfur atom, or —N($R^{12}$)—. $R^{12}$ has the same definition as $R^{12}$ in the general formula (1) and preferred examples thereof are also the same.

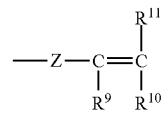

General Formula (3)

In the general formula (3), examples of $R^9$ preferably include a hydrogen atom, an alkyl group which may have a substituent, and the like. Among these, a hydrogen atom and a methyl group are preferred in view of high radical reactivity. Examples of $R^{10}$ and $R^{11}$ each independently include a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, and the like. Among these, a hydrogen atom, a carboxyl group, an alkoxycarbonyl group, an alkyl group which may have a substituent, and an aryl group which may have a substituent are preferred in view of high radical reactivity.

Herein, examples of the substituent which can be introduced are the same as those for the general formula (1). Z represents an oxygen atom, a sulfur atom, —N($R^{13}$)—, or a phenylene group which may have a substituent. Examples of $R^{13}$ include an alkyl group which may have a substituent, and the like. Among these, a methyl group, an ethyl group, and an isopropyl group are preferred in view of high radical reactivity.

Next, the basic skeleton of the specific urethane resin according to the present invention will be described below.

The specific urethane resin according to the present invention is a polyurethane resin having, as a basic skeleton, a structural unit which is a reaction product of at least one diisocyanate compound represented by the following general formula (4) and at least one diol compound represented by the general formula (5) (hereinafter referred to as a "specific polyurethane resin").

OCN—X⁰—NCO                General Formula (4)

HO—Y⁰—OH                  General Formula (5)

In the general formula (4) and (5), X⁰ and Y⁰ each independently represent a divalent organic residue.

When at least one of the diisocyanate compound represented by the general formula (4) or the diol compound represented by the general formula (5) contains at least one group represented by the general formulae (1) to (3), a specific polyurethane resin having the group represented by the general formulae (1) to (3) introduced into the side chain is produced as a reaction product of this diisocyanate compound and diol compound. According to such a method, the specific polyurethane resin for use in the present invention can be more easily produced than in the case of substituting and introducing a desired side chain after the reaction and production of a polyurethane resin.

1) Diisocyanate Compound

The diisocyanate compound represented by the general formula (4) may be a reaction product obtained by addition-reacting, for example, a triisocyanate compound with one equivalent of a monofunctional alcohol or monofunctional amine compound having an unsaturated group.

Examples of the triisocyanate compound include, but are not limited to, those as set forth below.

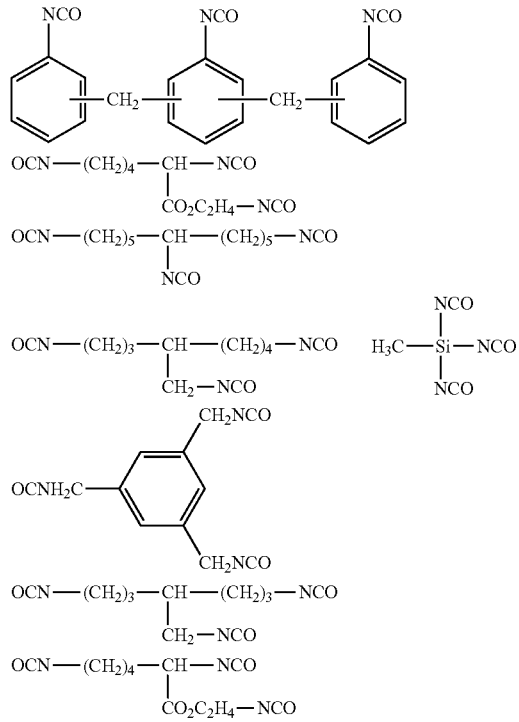

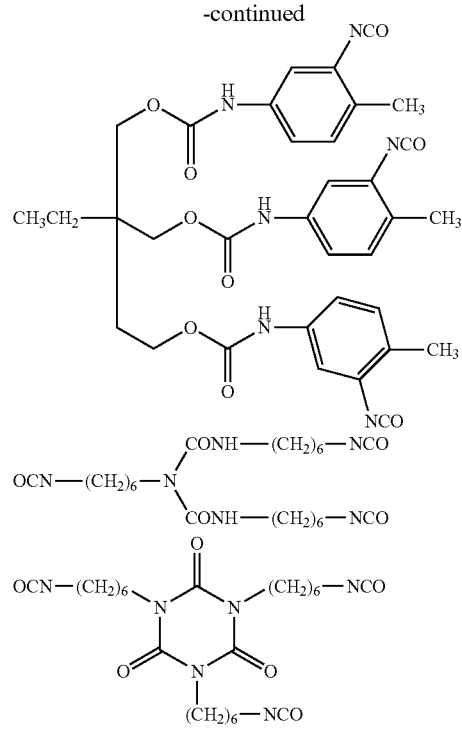

Examples of the monofunctional alcohol or monofunctional amine compound having an unsaturated group include, but are not limited to, those set forth below.

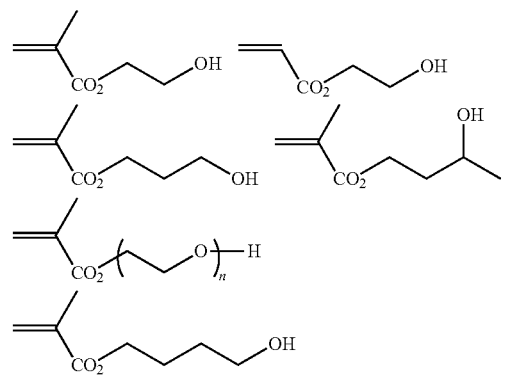

n is an integer of 2 to 10.

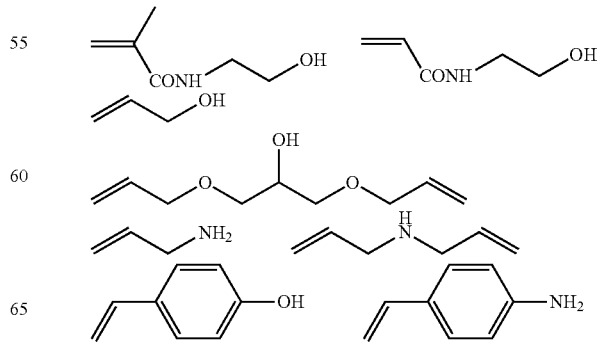

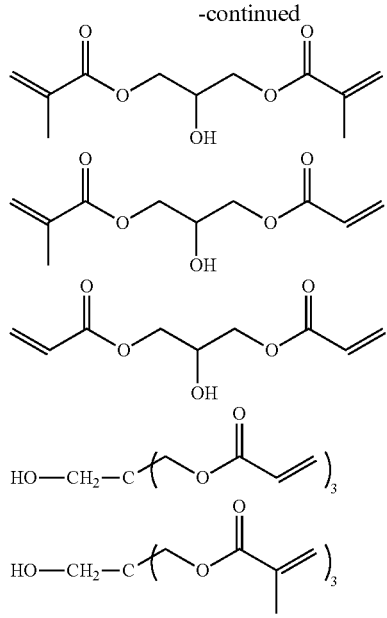

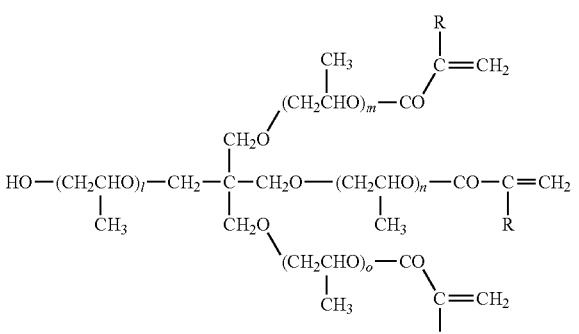

R=hydrogen or a methyl group; l, m, n, o=an integer of 1 to 20

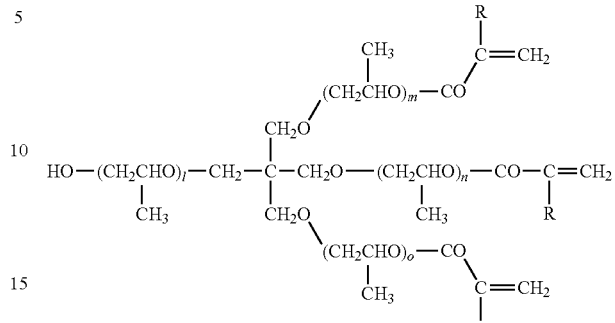

R=hydrogen or a methyl group; l, m, n, o=an integer of 1 to 20

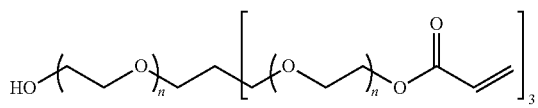

n=an integer of 1 to 20

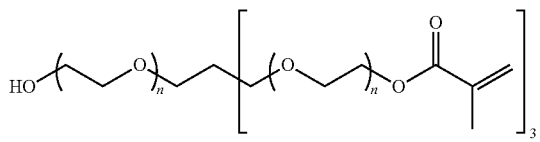

n=an integer of 1 to 20

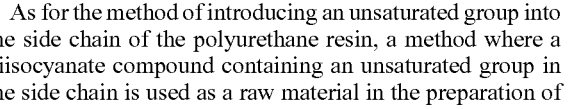

n=an integer of 1 to 20

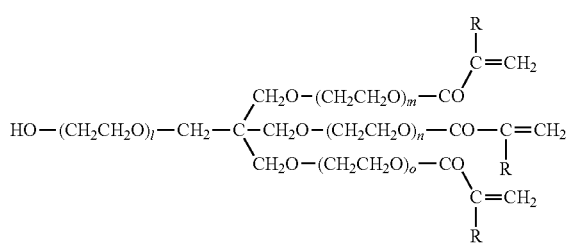

n=an integer of 1 to 20

As for the method of introducing an unsaturated group into the side chain of the polyurethane resin, a method where a diisocyanate compound containing an unsaturated group in the side chain is used as a raw material in the preparation of the polyurethane resin is preferred. Examples of the diisocyanate compound having an unsaturated group in the side chain, which can be obtained by the addition-reaction of a triisocyanate compound with one equivalent of a monofunctional alcohol or monofunctional amine compound having an unsaturated group, include, but are not limited to, those set forth below.

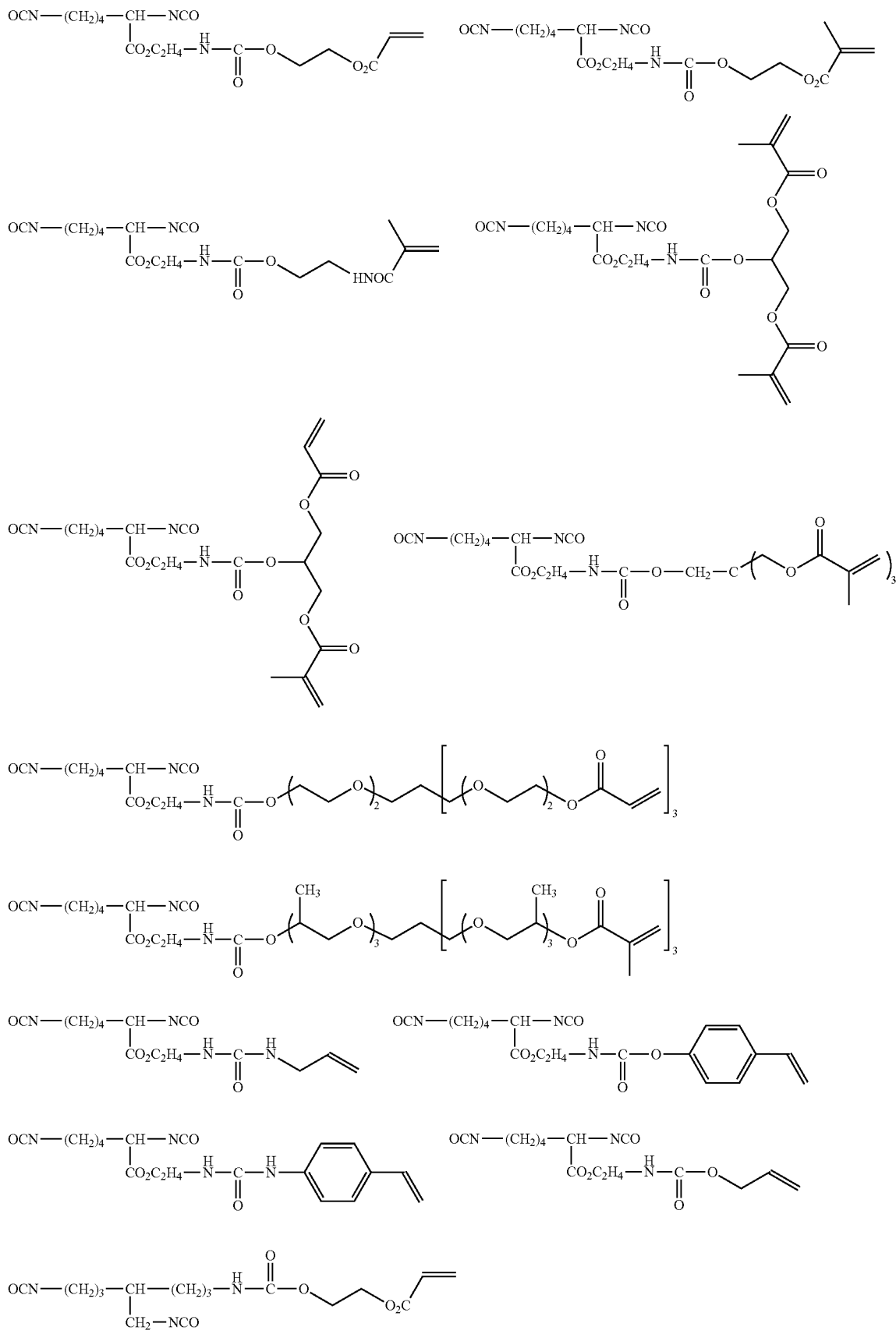

-continued
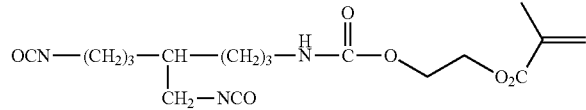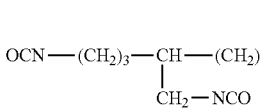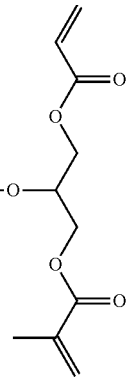
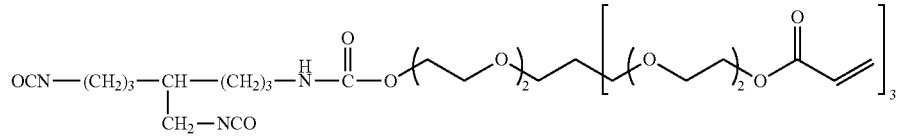
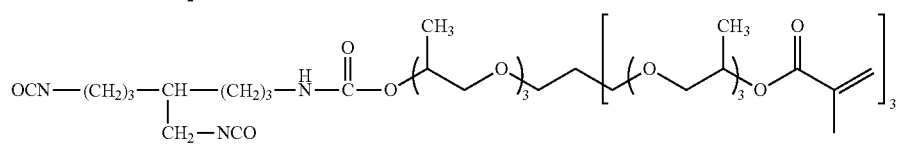
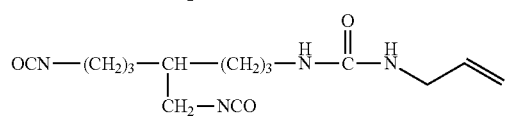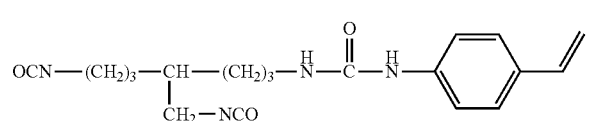
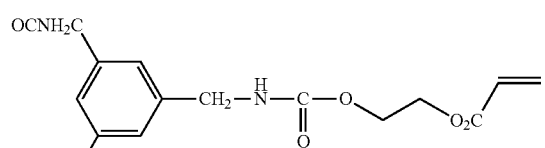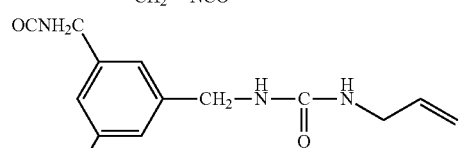
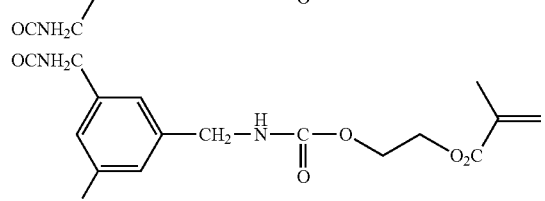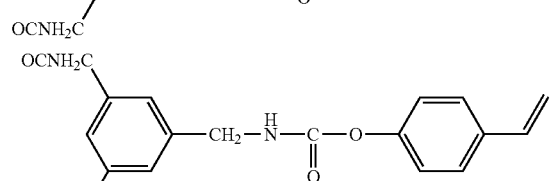
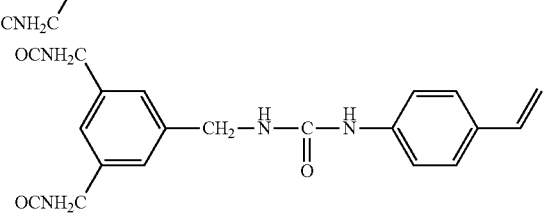
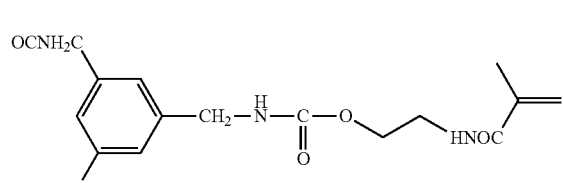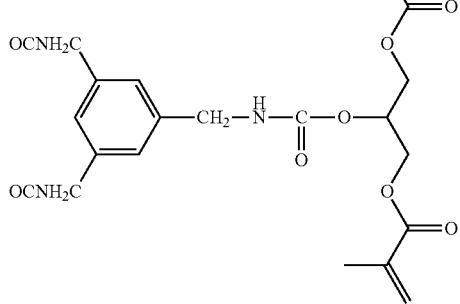

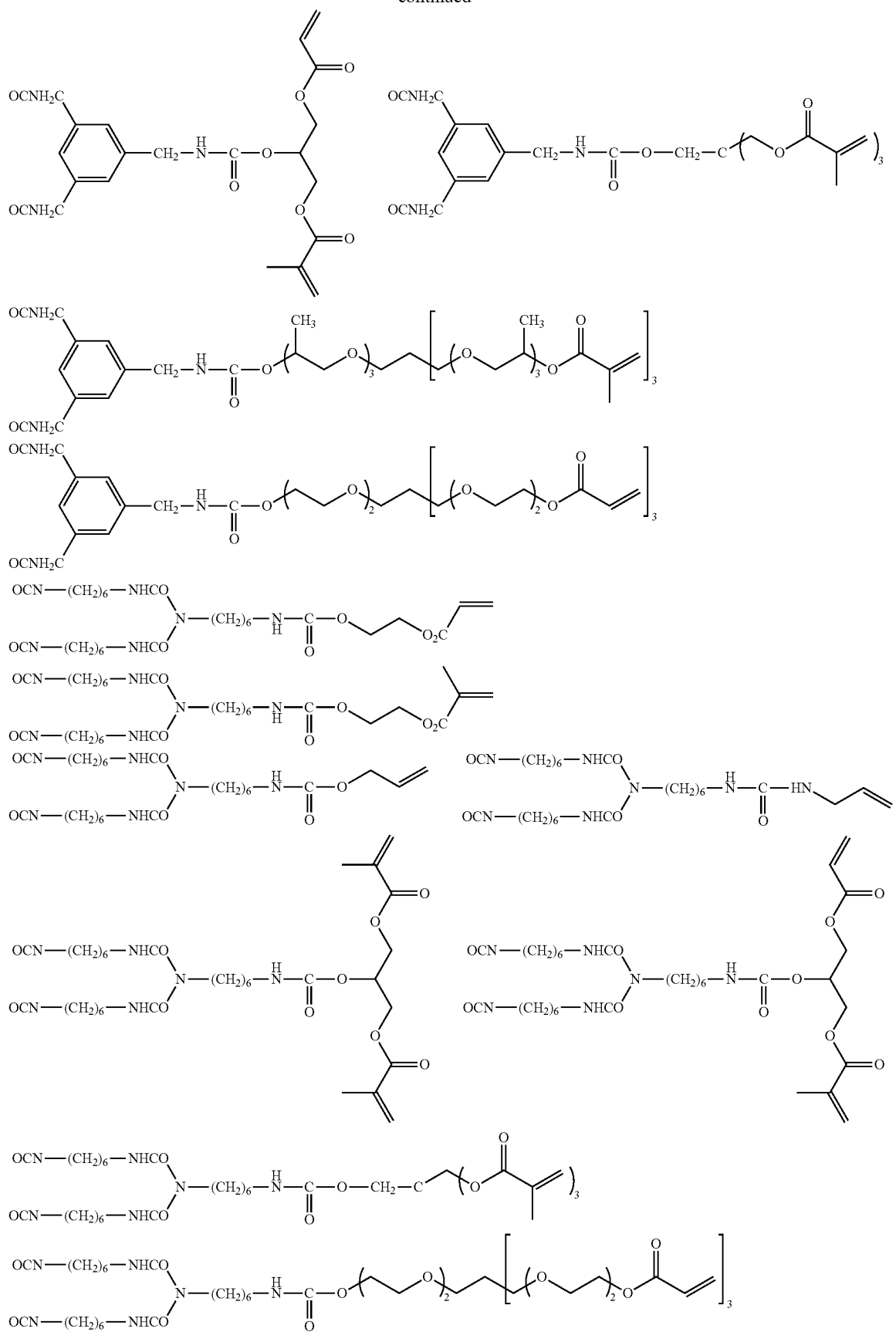

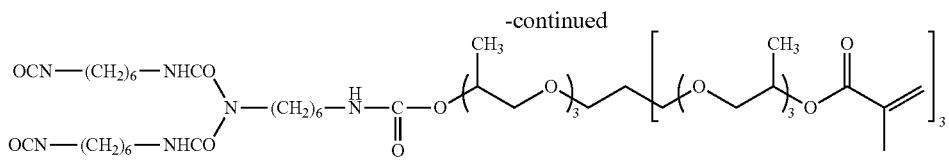

In the specific polyurethane resin used in the present invention, a diisocyanate compound other than the above-described diisocyanate compound having an unsaturated group may be copolymerized, for example, from the standpoint of elevating the compatibility with other components in the polymerizable composition and enhancing the storage stability.

Example of the diisocyanate compound which is copolymerized include the following compounds, and a diisocyanate compound represented by the following general formula (6) is preferable.

OCN-L$^1$-NCO  General Formula (6)

In the general formula (6), L$^1$ represents a divalent aliphatic or aromatic hydrocarbon group which may have a substituent. If desired, L$^1$ may contain another functional group which does not react with the isocyanate group, such as an ester group, a urethane group, an amide group, and a ureido group.

Specific examples of the diisocyanate compound represented by the general formula (6) include the following:

aromatic diisocyanate compounds such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate, and the like;

aliphatic diisocyanate compounds such as hexamethylene diisocyanate, trimethylhexamethylene diisocyanate, lysine diisocyanate, dimer acid diisocyanate, and the like;

alicyclic diisocyanate compounds such as isophorone diisocyanate, 4,4'-methylenebis(cyclohexylisocyanate), methylcyclohexane-2,4(or 2,6)-diisocyanate, 1,3-(isocyanatomethyl)cyclohexane, and the like; and diisocyanate compounds which are a reaction product of a diol with a diisocyanate, such as an adduct of 1 mole of 1,3-butylene glycol and 2 moles of tolylene diisocyanate, and the like;

and others.

2) Diol Compound

Examples of the diol compound represented by the general formula (5) include a wide range of polyether diol compounds, polyester diol compounds, polycarbonate diol compounds, and the like.

Herein, as for the method of introducing an unsaturated group into the side chain of the polyurethane resin, in addition to the method described above, a method where a diol compound containing an unsaturated group in the side chain is used as a raw material in the production of the polyurethane resin is also preferred. This diol compound may be, for example, a commercially available product such as trimethylolpropane monoallyl ether, or a compound easily produced by the reaction of a halogenated diol compound, a triol compound, or an aminodiol compound with a carboxylic acid, an acid chloride, an isocyanate, an alcohol, an amine, a thiol, or a halogenated alkyl compound having an unsaturated group. Specific examples of such a compound include, but are not limited to, the compounds as set forth below.

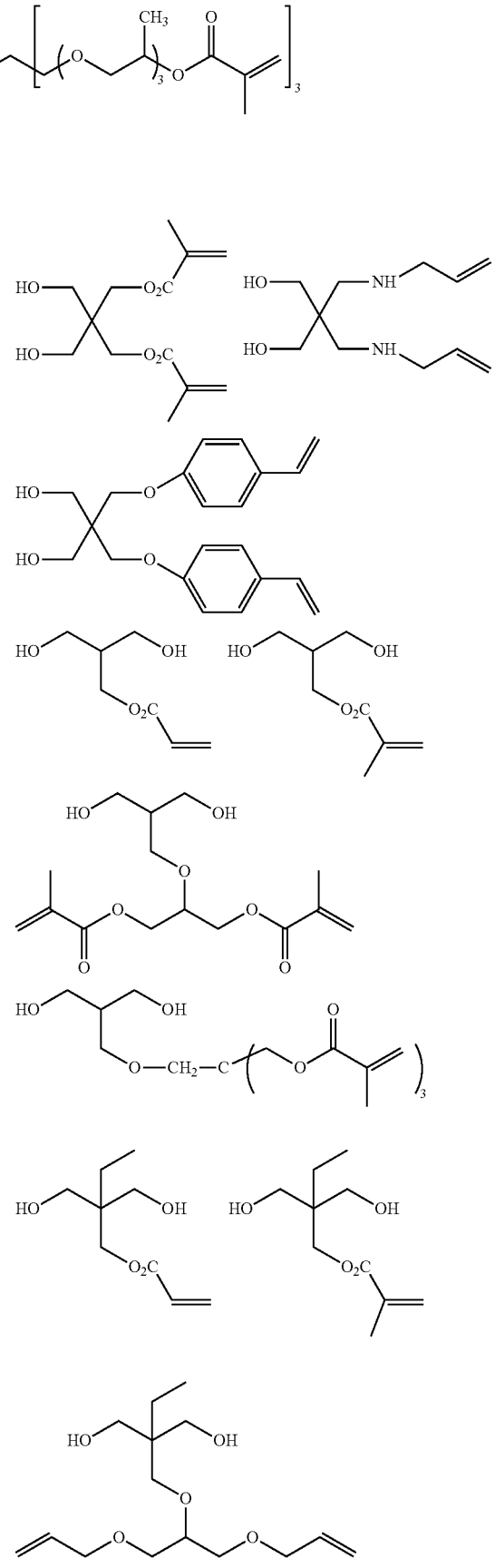

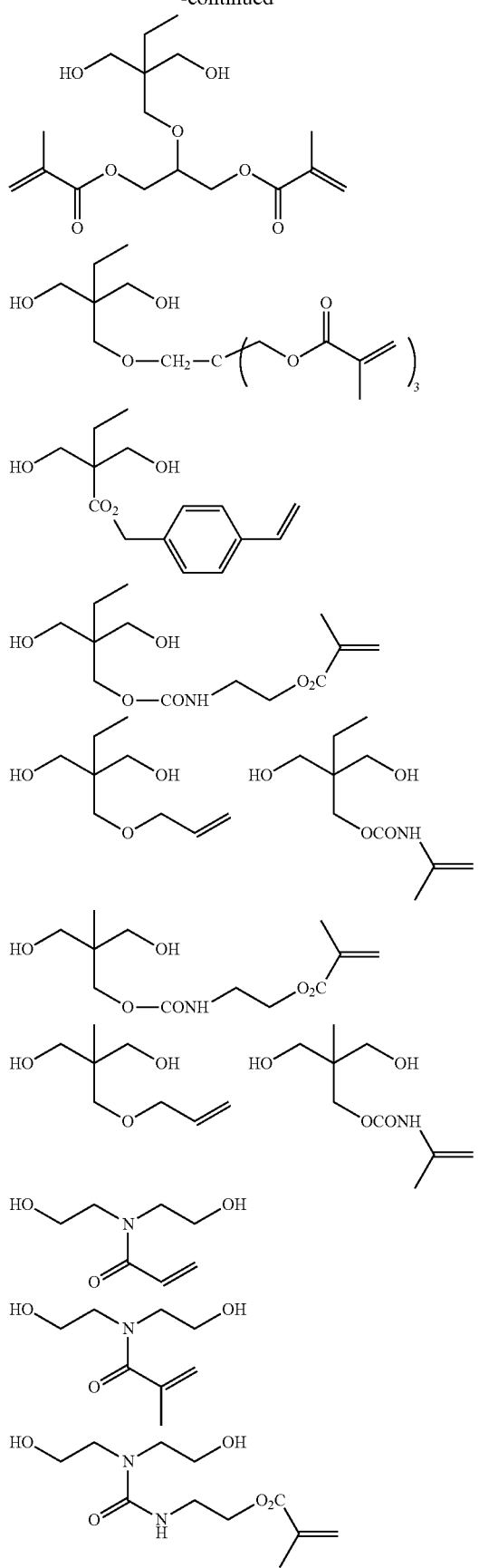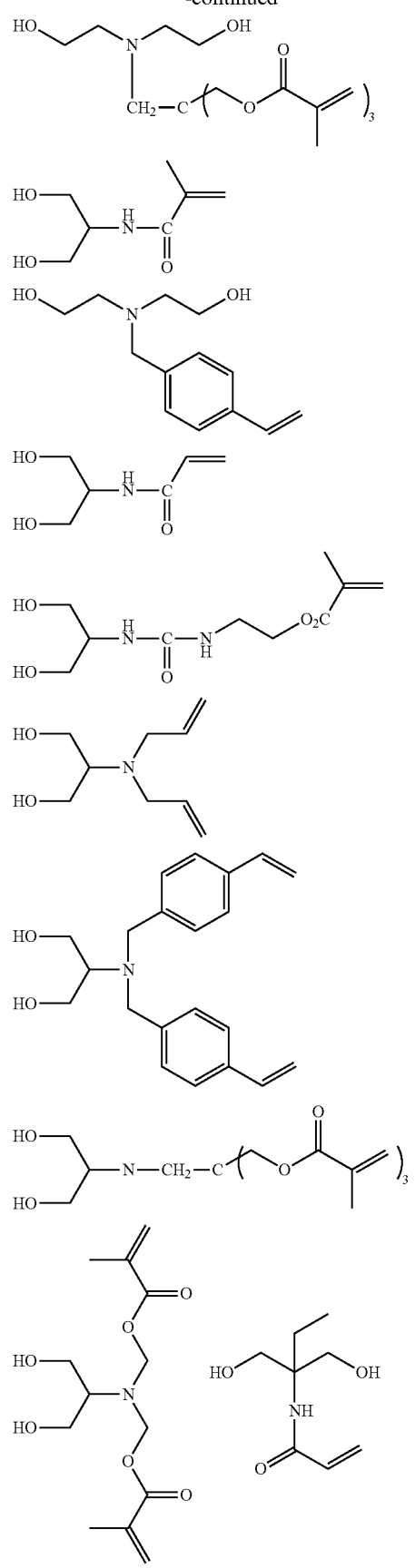

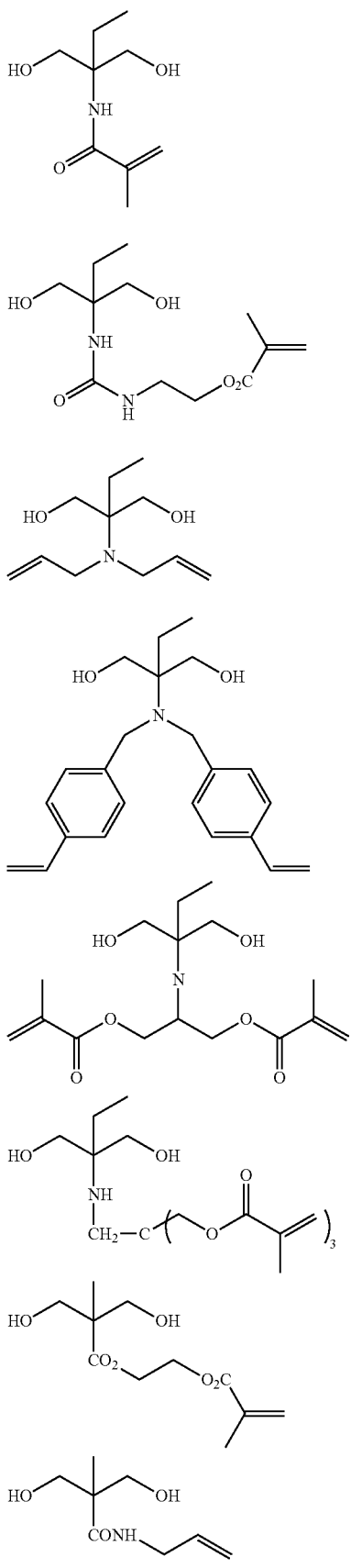

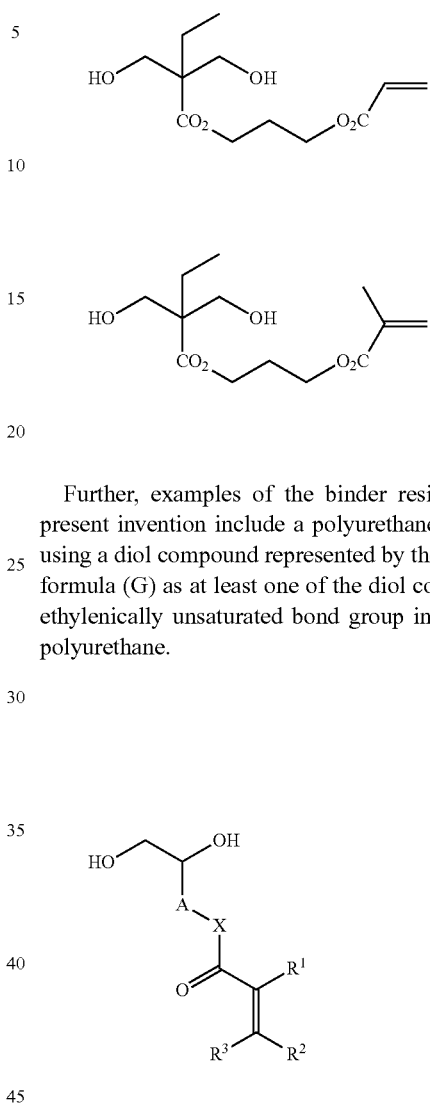

Further, examples of the binder resin preferred in the present invention include a polyurethane resin obtained by using a diol compound represented by the following general formula (G) as at least one of the diol compound having an ethylenically unsaturated bond group in the synthesis of a polyurethane.

Formula (G)

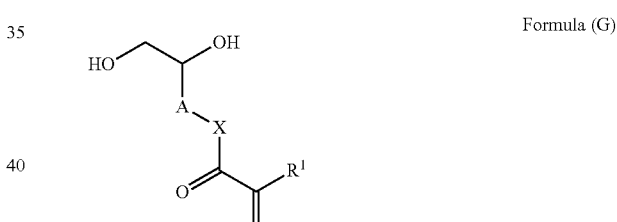

In the general formula (G), $R^1$ to $R^3$ each independently represent a hydrogen atom or a monovalent organic group, A represents a divalent organic residue, X represents an oxygen atom, a sulfur atom, or $—N(R^{12})—$, and $R^{12}$ represents a hydrogen atom or a monovalent organic group.

Further, $R^1$ to $R^3$ and X in the general formula (G) have the same definitions as $R^1$ to $R^3$ and X in the general formula (1) and preferred embodiments thereof are also the same.

It is considered that by using a polyurethane resin derived from such a diol compound, an effect of preventing excessive molecular motion of the polymer main chain is obtained by virtue of the secondary alcohol having a larger steric hindrance, and the film strength of the layer can be elevated.

Specific examples of the diol compound represented by the general formula (G), which is preferably used in the synthesis of the specific polyurethane resin, are set forth below.

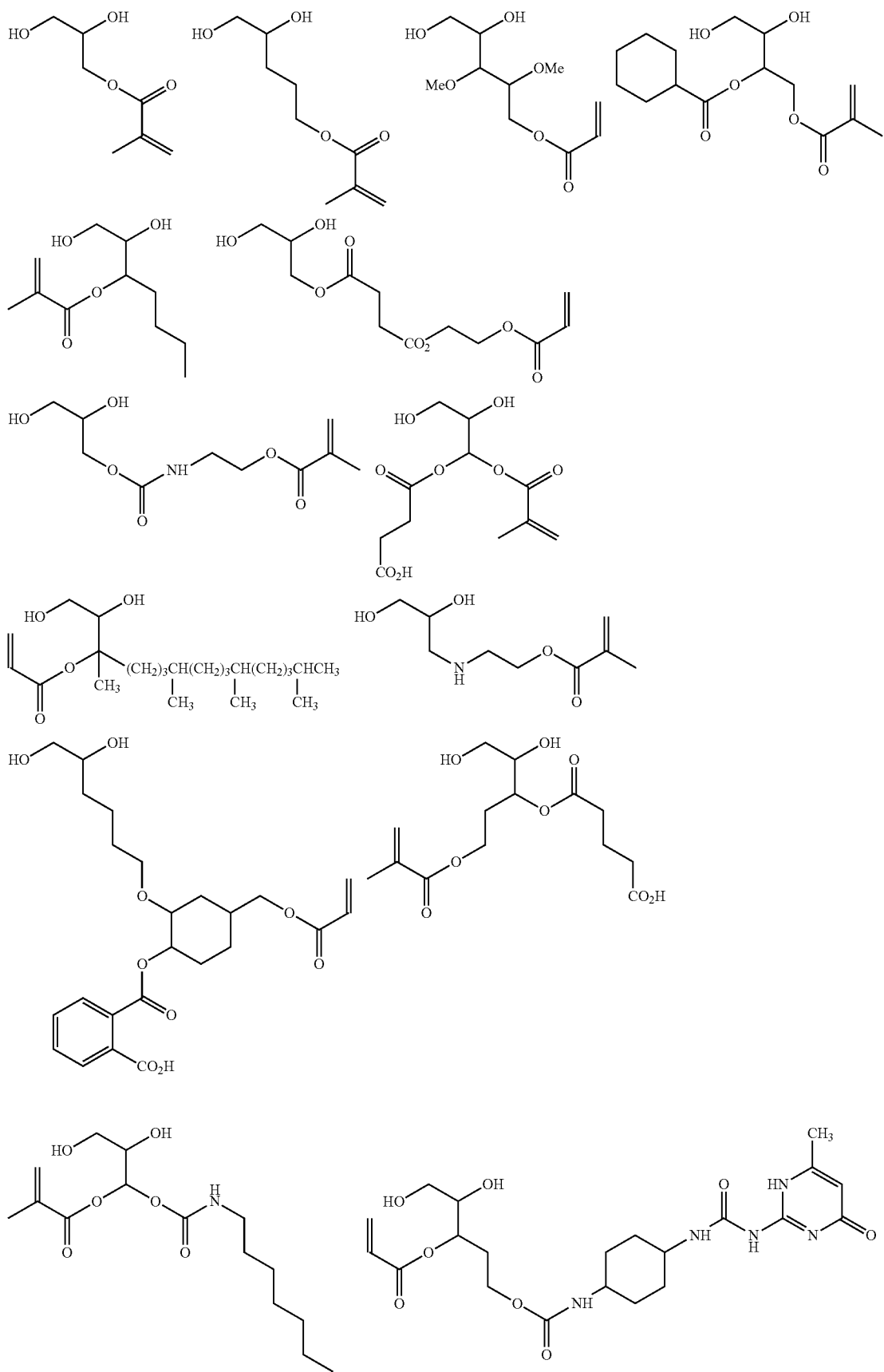

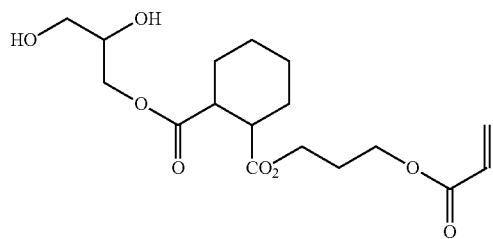
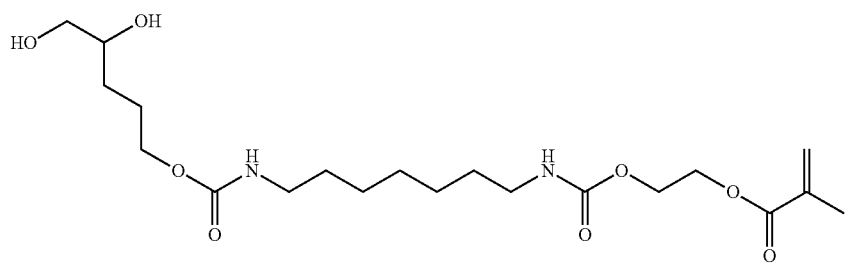
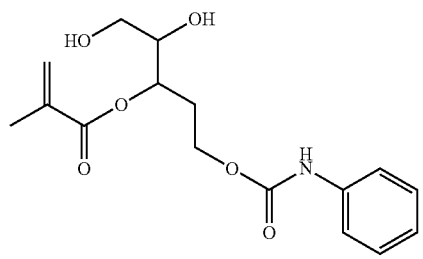
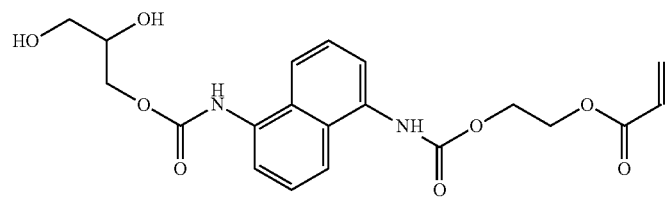
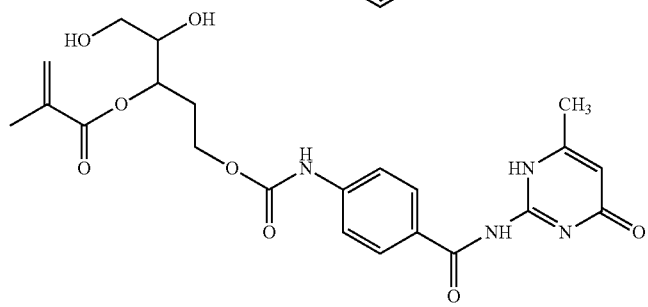
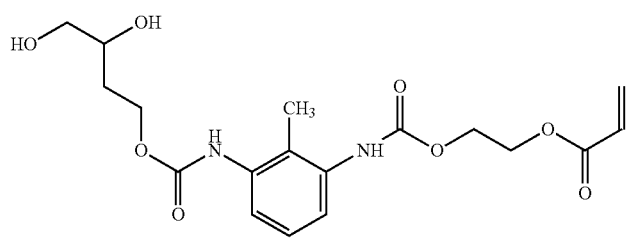
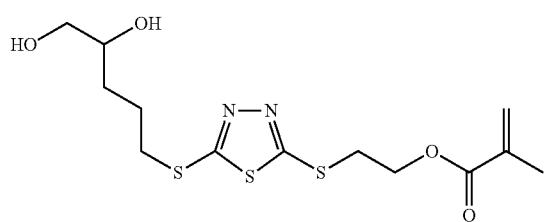
In the specific polyurethane resin for use in the present invention, a diol compound other than the above-described diol compound having an unsaturated group may be copolymerized from the standpoint of, for example, elevating the compatibility with other components in the polymerizable composition and enhancing the storage stability.

Examples of the diol compound include the above-described polyether diol compounds, polyester diol compounds, and polycarbonate diol compounds.

Examples of the polyether diol compound include the compounds represented by the following general formulae (7), (8), (9), (10), and (11), and hydroxyl-terminated ethylene oxide-propylene oxide random copolymers.

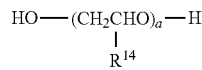  (7)

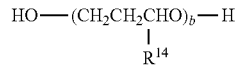  (8)

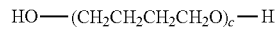  (9)

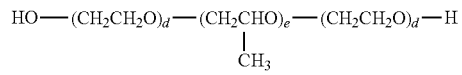  (10)

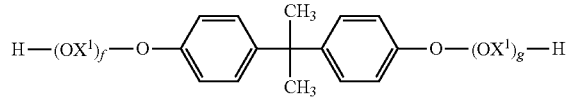  (11)

In the formulae (7) to (11), $R^{14}$ represents a hydrogen atom or a methyl group, and $X^1$ represents a group shown below. Further, a, b, c, d, e, f, and g each represent an integer of 2 or more, and preferably an integer of 2 to 100.

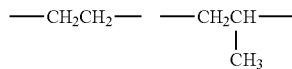

Specific examples of the polyether diol compounds represented by the formulae (7) and (8) include the following:

diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight-average molecular weight of 1000, polyethylene glycol having a weight-average molecular weight of 1500, polyethylene glycol having a weight-average molecular weight of 2000, polyethylene glycol having a weight-average molecular weight of 3000, polyethylene glycol having a weight-average molecular weight of 7500, polypropylene glycol having a weight-average molecular weight of 400, polypropylene glycol having a weight-average molecular weight of 700, polypropylene glycol having a weight-average molecular weight of 1000, polypropylene glycol having a weight-average molecular weight of 2000, polypropylene glycol having a weight-average molecular weight of 3000, polypropylene glycol having a weight-average molecular weight of 4000, and the like.

Specific examples of the polyether diol compound represented by the formula (9) include the following:

PTMG650, PTMG1000, PTMG2000, and PTMG3000 (trade names) (all manufactured by Sanyo Chemical Industries, Ltd.), and the like.

Specific examples of the polyether diol compound represented by the formula (10) include the following:

NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128, and NEWPOL PE-61 (trade names) (all manufactured by Sanyo Chemical Ind., Ltd.), and the like.

Specific examples of the polyether diol compound represented by the general formula (11) include the following:

NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P, and NEWPOL BPE-5P (trade names) (all manufactured by Sanyo Chemical Ind., Ltd.), and the like.

Specific examples of the ethylene oxide-propylene oxide random copolymer having a hydroxyl group at the terminal include the following:

NEWPOL 50HB-100, NEWPOL 50HB-260, NEWPOL 50HB-400, NEWPOL 50HB-660, NEWPOL 50HB-2000, NEWPOL 50HB-5100 (trade names) (all manufactured by Sanyo Chemical Ind., Ltd.), and the like.

Examples of the polyester diol compound include compounds represented by the formulae (12) and (13).

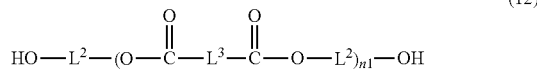  (12)

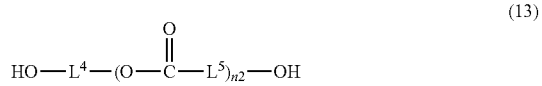  (13)

In the formulae (12) and (13), $L^2$, $L^3$, and $L^4$, which may be the same as or different from each other, each represent a divalent aliphatic or aromatic hydrocarbon group, and $L^5$ represents a divalent aliphatic hydrocarbon group. $L^2$ to $L^4$ each preferably represents an alkylene group, an alkenylene group, an alkynylene group or an arylene group, and $L^5$ preferably represents an alkylene group. Further, in $L^2$ to $L^5$, another functional group which does not react with the isocyanate group, such as an ether group, a carbonyl group, an ester group, a cyano group, an olefin group, a urethane group, an amide group, a ureido group, a halogen atom, and the like, may be present. n1 and n2 each represent an integer of 2 or more, and preferably an integer of 2 to 100.

Examples of the polycarbonate diol compound include compounds represented by the formula (14).

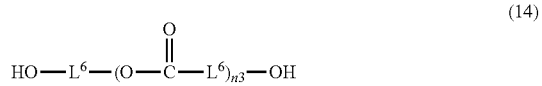  (14)

In the formula (14), $L^6$'s, which may be the same as or different from each other, each represent a divalent aliphatic or aromatic hydrocarbon group. $L^6$ is preferably an alkylene group, an alkenylene group, an alkynylene group, or an arylene group. Further, in $L^6$, another functional group which does not react with the isocyanate group, such as an ether group, a carbonyl group, an ester group, a cyano group, an olefin group, a urethane group, an amide group, a ureido group, a halogen atom, and the like, may be present. n3 represents an integer of 2 or more, and preferably an integer of 2 to 100.

Specific examples of the diol compounds represented by the formula (12), (13), or (14) are set forth below (Exemplary Compound Nos. 1 to 18). In these specific examples, n represents an integer of 2 or more.

In the formulae (15) and (16), $L^7$ and $L^8$, which may be the same as or different from each other, each represent a divalent aliphatic or aromatic hydrocarbon group or a divalent heterocyclic group, which may have a substituent (for example, an alkyl group, an aralkyl group, an aryl group, an alkoxy group, an aryloxy group, a halogen atom such as —F, —Cl, —Br, —I, and the like). Further, in $L^7$ and $L^8$, another functional

(No. 1)

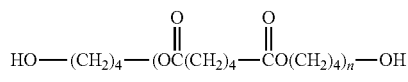
(No. 2)

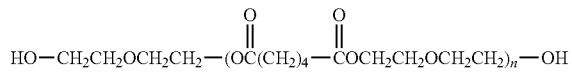
(No. 3)

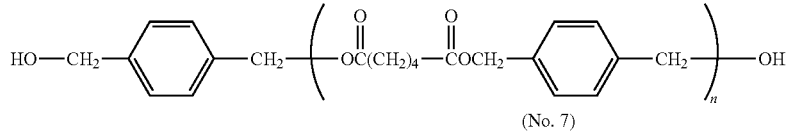
(No. 4)

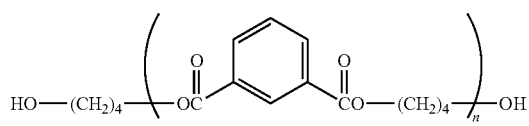
(No. 5)

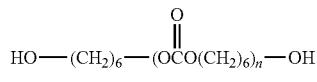
(No. 6)

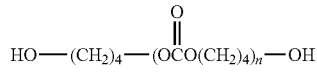
(No. 7)

(No. 8)

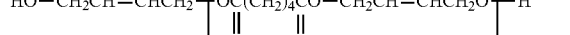
(No. 9)

(No. 10)

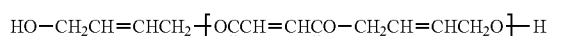
(No. 11)

(No. 12)

(No. 13)

(No. 14)

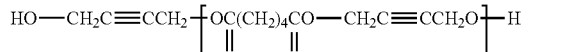
(No. 15)

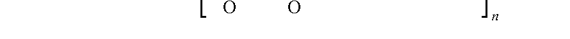
(No. 16)

(No. 17)

(No. 18)

Further, other than the above-described diol compounds, a diol compound having a substituent which does not react with the isocyanate group can also be used in combination, for the synthesis of the specific polyurethane resin. Examples of this diol compound include the following:

group which does not react with the isocyanate group, such as a carbonyl group, an ester group, a urethane group, an amide group, a ureido group, and the like, may be present, if desired. Also, $L^7$ and $L^8$ may form a ring.

Further, in addition to these diol compounds, a diol compound having a carboxyl group may also be used in combination for the synthesis of the specific polyurethane resin.

HO-L$^7$-O—CO-L$^8$-CO—O-L$^7$-OH    (15)

HO-L$^8$-CO—O-L$^7$-OH    (16)

Examples of this diol compound include compounds represented by the following formulae (17) to (19).

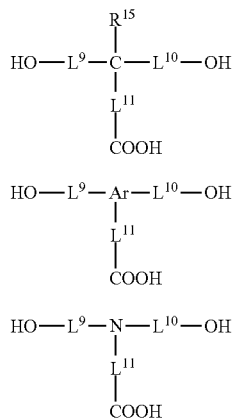

In the formulae (17) to (19), $R^{15}$ represents a hydrogen atom or an alkyl, aralkyl, aryl, alkoxy or aryloxy group which may have a substituent (examples of the substituent include a cyano group, a nitro group, a halogen atom such as —F, —Cl, —Br, —I, and the like, —CONH$_2$, —COOR$^{16}$, —OR$^{16}$, —NHCONHR$^{16}$, —NHCOOR$^{16}$, —NHCOR$^{16}$, —OCONHR$^{16}$ (wherein R$^{16}$ represents an alkyl group having 1 to 10 carbon atoms or an aralkyl group having 7 to 15 carbon atoms)), preferably a hydrogen atom, an alkyl group having 1 to 8 carbon atoms, or an aryl group having 6 to 15 carbon atoms. $L^9$, $L^{10}$, and $L^{11}$, which may be the same as or different from each other, each represent a single bond or a divalent aliphatic or aromatic hydrocarbon group which may have a substituent (preferred examples of the substituent include an alkyl group, an aralkyl group, an aryl group, an alkoxy group and a halogeno group), preferably an alkylene group having 1 to 20 carbon atoms or an arylene group having 6 to 15 carbon atoms, and more preferably an alkylene group having 1 to 8 carbon atoms. If desired, $L^9$ to $L^{11}$ each may contain another functional group which does not react with the isocyanate group, such as a carbonyl group, an ester group, a urethane group, an amide group, a ureido group, and an ether group. Two or three of $R^{15}$, and $L^9$ to $L^{11}$ may form a ring.

Ar represents a trivalent aromatic hydrocarbon group which may have a substituent, and preferably an aromatic group having 6 to 15 carbon atoms.

Specific examples of the carboxyl group-containing diol compounds represented by the formulae (17) to (19) include the following:

3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, N,N-bis(2-hydroxyethyl)-3-carboxy-propionamide, and the like.

By virtue of the presence of a carboxyl group, properties such as a hydrogen bonding property and alkali solubility can be imparted to the polyurethane resin and this is preferred. More specifically, the polyurethane resin having an ethylenically unsaturated bond group in the side chain is a resin further having a carboxyl group in the side chain. Still more specifically, a polyurethane resin having 0.3 meq/g or more of an ethylenically unsaturated bond group in the side chain and having 0.4 meq/g or more of a carboxyl group in the side chain is preferably used as the binder polymer of the present invention.

Further, other than these diols, a compound obtained by ring-opening a tetracarboxylic acid dianhydride represented by any one of the following formulae (20) to (22) with a diol compound may be used in combination for the synthesis of the specific polyurethane resin.

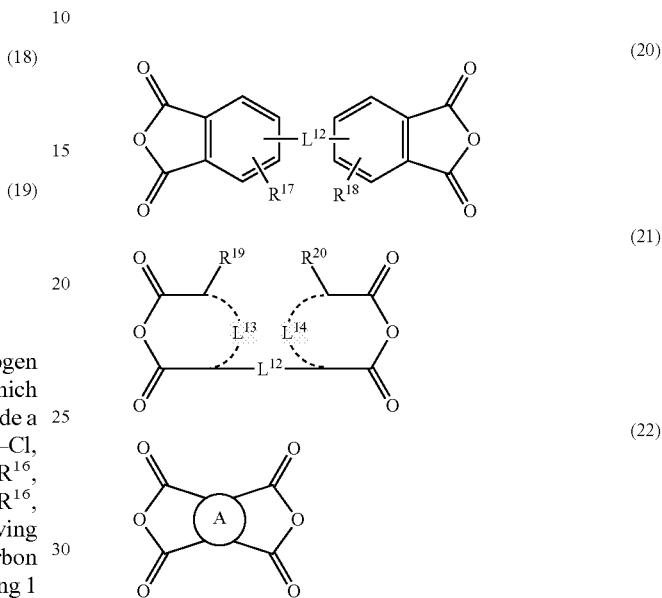

In the formulae (20) to (22), $L^{12}$ represents a single bond, a divalent aliphatic or aromatic hydrocarbon group which may have a substituent (preferred examples of the substituent include an alkyl group, an aralkyl group, an aryl group, an alkoxy group, a halogeno group, an ester group, and an amide group), —CO—, —SO—, —SO$_2$—, —O—, or —S—, and preferably a single bond, a divalent aliphatic hydrocarbon group having 1 to 15 carbon atoms, —CO—, —SO$_2$—, —O—, or —S—. $R^{17}$ and $R^{18}$, which may be the same as or different from each other, each represent a hydrogen atom, an alkyl group, an aralkyl group, an aryl group, an alkoxy group, or a halogeno group, and preferably a hydrogen atom, an alkyl group having 1 to 8 carbon atoms, an aryl group having 6 to 15 carbon atoms, an alkoxy group having 1 to 8 carbon atoms or a halogeno group. Two of $L^{12}$, $R^{17}$, and $R^{18}$ may be combined with each other to form a ring.

$R^{19}$ and $R^{20}$, which may be the same as or different from each other, each represent a hydrogen atom, an alkyl group, an aralkyl group, an aryl group or a halogeno group, preferably a hydrogen atom, an alkyl group having 1 to 8 carbon atoms or an aryl group having 6 to 15 carbon atoms. Two of $L^{12}$, $R^{19}$, and $R^{20}$ may be combined with each other to form a ring. $L^{13}$ and $L^{14}$, which may be the same as or different from each other, each represent a single bond, a double bond or a divalent aliphatic hydrocarbon group, preferably a single bond, a double bond or a methylene group. A represents a mononuclear or polynuclear aromatic ring, and preferably an aromatic ring having 6 to 18 carbon atoms.

Specific examples of the compounds represented by the formulae (20), (21), and (22) include the following:

aromatic tetracarboxylic dianhydrides such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)bis(iminocarbonyl)]diphthalic dianhydride, an adduct of hydroquinone diacetate and trimellitic anhydride, and an adduct of diacetyldiamine and trimellitic anhydride, and the like; alicyclic tetracarboxylic dianhydrides such as 5-(2,5-dioxotetrahydrofuryl)-3-methyl-3-cyclohexene-1,2-dicarboxylic anhydride (EPICLON B-4400, manufactured by Dainippon Ink And Chemicals, Incorporated), 1,2,3,4-cyclopentanetetracarboxylic dianhydride, 1,2,4,5-cyclohexanetetracarboxylic dianhydride, tetrahydrofurantetracarboxylic dianhydride, and the like; and aliphatic tetracarboxylic dianhydrides such as 1,2,3,4-butanetetracarboxylic dianhydride, 1,2,4,5-pentanetetracarboxylic dianhydride, and the like.

Examples of the method for introducing a compound obtained by ring-opening such a tetracarboxylic dianhydride by a diol compound into the polyurethane resin include the following methods:

(a) a method of reacting a diisocyanate compound with an alcohol-terminated compound obtained by ring-opening the tetracarboxylic dianhydride by a diol compound, and (b) a method of reacting the tetracarboxylic dianhydride with an alcohol-terminated urethane compound obtained by reacting a diisocyanate compound and a diol compound under diol compound-excess conditions.

Specific examples of the diol compound used for the ring-opening reaction include the following:

ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinonedihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, bis(2-hydroxyethyl)isophthalate, and the like.

The specific polyurethane resin used in the present invention is synthesized by adding the above-described diisocyanate compounds and diol compounds and a known catalyst having an activity according to the reactivity of respective compounds in an aprotic solvent and heating the solution. The molar ratio ($M_a:M_b$) between diisocyanate compounds and diol compounds used for the synthesis is preferably from 1:1 to 1.2:1. The reaction product may be treated with alcohols or amines, whereby a polyurethane resin having desired physical properties such as molecular weight and viscosity and containing no remaining isocyanate groups can be finally synthesized.

As for the amount of the ethylenically unsaturated bond introduced into the specific polyurethane resin according to the present invention, the ethylenically unsaturated bond group is preferably contained in the side chain in an amount of, in terms of equivalent, 0.3 meq/g or more, and more preferably from 0.35 to 1.50 meq/g. Particularly, the binder polymer of the present invention is preferably a polyurethane resin containing, together with the ethylenically unsaturated bond group, 0.4 meq/g or more, more preferably from 0.45 to 1.00 meq/g, of a carboxyl group in the side chain.

The molecular weight of the specific polyurethane resin according to the present invention is, in terms of the weight-average molecular weight, preferably 10,000 or more, more preferably from 40,000 to 200,000. Particularly, in the case of using the colored curable composition of the present invention to form a colored region of a color filter, when the weight-average molecular weight is in the above-described range, the strength of the image area is excellent and the developability of the non-image area with an alkaline developer is excellent.

Further, as for the specific polyurethane resin according to the present invention, those having an unsaturated group at the polymer terminal and in the main chain are also preferably used. By having an unsaturated group at the polymer terminal and in the main chain, the crosslinking reactivity between the polymerizable compound and the specific polyurethane resin or between specific polyurethane resins is increased to enhance the strength of the photocured product. As a result, when the specific polyurethane resin is used for a colored curable composition, a colored region having excellent strength can be obtained. Here, the unsaturated group preferably contains a carbon-carbon double bond since the crosslinking reaction can readily occur.

The method of introducing an unsaturated group into the polymer terminal includes the following method. That is, the unsaturated group may be introduced by using alcohols, amines, or the like having an unsaturated group at the time when the isocyanate group remaining at the polymer terminal in the synthesis of the polyurethane resin is treated with alcohols, amines, or the like. Specific examples of the compound include the same compounds as exemplified above for the monofunctional alcohol or monofunctional amine compound having an unsaturated group.

Further, the unsaturated group is more preferably introduced into the polymer side chain rather than into the polymer terminal, because the amount of the unsaturated group introduced can be easily controlled and can be increased and also, the crosslinking reaction efficiency is enhanced.

In view of formability of a crosslinked and cured film, the ethylenically unsaturated bond group introduced is preferably a methacryloyl group, an acryloyl group or a styryl group, more preferably a methacryloyl group, or an acryloyl group. Also, from the standpoint of satisfying both the formability of a crosslinked and cured film and the raw-stock storability, the ethylenically unsaturated bond group is still more preferably a methacryloyl group.

In addition, the amount of the methacryloyl group introduced is preferably 0.30 meq/g or more, and more preferably from 0.35 to 1.50 meq/g, as described above. That is, a most preferred embodiment of the binder polymer for use in the present invention is a polyurethane resin where a methacryloyl group is introduced into the side chain in the range from 0.35 to 1.50 meq/g.

The method of introducing an unsaturated group into the main chain includes a method of using a diol compound having an unsaturated group in the main chain direction for the synthesis of the polyurethane resin. Specific examples of the diol compound having an unsaturated group in the main chain direction include the following compounds:

cis-2-butene-1,4-diol, trans-2-butene-1,4-diol, polybutadiene diol, and the like.

In combination with the specific polyurethane resin according to the present invention, an alkali-soluble polymer containing a polyurethane resin differing in structure from the specific polyurethane resin may also be used. For example, the specific polyurethane resin can be used in combination with a polyurethane resin having an aromatic group in the main chain and/or side chain.

Next, the specific styrene-based resin which is another preferred embodiment of the present invention is described in detail below.

(Styrene-Based Resin Having Ethylenically Unsaturated Bond in Side Chain)

Examples of the specific styrene-based resin for use in the present invention include those having in the side chain thereof at least one of a styrenic double bond (styrene or an α-methylstyrene-based double bond) represented by the following general formula (23) or a vinylpyridinium group represented by the following general formula (24).

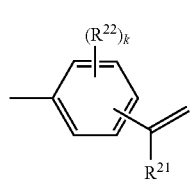

General Formula (23)

In the general formula (23), $R^{21}$ represents a hydrogen atom or a methyl group, $R^{22}$ represents an arbitrary atom or atomic group which can be substituted, and k represents an integer of 0 to 4.

Further, the styrenic double bond represented by the general formula (23) is linked to the polymer main chain through a single bond or a linking group containing an arbitrary atom or atomic group, and the manner of bonding is not particularly limited.

Preferred examples of the repeating unit of the polymer compound having the functional group represented by the general formula (23) are set forth below, but the present invention is not limited to these examples.

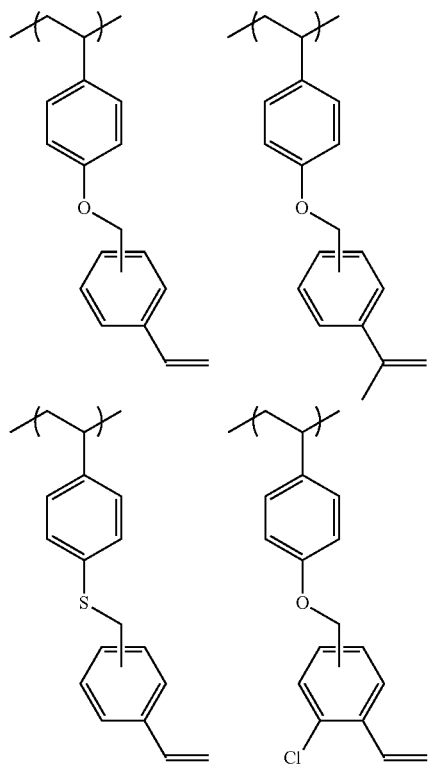

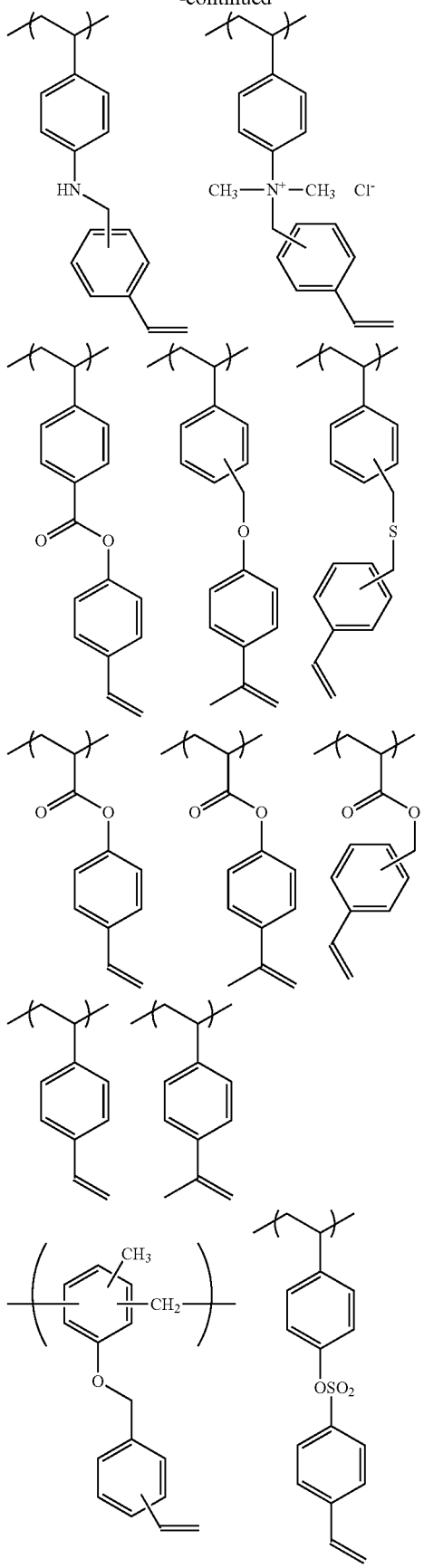

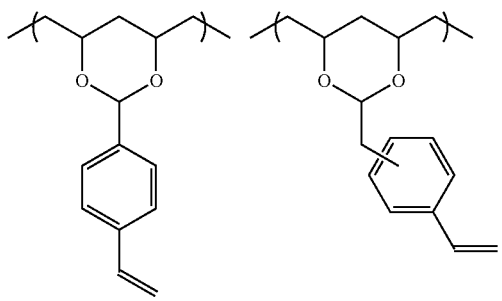
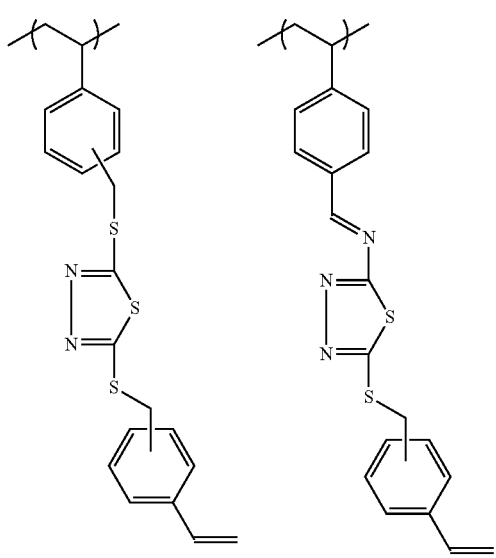
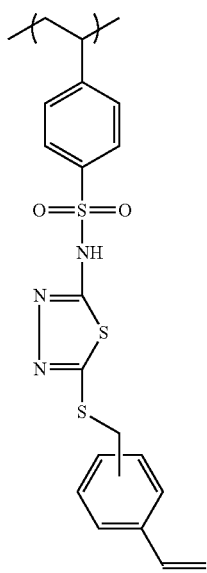
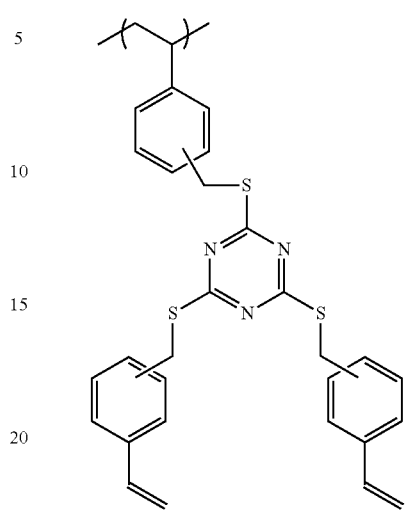
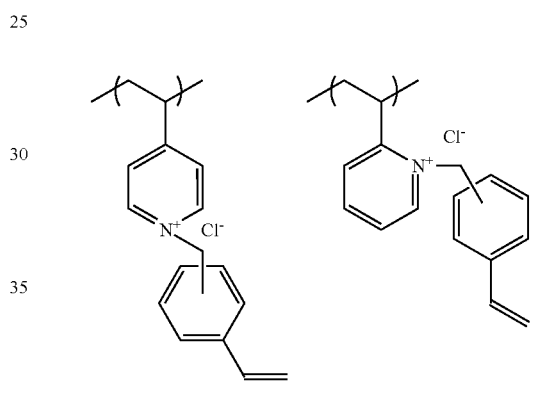
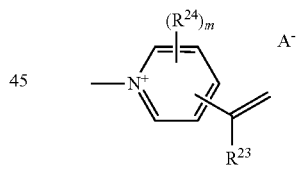

General Formula (24)

In the general formula (24), $R^{23}$ represents a hydrogen atom or a methyl group, $R^{24}$ represents an arbitrary atom or atomic group which can be substituted, m represents an integer of 0 to 4, and $A^-$ represents an anion. The pyridinium ring may take the form of benzopyridinium where a benzene ring is condensed as a substituent. In this case, a quinolium group and an isoquinolium group are included.

Further, the vinylpyridinium group represented by the general formula (24) is linked to the polymer main chain through a single bond or a linking group containing an arbitrary atom or atomic group, and the method of bonding is not particularly limited.

Preferred examples of the repeating unit of the polymer compound having the functional group represented by the general formula (24) are set forth below, but the present invention is not limited to these examples.

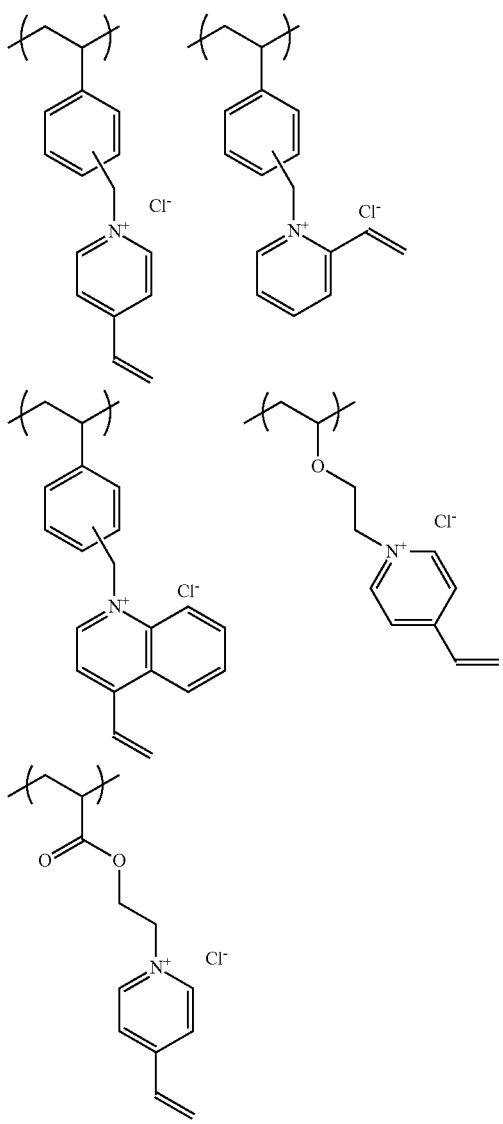

One of the methods for synthesizing the specific styrene-based resin according to the present invention is a method of copolymerizing monomers having a functional group represented by the general formula (23) or (24) and having a functional group copolymerizable with other copolymerization components, by using a known copolymerization method. The specific styrene-based resin may be a homopolymer having only one kind of a functional group belonging to one of the functional groups represented by the general formulae (23) and (24), or a copolymer having two or more kinds of functional groups belonging to either one or both of these functional groups.

In addition, the specific styrene-based resin may also be a copolymer with another copolymerization monomer without such a functional group. In this case, a carboxyl group-containing monomer is preferably selected as such another copolymerization monomer for the purpose of, for example, imparting solubility in an aqueous alkali solution to the polymer. Examples thereof include acrylic acid, methacrylic acid, 2-carboxyethyl acrylate, 2-carboxyethyl methacrylate, crotonic acid, maleic acid, fumaric acid, monoalkyl maleate, monoalkyl fumarate, 4-carboxystyrene, and the like.

A (multi-component) copolymer may also be synthesized by introducing another monomer component into the copolymer and such a copolymer is preferably used. As for the monomer which can be introduced into the copolymer in this case, various monomers including styrene derivatives such as styrene, 4-methylstyrene, 4-hydroxystyrene, 4-acetoxystyrene, 4-carboxystyrene, 4-aminostyrene, chloromethylstyrene, 4-methoxystyrene, and the like, vinylphosphonic acid, vinylsulfonic acid and a salt thereof, styrenesulfonic acid and a salt thereof, 4-vinylpyridine, 2-vinylpyridine, N-vinylimidazole, N-vinylcarbazole, 4-vinylbenzyltrimethylammonium chloride, a quaternized product of N-vinylimidazole by methyl chloride, 4-vinylbenzylpyridinium chloride, acrylonitrile, methacrylonitrile, phenylmaleimide, hydroxyphenylmaleimide, vinyl esters such as vinyl acetate, vinyl chloroacetate, vinyl propionate, vinyl butyrate, vinyl stearate, vinyl benzoate, and the like, vinyl ethers such as methyl vinyl ether, butyl vinyl ether, and the like, N-vinylpyrrolidone, acryloylmorpholine, vinyl chloride, vinylidene chloride, allyl alcohol, vinyltrimethoxysilane, and the like are appropriately used as a copolymerization monomer.

In the case of using such a copolymer as the specific styrene-based resin according to the present invention, the proportion of the repeating units having a functional group represented by the general formula (23) and/or the general formula (24) in the entire copolymer composition is preferably 20% by mass or more, more preferably 40% by mass or more. Within this range, the effect of the present invention is excellent to provide a highly-sensitive crosslinked system.

Furthermore, the specific styrene-based resin according to the present invention may change its property and becomes water-soluble when containing a quaternary salt structure in the repeating unit thereof. In the case where the colored curable composition of the present invention containing such a resin is used for formation of a colored region of a color filter, it can also be developed with water after exposure.

Particularly, when having the functional group represented by the general formula (23) in the repeating unit and having a quaternary salt structure in the linking group connecting the main chain and the functional group represented by the general formula (23) (for example, the specific examples above, and the like), the specific styrene-based resin may be a homopolymer having such a structure, but in other cases, the specific styrene-based resin is preferably a copolymer with another copolymerization monomer described below. For example, 4-vinylbenzyltrimethylammonium chloride, acryloyloxyethyltrimethylammonium chloride, methacryloyloxyethyltrimethylammonium chloride, a quaternized product of dimethylaminopropyl acrylamide by methyl chloride, a quaternized product of N-vinylimidazole by methyl chloride, 4-vinylbenzylpyridinium chloride, or the like is preferably used.

Also, in the case where the functional group represented by the general formula (24) is contained in the repeating unit, the specified styrene-based resin may be a homopolymer or a copolymer with the above-described another copolymerization monomer.

Also, in the case of a copolymer in which a carboxyl group is introduced, development with an aqueous alkali solution also becomes available. In any case, the proportion of the repeating unit having the functional group represented by the general formula (23) and/or the general formula (24) is preferably 20% by mass or more, and the introduction of a repeating unit other than these can be freely selected according to the purpose.

The molecular weight of the specific styrene-based resin according to the present invention is, in terms of the weight-average molecular weight, preferably from 10,000 to 300,000, more preferably from 15,000 to 200,000, and most preferably from 20,000 to 150,000. Particularly, in the case of using the colored curable composition of the present invention to form a colored region of a color filter, when the weight-average molecular weight is in the above-described range, the strength of the image area is excellent and the developability of the non-image area with an alkaline developer is excellent.

(a-3) The specific dispersion resin other than the specific polyurethane resin and specific styrene-based resin is described below.

Examples of the novolak resin having an ethylenically unsaturated group in the side chain include resins where an ethylenically unsaturated bond is introduced into the polymer described in JP-A No. 9-269596 by using the method described in JP-A No. 2002-62648, and the like.

Examples of the acetal resin having an ethylenically unsaturated bond in the side chain include resins described in JP-A No. 2002-162741, and the like.

Examples of the polyamide-based resin having an ethylenically unsaturated bond in the side chain include resins where an ethylenically unsaturated bond is introduced into the side chain of the resin described in Japanese Patent Application No. 2003-321022, or the polyamide resin cited therein, by using the method described in JP-A No. 2002-62648, and the like.

Examples of the polyimide resin having an ethylenically unsaturated bond in the side chain include resins where an ethylenically unsaturated bond is introduced into the side chain of the resin described in Japanese Patent Application No. 2003-339785, or the polyimide resin cited therein, by using the method described in JP-A No. 2002-62648, and the like.

(a-3) The specific dispersion resin has a function as a binder polymer, and is added and dispersed together with (a-1) the pigment when (A) the pigment dispersion is prepared, but the content thereof is from 2 to 70% by mass, more preferably from 4 to 50% by mass, and further more preferably from 5 to 40% by mass, based on the solid content of (A) the pigment dispersion.

When (A) the pigment dispersion is prepared in the present invention, various compounds may be added, in addition to the essential components of (a-1) to (a-3). Hereinbelow, optional components useful for the preparation of (A) the pigment dispersion will be described.

<Other Components that Can Be Added to Pigment Dispersion>

—Other Dispersants—

For the dispersion in the present invention, the dispersant other than the above-described specific dispersion resin can be used for the purpose of improving the dispersion stability and/or adjusting the developability.

As the other dispersants, for example, a well-known pigment dispersant or surfactant can be appropriately selected and used.

Specifically, a wide range of compounds can be used and examples of the dispersant include cationic surfactants such as Organosiloxane Polymer KP341 (manufactured by Shin-Etsu Chemical Co.), (meth)acrylate (co)polymer Polyflow No. 75, No. 90, and No. 95 (all manufactured by Kyoeisha Chemical Co., Ltd.), W001 (manufactured by Yusho Co., Ltd.), and the like; nonionic surfactants such as polyoxyethylene lauryl ether, polyoxyethylene stearyl ether, polyoxyethylene oleyl ether, polyoxyethylene octylphenyl ether, polyoxyethylene nonylacid phenyl ether, polyethylene glycol dilaurate, polyethylene glycol distearate, sorbitan fatty esters, and the like; anionic surfactants such as W004, W005, and W017 (all manufactured by Yusho Co., Ltd.), and the like; polymer dispersants such as EFKA-46, EFKA-47, EFKA-47EA, EFKA POLYMER 100, EFKA POLYMER 400, EFKA POLYMER 401, AND EFKA POLYMER 450 (all manufactured by Ciba Specialty Chemicals) and DISPERSE AID 6, DISPERSE AID 8, DISPERSE AID 15, AND DISPERSE AID 9100 (all manufactured by SAN NOPCO LTD.), and the like; various Solsperse dispersants such as SOLSPARSE 3000, 5000, 9000, 12000, 13240, 13940, 17000, 24000, 26000, and 28000 (all manufactured by The Lubrizol Corporation), and the like; and ADEKA PLURONIC L31, F38, L42, L44, L61, L64, F68, L72, P95, F77, P84, F87, P94, L101, P103, F108, L121, and P-123 (all manufactured by Asahi Denka Kogyo K.K.), ISONET S-20 (Sanyo Chemical Industries, Ltd.), and DISPERBYK 101, 103, 106, 108, 109, 111, 112, 116, 130, 140, 142, 162, 163, 164, 166, 167, 170, 171, 174, 176, 180, 182, 2000, 2001, 2050, and 2150 (all manufactured by BYK Chemie Japan), and the like. Other examples include oligomers or polymers having a polar group in the molecular terminal or in the side chain, such as acrylic copolymers and the like.

The content of the other dispersant in the pigment dispersion is preferably from 1 to 100 parts by mass, and more preferably from 3 to 70 parts by mass, based on 100 parts by mass of (a-1) the pigment as described above.

—Other Pigment Derivatives—

Pigment derivatives other than (a-2) the specific pigment derivative according to the present invention may be added, if necessary, to (A) the pigment dispersion in the present invention.

Use of other pigment derivatives is effective in constituting a color filter with excellent transparency and high contrast because the pigment derivatives having a portion having affinity with the dispersant or a polar group introduced thereinto can be adsorbed onto the surface of the pigment and used as adsorption sites for the dispersant so that the pigment can be dispersed as fine particles in the photocurable composition and prevented from being re-aggregated.

As other pigment derivatives, specifically, compounds having an organic pigment as a mother skeleton and having an acidic group, a basic group, or an aromatic group as a substituent introduced into the side chain therein can be mentioned. Specific examples of the organic pigment include a quinacridone-based pigment, a phthalocyanine-based pigment, an azo-based pigment, a quinophthalone-based pigment, an isoindoline-based pigment, an isoindolinone pigment, a quinoline pigment, a diketopyrrolopyrrole pigment and a benzoimidazolone pigment. Other pigment derivatives also include pale yellow aromatic polycyclic compounds such as compounds based on naphthalene, anthraquinone, triazine, quinoline, and the like, which are generally not called pigments. The pigment derivatives that can be used herein include those described in JP-A No. 11-49974, JP-A No. 11-189732, JP-A No. 10-245501, JP-A No. 2006-265528, JP-A No. 8-295810, JP-A No. 11-199796, JP-A No. 2005-234478, JP-A No. 2003-240938, JP-A No. 2001-356210, and the like.

The content of other pigment derivatives according to the present invention in the pigment dispersion is preferably from 0 to 30 parts by mass, and more preferably from 3 to 20 parts by mass, based on 100 parts by mass of the pigment. When the content is in this range, dispersion can be performed well with viscosity kept low and dispersion stability after dispersion can be improved to achieve excellent color property with high transmission, and when a color filter is prepared, the color filter can have high contrast with good color property.

<Preparation of (A) Pigment Dispersion>

Preparation of the pigment dispersion containing the components (a-1) to (a-3) and optional components can be carried out, for example, by mixing and dispersing (a-1) the pigment and (a-3) the specific dispersion resin with a homogenizer in advance and then finely dispersing the resulting dispersion with zirconia beads or the like in a beads dispersing machine (for example, DISPER MAT manufactured by GETZ-MANN) or the like. The dispersing time is preferably from about 3 to 6 hours. (a-2) The specific pigment derivative may be added in any step of forming the pigment dispersion, but is preferably added in the finely pulverizing step and/or at the time of finely dispersing the pigment.

(A) The pigment dispersion prepared in this manner is compounded with (B) the oxime ester initiator and (C) the polymerizable compound described later and with other components, whereby the colored curable composition of the present invention is obtained.

The amount of (A) the pigment dispersion contained in the colored curable composition of the present invention is preferably in a range from 5 to 90% by mass, and more preferably in a range from 25 to 85% by mass.

Furthermore, by incorporating (A) the pigment dispersion in this blending amount, the amount of (a-1) the pigment contained in the colored curable composition of the present invention comes to be preferably in a range from 25 to 65% by mass with respect to the total solid content, to enable a colored region having a sufficient hue to be formed even in a thin layer.

<(B) Oxime Ester Initiator>

When the colored curable composition of the present invention is used particularly in forming a thin film, the concentration of the pigment in a thin film is required to be increased as described above, and thus a radical-generating initiator cannot be added in a large amount. In addition, the concentration of the pigment is so high that the concentrations of a sensitizer and an initiator cannot be sufficiently increased, and thus the effect of the sensitizer on improvement of curing by a mechanism of initiation with electron transfer and energy transfer cannot be sufficiently obtained.

Particularly when the curable composition of the present invention is used in forming a high-definition, fine colored region such as in a solid-state imaging device, a triazine initiator that generates a halogen upon exposure may cause pollution of a light source such as a stepper exposure device and the like and is thus not usable though the triazine initiator is highly sensitive. Accordingly, under these conditions, an oxime compound compatible with a light source which emits light of 300 nm or more and decomposable directly by light is preferably used as the initiator. That is, the oxime ester initiator (hereinafter sometimes referred to as an oxime initiator) is preferably used. Particularly, the oxime initiator is used more effectively in the composition with a lower proportion of polymerizable components, wherein the pigment is contained in an amount of 30% by mass or more, and particularly 40% by mass or more, with respect to the total solid content of the curable composition.

Any oxime compound can be used as the initiator in the present invention as long as it is a compound having a [—C=N—O—] bond in the molecule. Preferable examples of the oxime compound include compounds represented by the following general formulae (I) and (II).

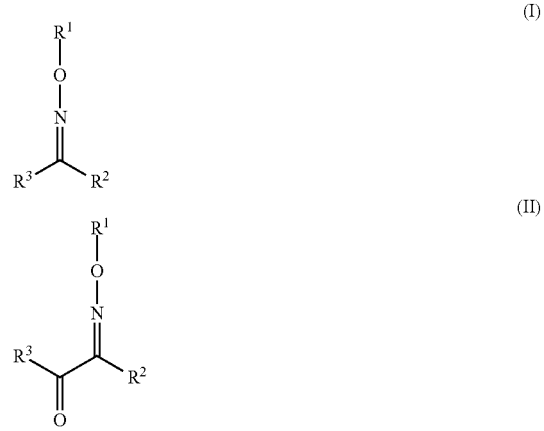

In the general formulae (I) and (II), $R^1$ is a monovalent organic group, which is preferably an organic group having a carbonyl group or a sulfo group in the structure, and from the viewpoint of sensitivity and stability, $R^1$ is preferably a monovalent organic group represented by the following general formula (III) or (IV).

In the general formulae (III) and (IV), $R^4$ represents a monovalent organic group, and is specifically preferably an alkyl group, an alkenyl group, an alkynyl group, a cycloalkyl group, a cycloalkenyl group, a cycloalkynyl group, an aryl group, a heterocyclic group, or an alkoxy group, each of which has 1 to 20 carbon atoms.

These organic groups may have a substituent, and examples of the substituent that can be introduced include a halogen atom, a hydroxyl group, an alkyl group, an alkenyl group, an alkynyl group, a cycloalkyl group, a cycloalkenyl group, a cycloalkynyl group, an aryl group, a heterocyclic group, a cyano group, an alkoxy group, an aryloxy group, a thioalkoxy group, a thioaryloxy group, a carboxyl group, an alkoxycarbonyl group, a sulfo group, a sulfonamide group, a urea group, a thiourea group, an amino group, an amide group, a carbonyl group, a nitro group, and substituents having these groups.

Among these, from the viewpoints of stability over time, sensitivity, and productivity, $R^1$ is most preferably a substituent represented by the general formula (III), wherein $R^4$ is an alkyl group or an aryl group.

In the general formulae (I) and (II), $R^2$ represents a hydrogen atom or a monovalent organic group, and when $R^2$ represents a monovalent organic group, examples of the organic group include an alkyl group, an alkenyl group, an alkynyl group, a cycloalkyl group, a cycloalkenyl group, a cycloalkynyl group, an aryl group, a heterocyclic group, an alkoxy group, and the like, each of which has 1 to 20 carbon atoms.

These organic groups may have a substituent, and the examples of the substituent that can be introduced include a halogen atom, a hydroxyl group, an alkyl group, an alkenyl group, an alkynyl group, a cycloalkyl group, a cycloalkenyl group, a cycloalkynyl group, a cyano group, an aryl group, a heterocyclic group, an alkoxy group, an aryloxy group, a thioalkoxy group, a thioaryloxy group, a carboxyl group, an alkoxycarbonyl group, a sulfo group, a sulfonamide group, a urea group, a thiourea group, an amino group, an amide group, a carbonyl group, a nitro group, and substituents having these groups.

$R^3$ represents a monovalent organic group, and examples thereof include an alkyl group, an alkenyl group, an alkynyl group, a cycloalkyl group, a cycloalkenyl group, a cycloalkynyl group, an aryl group, a heterocyclic group, and an alkoxy group, each of which has 1 to 20 carbon atoms.

These organic groups may have a substituent, and examples of the introducible substituent include a halogen atom, a hydroxyl group, an alkyl group, an alkenyl group, an alkynyl group, a cycloalkyl group, a cycloalkenyl group, a cycloalkynyl group, an aryl group, a cyano group, a heterocyclic group, an alkoxy group, an aryloxy group, a thioalkoxy group, a thioaryloxy group, a carboxyl group, an alkoxycarbonyl group, a sulfo group, a sulfonamide group, a urea group, a thiourea group, an amino group, an amide group, a carbonyl group, a nitro group, and substituents having these groups.

Among these, from the viewpoint of sensitivity, $R^3$ is preferably an aryl group or a heterocyclic group out of those mentioned above. When $R^3$ is an aryl group, the aryl group is preferably substituted by a substituent having a nitrogen atom or a sulfur atom, and when $R^3$ is a heterocyclic group, the heterocyclic group preferably contains a nitrogen atom, an oxygen atom, or a sulfur atom.

Specific examples of (B) the oxime initiator used preferably in the present invention are shown below, but the present invention is not limited thereto.

(OS-1)

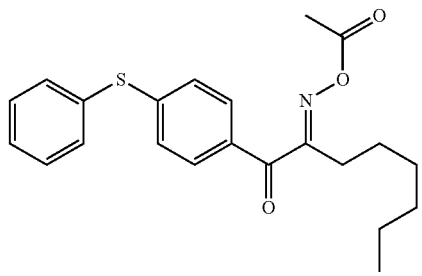

(OS-2)

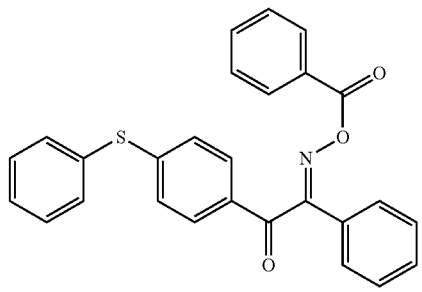

(OS-3)

(OS-4)

(OS-5)

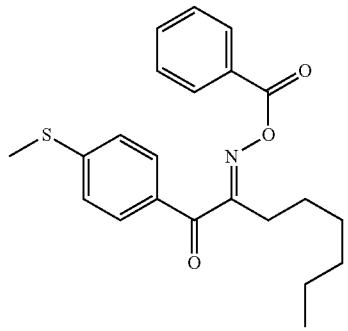

(OS-6)

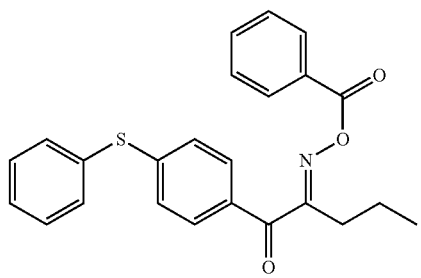

(OS-7)

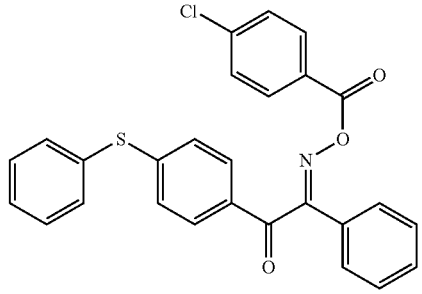

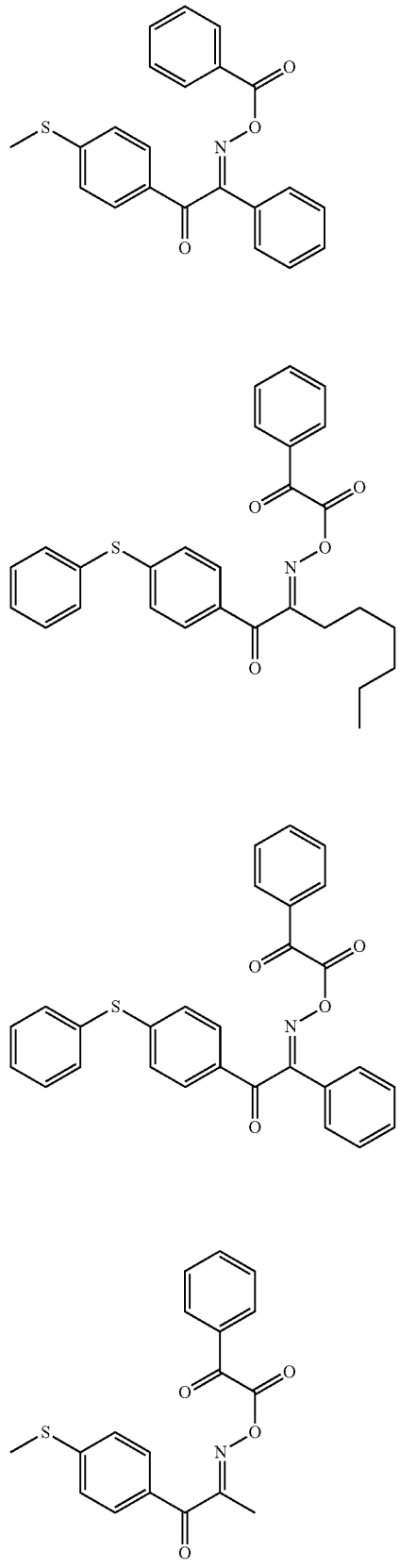

(OS-17)
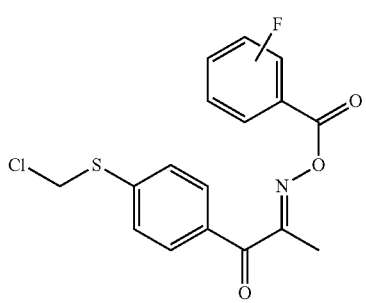
(OS-18)
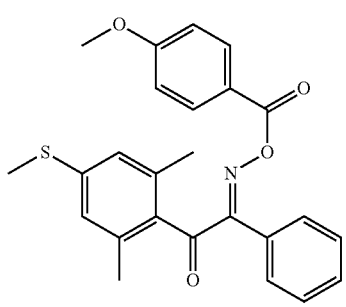
(OS-19)
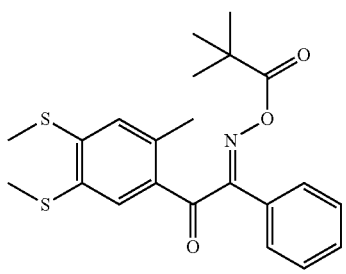
(OS-20)
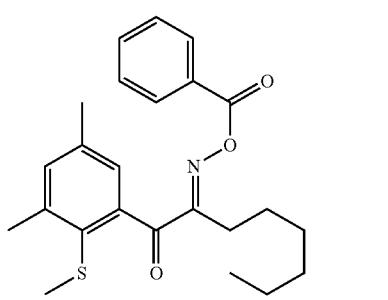
(OS-21)
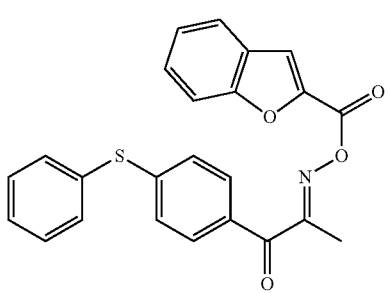
(OS-22)
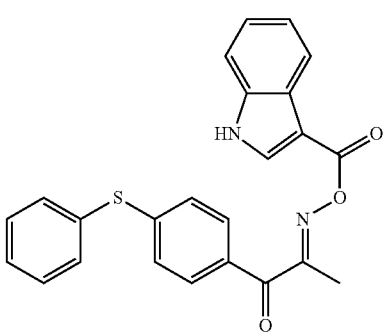
(OS-23)
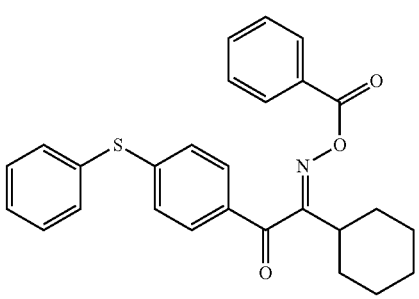
(OS-24)
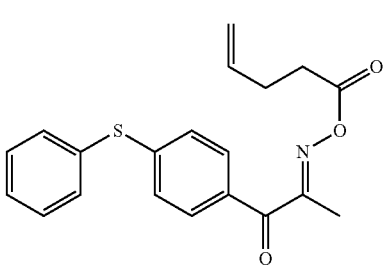
(OS-26)
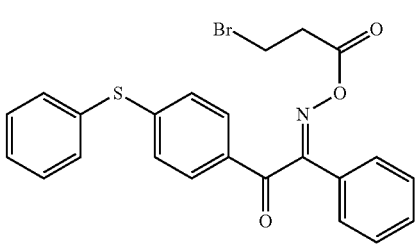
(OS-27)
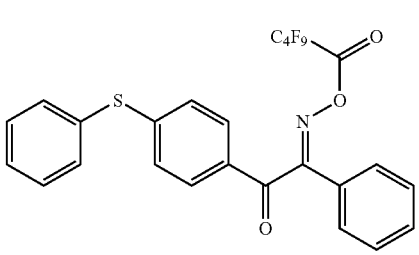

(OS-28)
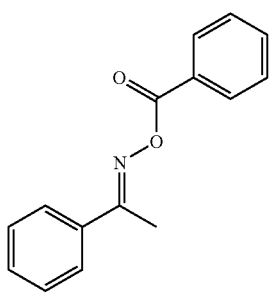
(OS-29)
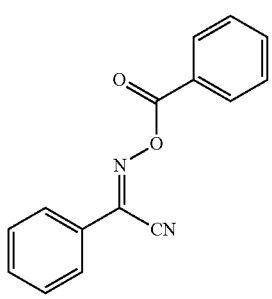
(OS-30)
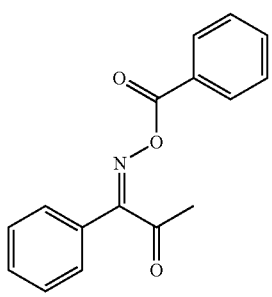
(OS-31)
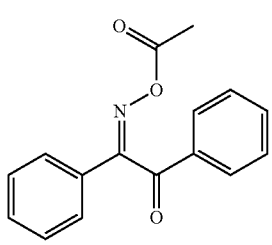
(OS-32)
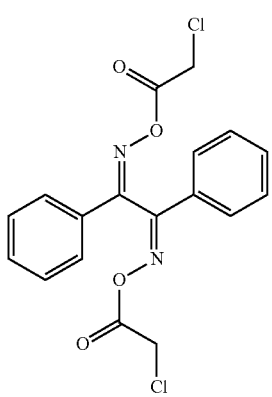
(OS-33)
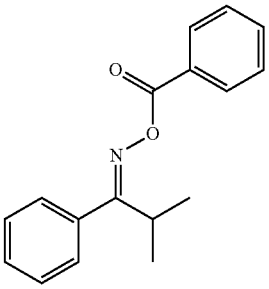
(OS-34)
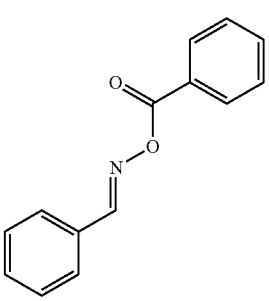
(OS-35)
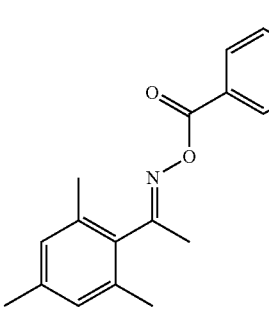
(OS-36)
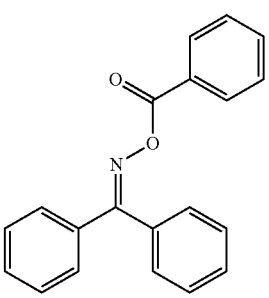
(OS-37)
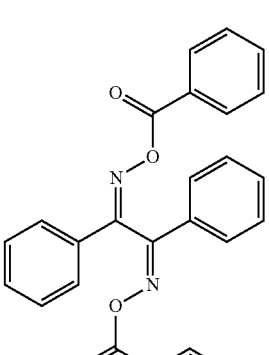

(OS-38)
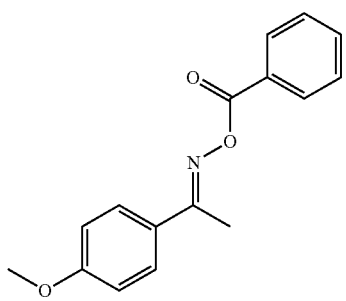
(OS-39)
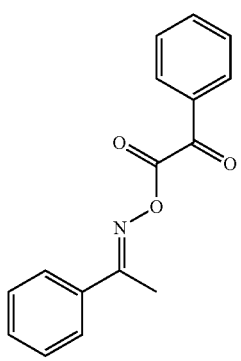
(OS-40)
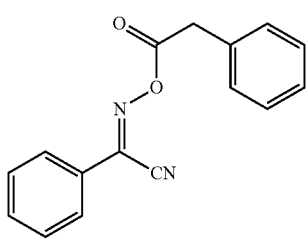
(OS-41)
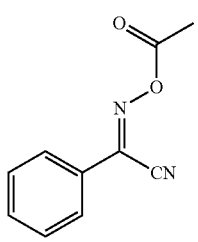
(OS-42)
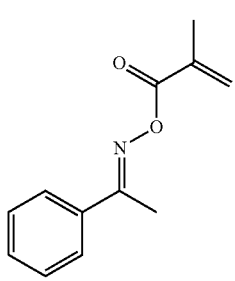
(OS-43)
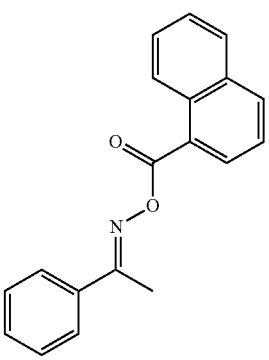
(OS-44)
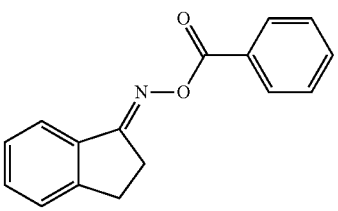
(OS-45)
(OS-46)
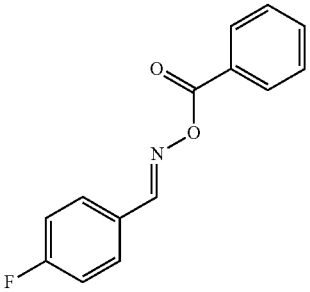
(OS-47)
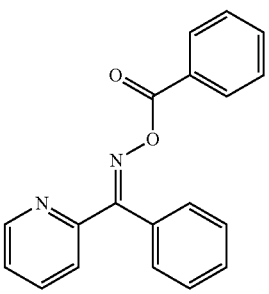

(OS-48)
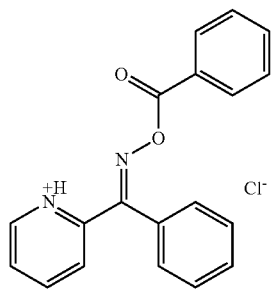
(OS-49)
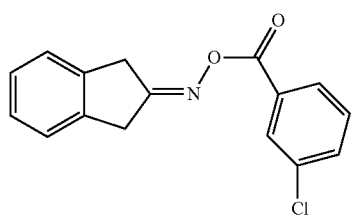
(OS-50)
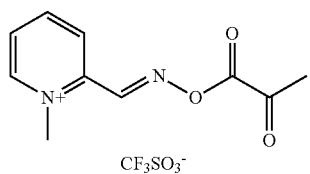
(OS-51)
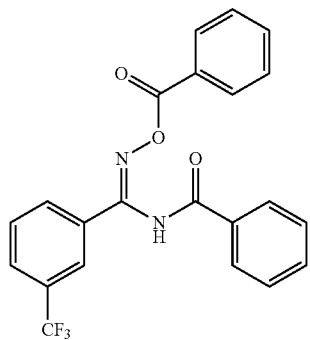
(OS-52)
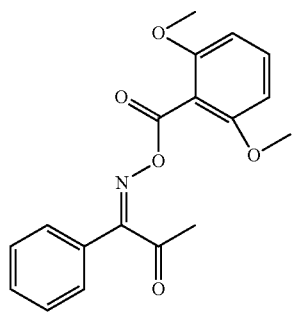
(OS-53)
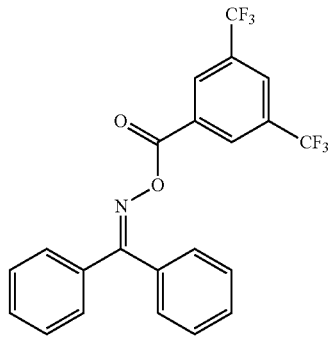
(OS-54)
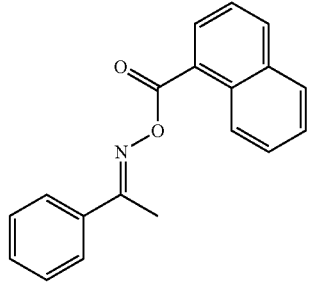
(OS-55)
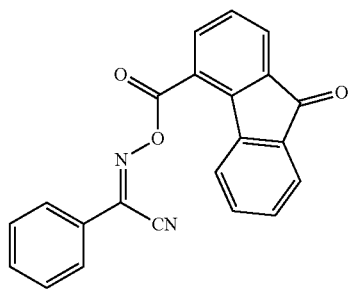
(OS-56)
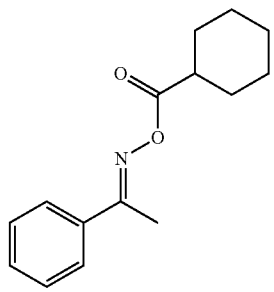
(OS-57)
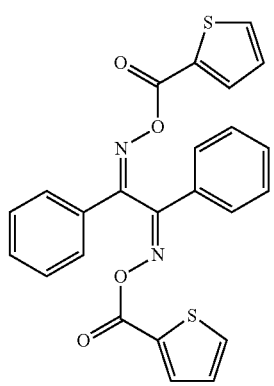

(OS-58)
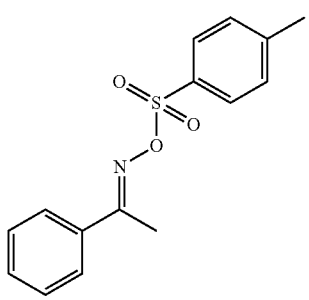
(OS-59)
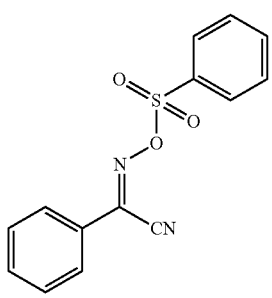
(OS-60)
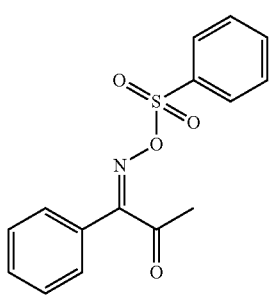
(OS-61)
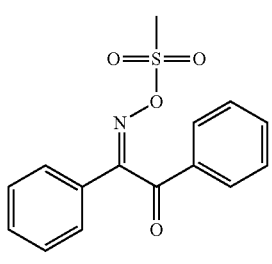
(OS-62)
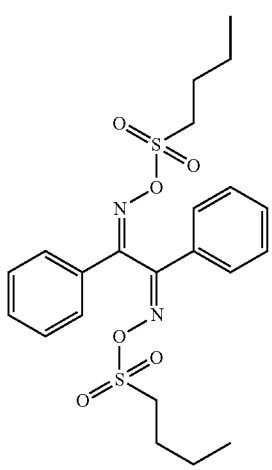
(OS-63)
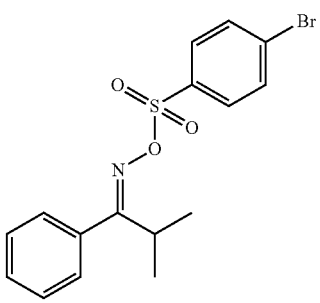
(OS-64)
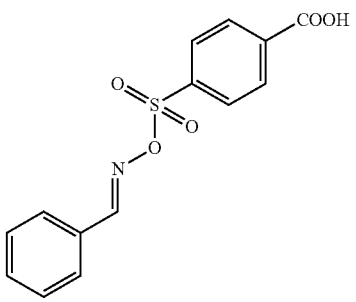
(OS-65)
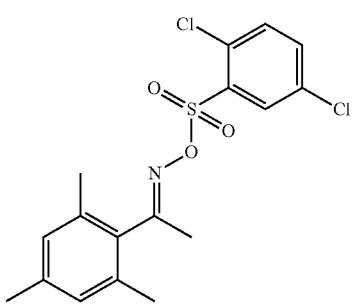
(OS-66)
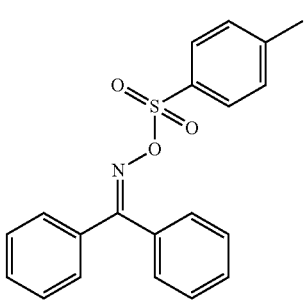
(OS-67)
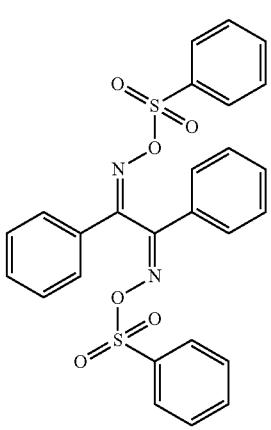

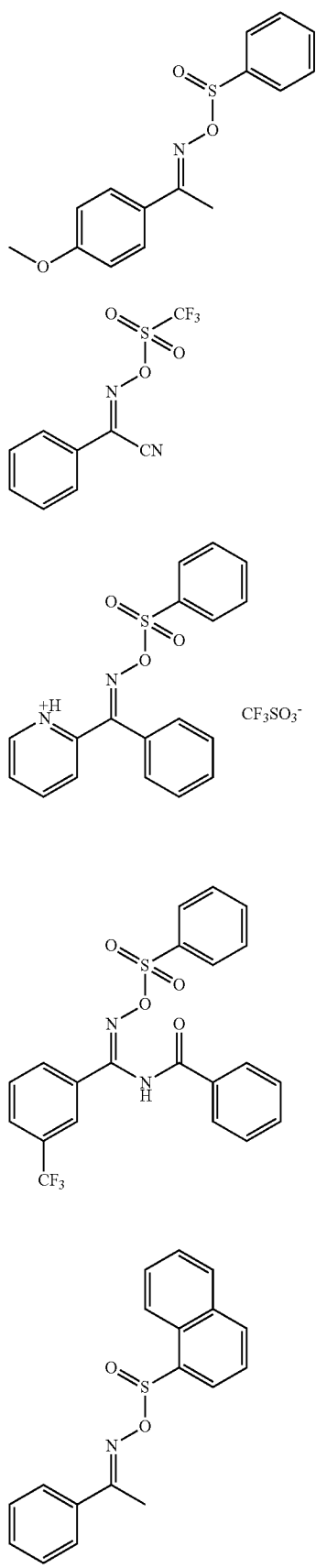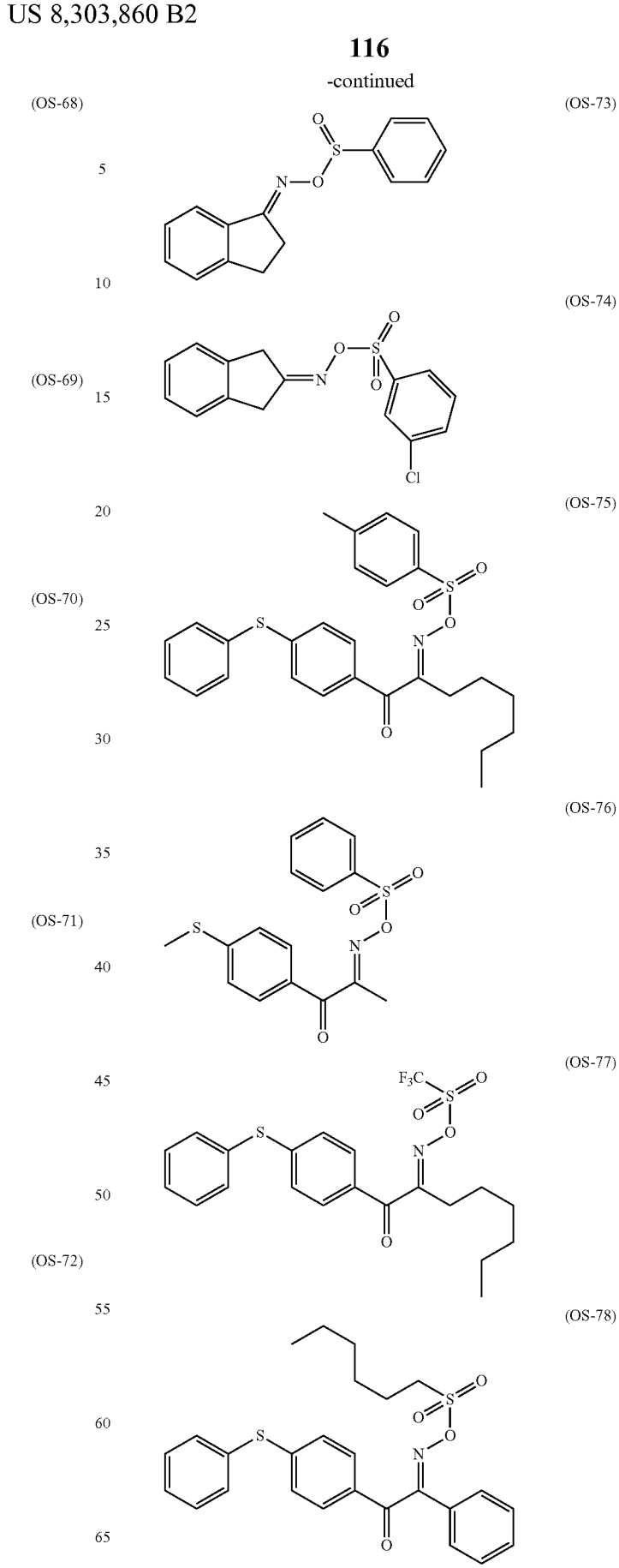

117
-continued
(OS-79)
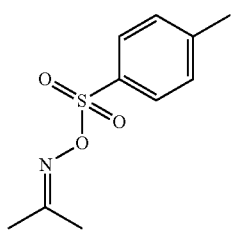
(OS-80)
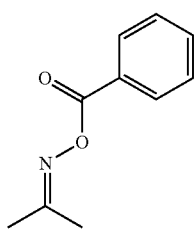
(OS-81)
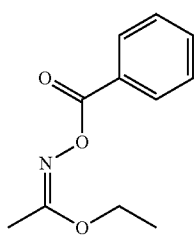
(OS-82)
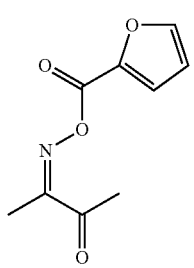
(OS-83)
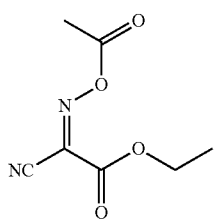
(OS-84)
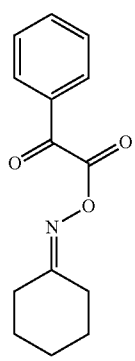
118
-continued
(OS-85)
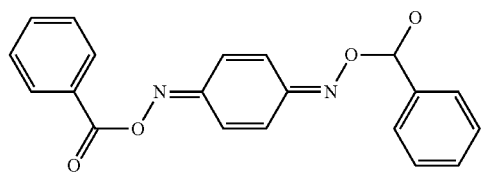
(OS-86)
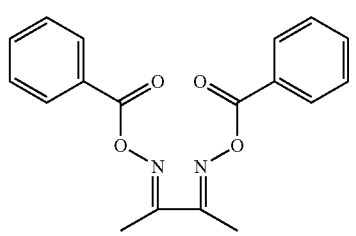
(OS-87)
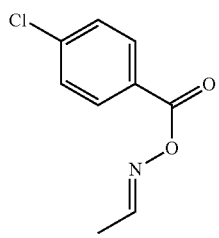
(OS-88)
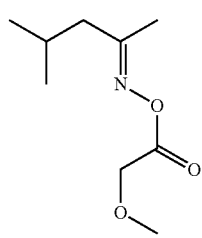
(OS-89)
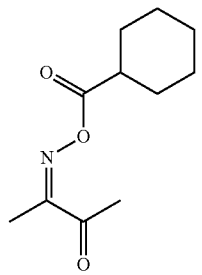
(OS-90)
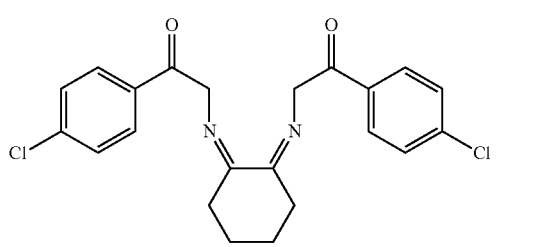

119
-continued
(OS-91)
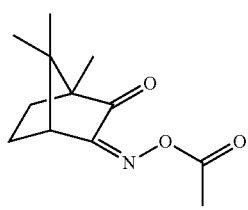
(OS-92)
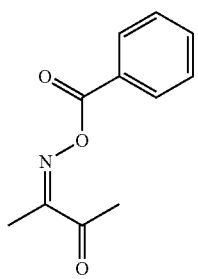
(OS-93)
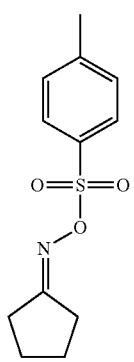
(OS-94)
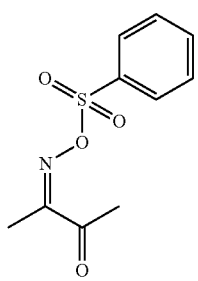
(OS-95)
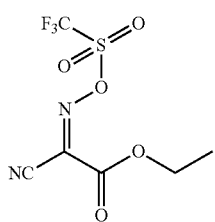
120
-continued
(OS-96)
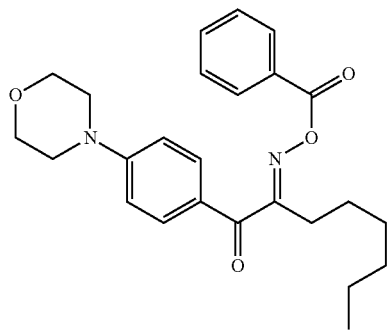
(OS-97)
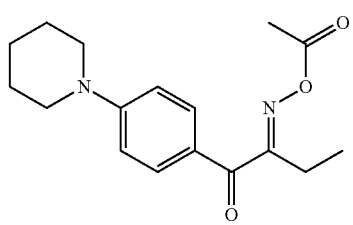
(OS-98)
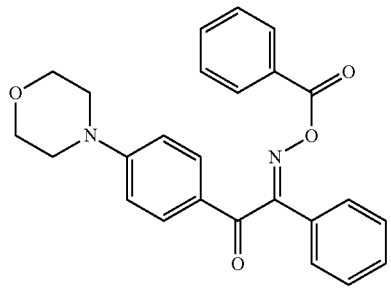
(OS-99)
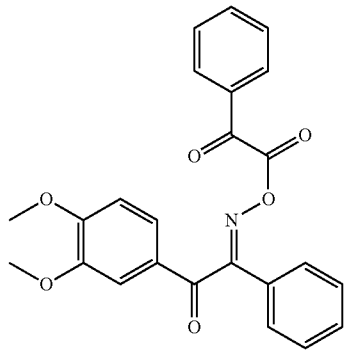
(OS-100)
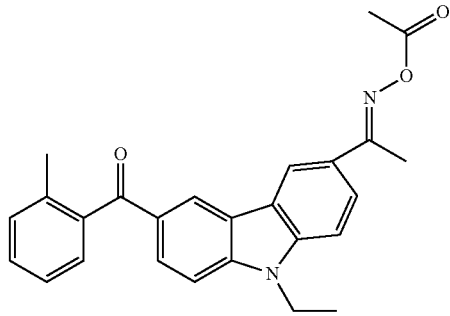

-continued
(OS-101)
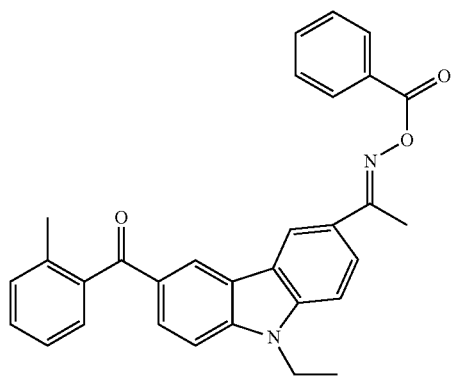
(OS-102)
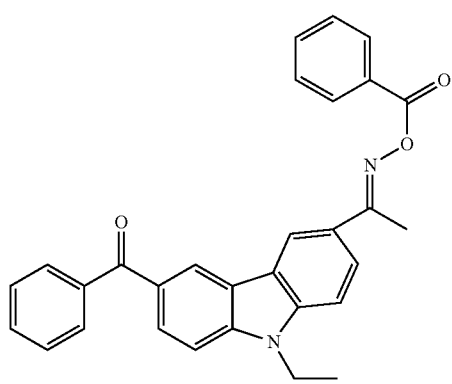
(OS-103)
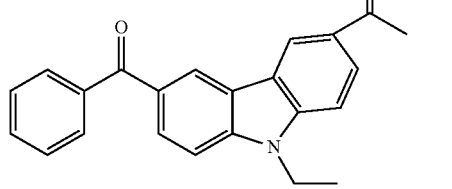
(OS-104)
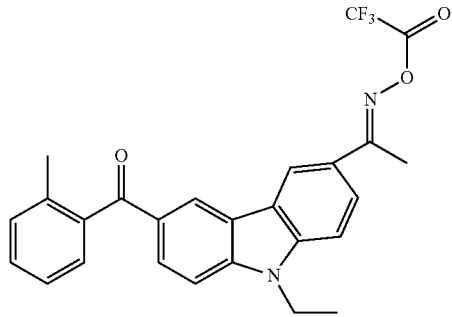
(OS-105)
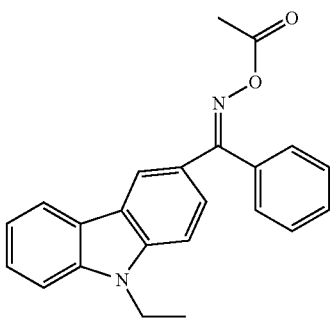
(OS-106)
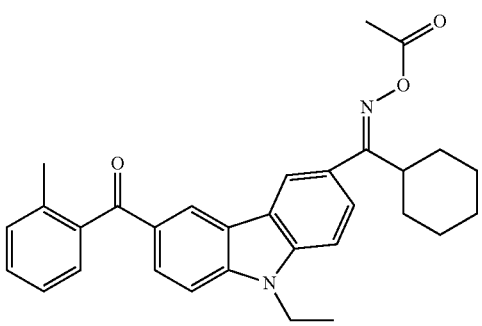
(OS-107)
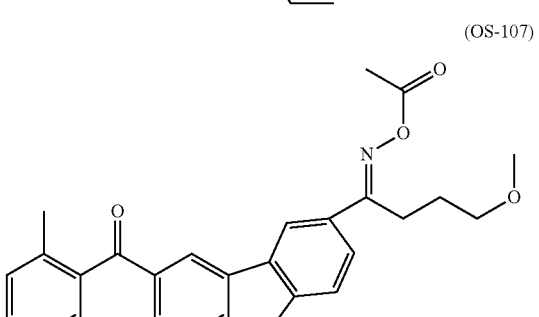
(OS-108)
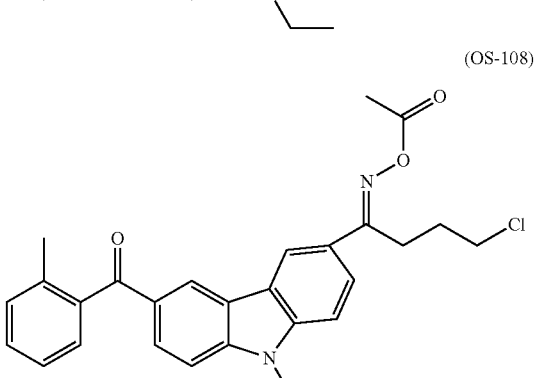
(OS-109)
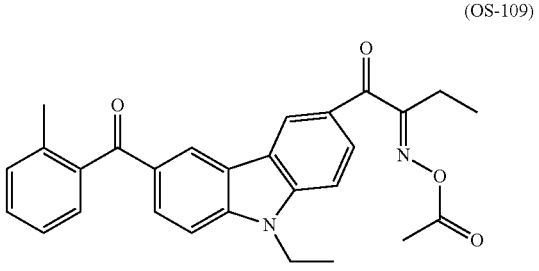

-continued

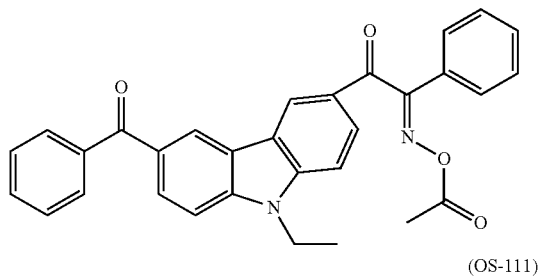
(OS-110)

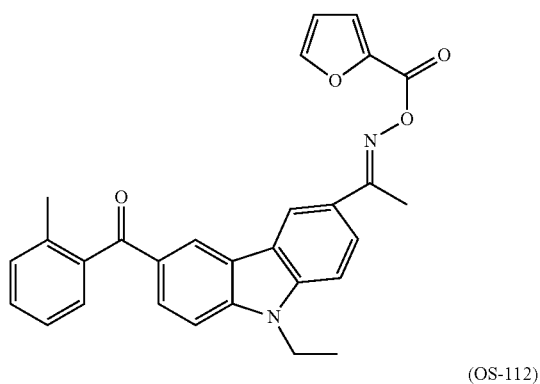
(OS-111)

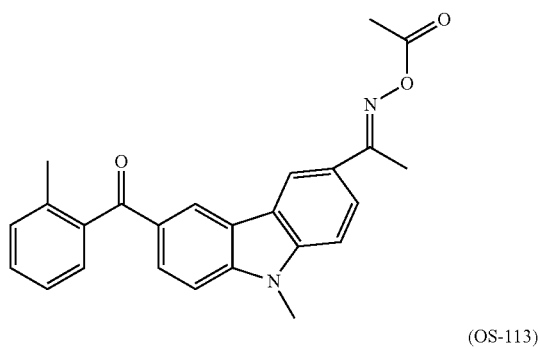
(OS-112)

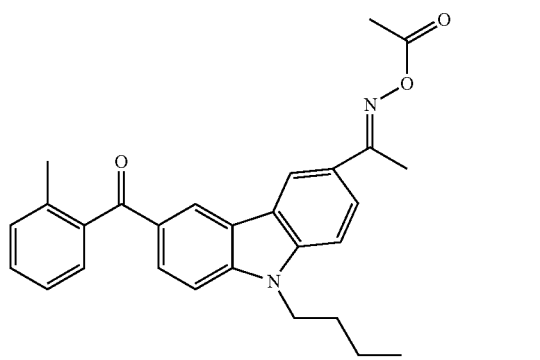
(OS-113)

Preferable among these compounds are those compounds of the general formula (I) or (II) wherein $R^3$ is an aryl group substituted with a sulfur atom-containing substituent, or a nitrogen-containing aromatic ring, and $R^1$ is an aryl group or an alkyl group. The most preferable compounds are those of the general formula (II) wherein $R^3$ is a nitrogen-containing aromatic ring, and $R^1$ is an alkyl group having 1 to 3 carbon atoms.

The content of (B) the oxime initiator in the colored curable composition of the present invention is preferably in a range from 0.3 to 30% by mass, and more preferably in a range from 1 to 20% by mass, based on the total solid content of the composition.

(B) The oxime initiator is so highly sensitive that the initiator, even in the above blending amount in the colored curable composition of the present invention containing a large amount of the pigment, enables formation of an excellent cured film.

<(C) Polymerizable Compound>

In the present invention, (C) the polymerizable compound is used as a curing component together with (B) the oxime initiator. As the polymerizable compound that can be used in the present invention, the general radical-polymerizable compounds are described, and compounds known widely in the art as compounds having an ethylenically unsaturated double bond can be used without particular limitation. They have chemical forms of a monomer, a prepolymer, that is, a dimer, a trimer or an oligomer, a mixture thereof, a copolymer thereof, and the like, for example.

Examples of the monomer and the copolymer thereof include unsaturated carboxylic acids (for example, acrylic acid, methacrylic acid, itaconic acid, crotonic acid, isocrotonic acid, maleic acid, and the like), esters thereof and amides thereof. Preferably, esters of an unsaturated carboxylic acid and an aliphatic polyhydric alcohol compound, or amides of an unsaturated carboxylic acid and an aliphatic poly-amine compound may be used. Moreover, an addition reaction product of unsaturated carboxylic acid esters or amides having a nucleophilic substituent such as a hydroxyl group, an amino group, a mercapto group, and the like, and monofunctional or polyfunctional isocyanates or epoxys, or dehydration condensation reaction products with a monofunctional or polyfunctional carboxylic acid, or the like may also be used preferably. Moreover, addition reaction products of unsaturated carboxylic acid esters or amides having an electrophilic substituent such as an isocyanate group, an epoxy group, and the like, and monofunctional or polyfunctional alcohols, amines or thiols, and further, substitution reaction products of unsaturated carboxylic acid esters or amides having a leaving substituent such as a halogen group, a tosyloxy group, and the like, and monofunctional or polyfunctional alcohols, amines, or thiols are also preferable. Further, as another example, it is possible to use a compound group in which the unsaturated carboxylic acid described above is displaced by unsaturated phosphonic acid, styrene, vinyl ether, or the like.

Specific examples of the ester monomers of aliphatic polyhydric alcohol compounds and unsaturated carboxylic acids include:

acrylic esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and the like, as well as EO-modified products and PO-modified products thereof;

methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl]dimethyl methane, bis[p-(methacryloxyethoxy)phenyl]dimethyl methane, and the like, as well as EO-modified products and PO-modified products thereof;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the like; crotonic acid esters such as ethylene glycol dicrotonate, tetramethylene glycol dicrotonate, pentaerythritol dicrotonate, sorbitol tetradicrotonate, and the like; isocrotonic acid esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sorbitol tetramaleate, and the like.

As examples of other esters, aliphatic alcohol esters described in Japanese Patent Application Publication (JP-B) No. 51-47334 and JP-A No. 57-196231, those having an aromatic skeleton described in JP-A No. 59-5240, JP-A No. 59-5241, and JP-A No. 2-226149, those having an amino group described in JP-A No. 1-165613, and the like are preferably used. Further, a mixture of such ester monomers may also be used.

Moreover, specific examples of monomers of the amides of aliphatic polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like. Preferable examples of other amide-based monomers include those having a cyclohexylene structure described in JP-B No. 54-21726.

In addition, urethane addition-polymerizable compounds produced by use of an addition reaction between isocyanate and a hydroxyl group are also preferable, and typical examples thereof include the vinylurethane compounds containing two or more polymerizable vinyl groups in one molecule which are prepared by addition-reacting a hydroxyl group-containing vinyl monomer represented by the following general formula (E) to a polyisocyanate compound having two or more isocyanate groups in one molecule, which are described in JP-B No. 48-41708, and the like.

(wherein $R^4$ and $R^5$ each represent H or $CH_3$)

Furthermore, urethane acrylates as described in JP-A No. 51-37193, and JP-B Nos. 2-32293 and 2-16765 and urethane compounds having an ethylene oxide skeleton as described in JP-B Nos. 58-49860, 56-17654, 62-39417, and 62-39418 are also suitably used. Also, when an addition-polymerizable compound having an amino structure or a sulfide structure in the molecule like those described in JP-A No. 63-277653, JP-A No. 63-260909, and JP-A No. 1-105238 is used, a curable composition that is considerably excellent in the photoreacton speed can be obtained.

Other examples thereof include polyfunctional acrylates and methacrylates such as polyester acrylates described in each publication of JP-A No. 48-64183, JP-B No. 49-43191 and JP-B 52-30490, epoxy acrylates obtained by reacting an epoxy resin with (meth)acrylic acid, and the like. Further, specific unsaturated compounds described in JP-B No. 46-43946, JP-B No. 1-40337, and JP-B No. 1-40336, vinyl phosphonic acid compounds described in JP-A No. 2-25493, and the like can also be included. In addition, in some cases, a structure containing a perfluoroalkyl group described in JP-A No. 61-22048 is preferably used. Photocurable monomers and oligomers described in the Journal of Japanese Adhesive Society, vol. 20, No. 7, pages 300 to 308 (1984) can also be used.

From the viewpoint of curing sensitivity, the polymerizable compound in the present invention preferably contains two or more ethylenically unsaturated bonds, and more preferably three or more ethylenically unsaturated bonds in one molecule. Particularly, the polymerizable compound preferably has two or more, more preferably three or more and most preferably four or more (meth)acrylate ester structures. From the viewpoints of curing sensitivity and developability in an unexposed portion, the polymerizable compound preferably contains an EO-modified product. Further, from the viewpoints of curing sensitivity and strength of an exposed portion, the polymerizable compound preferably contains a urethane bond.

From the above-described viewpoints, preferable examples of the polymerizable compounds include bisphenol A diacrylate, an EO-modified product of bisphenol A diacrylate, trimethylolpropane triacrylate, trimethylolpropane tri (acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, an EO-modified product of pentaerythritol tetraacrylate, an EO-modified product of dipentaerythritol hexaacrylate, and the like. Preferable commercially available products of the copolymerizable compounds include URETHANE OLIGOMER UAS-10 and UAB-140 (all manufactured by Sanyo Kokusaku Pulp Co., Ltd.), DPHA-40H (manufactured by Nippon Kayaku Co., Ltd.), UA-306H, UA-306T, UA-306I, AH-600, T-600, and AI-600 (all manufactured by Kyoeisha Chemical Co., Ltd.).

Among these, more preferred are an EO-modified product of bisphenol A diacrylate, pentaerythritol triacrylate, pentaerythritol tetraacrylate, dipentaerythritol pentaacrylate, dipentaerythritol hexaacrylate, tri(acryloyloxyethyl)isocyanurate, an EO-modified product of pentaerythritol tetraacrylate, an EO-modified product of dipentaerythritol hexaacrylate, and the like, and commercially available products such as DPHA-40H (manufactured by Nippon Kayaku Co., Ltd.), UA-306H, UA-306T, UA-306I, AH-600, T-600, and AI-600 (all manufactured by Kyoeisha Chemical Co., Ltd.).

Further, acid group-containing ethylenically unsaturated compounds are also preferable and include commercially available products such as TO-756 that is a carboxyl group-containing trifunctional acrylate and TO-1382 that is a carboxyl group-containing pentafunctional acrylate, both of which are manufactured by Toagosei Co., Ltd., and the like.

(C) The polymerizable compounds may be used singly or in a combination of two or more kinds thereof.

The content of (C) the polymerizable compound in the colored curable composition of the present invention is preferably in a range from 4 to 80% by mass, and more preferably in a range from 7 to 50% by mass, in terms of the solid content.

Particularly, when a cured film of 0.8 µm or less in thickness is to be formed, the content of (C) the polymerizable compound is effective in a range from 7 to 40% by mass, and particularly in a range from 6 to 25% by mass, based on the total solid content.

Depending on the purpose, various additives may be used in addition to the components (A) to (C) in the colored curable composition of the present invention unless the effect of the present invention is impaired.

Hereinafter, optional components that may be contained in the colored curable composition of the present invention will be described.

<Binder Polymer>

For the purpose of improving the film coating property, regulating developability and the like, a binder polymer may further be used, if necessary, in the curable composition of the present invention.

As the binder, a linear organic polymer is preferably used. This "linear organic polymer" used may be any known linear organic polymer. Preferably, a linear organic polymer soluble or swellable in water or weakly alkaline water for enabling development in water or development in weakly alkaline water is selected. The linear organic polymer is selected not only as a coating film-forming agent but also depending on use of a water, weakly alkaline water, or an organic solvent developing agent. For example, water development is feasible when a water-soluble organic polymer is used. Examples of such linear organic polymers include radical polymers having a carboxylic acid group in the side chain, such as those described in, for example, JP-A No. 59-44615, JP-B No. 54-34327, JP-B No. 58-12577, JP-B No. 54-25957, JP-A No. 54-92723, JP-A No. 59-53836, and JP-A No. 59-71048, that is, a resin obtained by homopolymerization or copolymerization of a monomer having a carboxyl group, a resin obtained by homopolymerization or copolymerization of a monomer having an acid anhydride and then hydrolyzing, half-esterifying or half-amidating the acid anhydride unit, epoxy acrylate obtained by modifying epoxy resin with unsaturated monocarboxylic acid and acid anhydride, and the like. Examples of the monomer having a carboxyl group include acrylic acid, methacrylic acid, itaconic acid, crotonic acid, maleic acid, fumaric acid, 4-carboxystyrene, and the like, and examples of the monomer having an acid anhydride include maleic anhydride, and the like.

Further, similarly, there are acidic cellulose derivatives having a carboxylic acid group in the side chain. Besides, examples obtained by adding a cyclic acid anhydride to polymer having a hydroxyl group, and the like are useful.

In the case where an alkali-soluble resin that is a copolymer is used, the compound to be copolymerized in the resin may be a monomer other than the above-described monomers. Examples of the other monomers include the compounds listed in (1) to (12) below.

(1) acrylic esters and methacrylic acid esters having an aliphatic hydroxyl group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, 4-hydroxybutyl methacrylate, and the like;

(2) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, propargyl acrylate, and the like;

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, propargyl methacrylate, and the like;

(4) acrylamides and methacrylamides such as acrylamide, methacrylamide, N-methylolacrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide, allyl methacrylamide, and the like;

(5) vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, and the like;

(6) vinyl esters such as vinyl acetate, vinyl chloroacetate, vinyl butylate, vinyl benzoate, and the like;

(7) styrenes such as styrene, α-methylstyrene, methylstyrene, chloromethylstyrene, p-acetoxystyrene, and the like;

(8) vinyl ketones such as methyl vinyl ketone, ethyl vinyl ketone, propyl vinyl ketone, phenyl vinyl ketone, and the like;

(9) olefins such as ethylene, propylene, isobutylene, butadiene, isoprene, and the like;

(10) N-vinylpyrrolidone, acrylonitrile, methacrylonitrile, and the like;

(11) unsaturated imides such as maleimide, N-acryloyl acrylamide, N-acetyl methacrylamide, N-propionyl methacrylamide, N-(p-chlorobenzoyl)methacrylamide, and the like; and

(12) methacrylate monomers having a heteroatom in the a position, examples thereof include compounds described in Japanese Patent Application No. 2001-115595, Japanese Patent Application No. 2001-115598, and the like.

Among these, preferable are (meth)acrylic resins having in the side chain thereof an allyl group or a vinyl ester group and a carboxyl group, alkali-soluble resins having in the side chain thereof a double bond described in JP-A No. 2000-187322 and JP-A No. 2002-62698, and alkali-soluble resins having in the side chain thereof an amide group described in JP-A No. 2001-242612, from the viewpoints of excellent balance among film formability, sensitivity, and developability.

Furthermore, urethane based binder polymers containing an acid group as described in JP-B No. 7-12004, JP-B No. 7-120041, JP-B No. 7-120042, JP-B No. 8-12424, JP-A No. 63-287944, JP-A No. 63-287947, JP-A No. 1-271741, Japanese Patent Application No. 10-116232, and the like, and urethane based binder polymers containing an acid group and a double bond in the side chain as described in JP-A No. 2002-107918 are excellent in strength and thus advantageous in respect of printing durability and low-exposure suitability.

Further, acetal-modified polyvinyl alcohol based binder polymers having an acid group as described in European Patent (EP) No. 993966, EP No. 1204000, JP-A No. 2001-318463, and the like are preferable owing to excellence in the balance between film strength and developability.

As other water-soluble linear organic polymers, polyvinyl pyrrolidone, polyethylene oxide, or the like is useful. To increase the strength of the cured film, alcohol-soluble nylon, polyethers of 2,2-bis-(4-hydroxyphenyl)-propane and epichlorohydrin, and the like are also useful.

The weight-average molecular weight of the binder polymer used in the present invention is preferably 3,000 or more, and more preferably in a range from 5,000 to 300,000; and the number-average molecular weight thereof is preferably 1,000 or more, and more preferably in a range from 2,000 to 250,000. Polydispersity (weight-average molecular weight/number-average molecular weight) is preferably 1 or more, and more preferably in a range from 1.1 to 10.

The binder polymer may be any one of a random polymer, a block polymer, a graft polymer, and the like.

The binder polymer used in the present invention can be synthesized in a method known in the art. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, water, and the like. Only one solvent may be used, or a mixture of two or more solvents may be used.

Examples of a radical polymerization initiator used in the synthesis of the binder polymer used in the present invention include known compounds such as an azo initiator, a peroxide initiator, and the like.

The binder polymer may be added when the pigment is dispersed, or a dispersion of the binder polymer may be added when the curable composition is prepared. The amount of the binder polymer added is preferably from 0 to 50% by mass, and more preferably from 2% to 30% by mass, based on the total solid content of the curable composition.

Further, when the colored curable composition is used to form an image by alkali development for a color filter for a liquid crystal display or a solid-state imaging device, a binder polymer having an acid group and/or a hydrophilic group is preferably used, and preferable examples of the acid group possessed by the binder polymer used in this purpose include a carboxyl group, a sulfonamide group, a sulfonic acid group, a phosphonic acid group, and a phenol group. From the viewpoints of developability and sensitivity, the acid value is preferably from 0.1 to 10 mmol/g, more preferably from 0.2 to 5 mmol/g, and most preferably from 0.3 to 3 mmol/g.

<Photopolymerization Initiator>

The colored curable composition of the present invention may, if necessary, contain (B-2) another photopolymerization initiator in addition to (B) the oxime initiator described above.

(B-2) another photopolymerization initiator in the present invention is a compound that is decomposed by light to initiate and promote the polymerization of (C) the polymerizable compound described above, and preferably has absorption in a wavelength region from 300 to 500 nm. The photopolymerization initiators may be used singly or in a combination of two or more kinds thereof.

Examples of the photopolymerization initiator include an organic halide compound, an oxydiazole compound, a carbonyl compound, a ketal compound, a benzoin compound, an acridine compound, an organic peroxide compound, an azo compound, a coumarin compound, an azide compound, a metallocene compound, a hexaaryl biimidazole compound, an organic boric acid compound, disulfonic acid compound, an onium salt compound, and an acyl phosphine (oxide) compound.

Specific examples of the organic halide compound include the compounds disclosed in "Bull Chem. Soc Japan" 42, 2924 (1969) by Wakabayashi et al., U.S. Pat. No. 3,905,815, JP-B No. 46-4605 JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, JP-A No. 63-298339, "Journal of Heterocyclic Chemistry" 1 (No 3), (1970)" by M. P. Hutt, and the like, and particularly an oxazole compound with a trihalomethyl group substituent and an s-triazine compound.

More preferable examples of the s-triazine compound include an s-triazine derivative with at least one mono-, di-, or trihalogen-substituted methyl group bonded to an s-triazine ring, and more specifically 2,4,6-tris(monochloromethyl)-s-triazine, 2,4,6-tris(dichloromethyl)-s-triazine, 2,4,6-tris(trichloromethyl)-s-triazine, 2-methyl-4,6-bis (trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxy phenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-nathoxynaphtyl)-4,6-bis(trichloromethyl)-s-triazine, 2-phenylthio-4,6-bis(trichloromethyl)-s-triazine, 2-benzyl thio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like.

Examples of the oxydiazole compound include 2-trichloromethyl-5-styryl-1,3,4-oxodiazole, 2-trichloromethyl-5-cyanostyryl-1,3,4-oxodiazole, 2-trichloromethyl-5-(naphto-1-yl)-1,3,4-oxodiazole, 2-trichloromethyl-5-(4-styryl)styryl-1,3,4-oxodiazole, and the like.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone, 2-carboxy benzophenone, and the like, acetophenone derivatives such as 2,2-dimethoxy-2-phenylacetophenone, 2,2-diethoxyacetophenone, 1-hydroxycyclohexyl phenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl)ketone, 2-benzyl-2-dimethylamino-4-morpholinobutylophenone, and the like, thioxantone derivatives such as thioxanthone, 2-ethylthioxantone, 2-isopropylthioxantone, 2-chlorothioxantone, 2,4-dimethylthioxantone, 2,4-diethylthioxantone, 2,4-diisopropylthioxantone, and the like, benzoate derivatives such as ethyl p-dimethylaminobenzoate, ethyl p-diethylaminobenzoate, and the like, and others.

Examples of the ketal compound include benzylmethyl ketal, benzyl-p-methoxyethylethyl acetal, and the like.

Examples of the benzoin compound include m-benzoin isopropyl ether, benzoin isobutyl ether, benzoin methyl ether, methyl o-benzoylbenzoate, and the like.

Examples of the acridine compound include 9-phenylacridine, 1,7-bis(9-acridinyl)heptane, and the like.

Examples of the organic peroxide compound include trimethylcyclohexanone peroxide, acetylacetone peroxide, 1,1-bis(tert-butylperoxy)-3,3,5-trimethylcyclohexane, 1,1-bis (tert-butylperoxy)cyclohexane, 2,2-bis(tert-butylperoxy) butane, tert-butyl hydroperoxide, cumene hydroperoxide, diisopropylbenzene hydroperoxide, 2,5-dimethyl hexane-2, 5-dihydroperoxide, 1,1,3,3-tetramethylbutyl hydroperoxide, tert-butylcumyl peroxide, dicumyl peroxide, 2,5-dimethyl-2, 5-di(tert-butylperoxy)hexane, 2,5-oxanoyl peroxide, succinic peroxide, benzoyl peroxide, 2,4-dichlorobenzoyl peroxide, diisopropylperoxydicarbonate, di-2-ethylhexylperoxydicarbonate, di-2-ethoxyethylperoxydicarbonate, dimethoxy isopropylperoxycarbonate, di(3-methyl-3-methoxy butyl)peroxy dicarbonate, tert-butyl peroxyacetate, tert-butyl peroxypivalate, tert-butyl peroxyneodecanoate, tert-butyl peroxyoctanoate, tert-butyl peroxylaurate, tercyl carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), carbonyl di(t-hexylperoxy dihydrogen diphthalate), and the like.

Examples of the azo compound include the azo compounds described in JP-A No. 8-108621, and the like.

Examples of the coumarin compound include 3-methyl-5-amino-((s-triazine-2-yl)amino)-3-phenylcoumarin, 3-chloro-5-diethylamino-((s-triazine-2-yl)amino)-3-phenyl coumarin, 3-butyl-5-dimethylamino-((s-triazine-2-yl)amino)-3-phenylcoumarin, and the like.

Examples of the azide compound include the organic azide compounds described in U.S. Pat. No. 2,848,328, U.S. Pat. No. 2,852,379 and U.S. Pat. Nos. 2,940,853, 2,6-bis(4-azidobenzylidene)-4-ethylcyclohexanone (BAC-E), and the like.

Examples of the metallocene compound include various titanocene compounds described in JP-A No. 59-152396, JP-A No. 61-151197, JP-A No. 63-41484, JP-A No. 2-249, 2-4705, and JP-A No. 5-83588, for example, di-cyclopentadienyl-Ti-bis-phenyl, di-cyclopentadienyl-Ti-bis-2,6-difluorophen-1-yl, di-cyclopentadienyl-Ti-bis-2,4-difluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl, iron-arene complexes described in JP-A No. 1-304453 and JP-A No. 1-152109, and the like.

Examples of the hexaaryl biimidazole compound include various compounds described in JP-B No. 6-29285, U.S. Pat. Nos. 3,479,185, 4,311,783, 4,622,286, and the like, and specifically, 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4'-5,5'-tetraphenyl biimidazole, 2,2'-bis(o-trifluorophenyl)-4,4',5,5'-tetraphenyl biimidazole, and the like are presented.

Specific examples of the organic borate compound include the organic borates described in JP-A No. 62-143044, JP-A No. 62-150242, JP-A No. 9-188685, JP-A No. 9-188686, JP-A No. 9-188710, JP-A No. 2000-131837, JP-A No. 2002-107916, Japanese Patent No. 2764769, Japanese Patent Application No. 2000-310808, and the like, and "Rad Tech '98. Proceeding Apr. 19-22, 1998, Chicago" by Kunz, Martin, and the like, the organic boron sulfonium complexes or the organic boron oxosulfonium complexes described in JP-A No. 6-157623, JP-A No. 6-175564, and JP-A No. 6-175561, the organic boron iodonium complexes disclosed in JP-A No. 6-175554 and JP-A No. 6-175553, the organic boron phosphonium complexes disclosed in JP-A No. 9-188710, the organic boron transition metal coordinate complexes of JP-A No. 6-348011, JP-A No. 7-128785, JP-A No. 7-140589, JP-A No. 7-306527, JP-A No. 7-292014, and the like, and others.

Examples of the disulfone compound include the compounds described in JP-A No. 61-166544, Japanese Patent Application No. 2001-132318, and the like.

Examples of the onium salt compound include the diazonium salts described in S. I. Schlesinger, Photogr. Sci. Eng., 18, 387 (1974), and T. S. Bal et al., Polymer, 21, 423 (1980), the ammonium salts described in U.S. Pat. No. 4,069,055, JP-A No. 4-365049, and the like, the phosphonium salts disclosed in U.S. Pat. Nos. 4,069,055 and 4,069,056, the iodonium salts described in European Patent No. 104,143, U.S. Pat. Nos. 339,049 and 410,201, JP-A No. 2-150848 and JP-A No. 2-296514, and the like.

An iodonium salt which can be suitably used in the present invention is a diaryliodonium salt, and from the viewpoint of stability, a diaryliodonium salt substituted with two or more electron-donating groups such as an alkyl group, an alkoxy group, an aryloxy group, and the like is preferred. As another preferred form of the sulfonium salt, an iodonium salt in which one of the substituents of a triarylsulfonium salt has a coumarin or anthraquinone structure, and which has absorption at 300 nm or more, and the like are preferred.

Examples of the sulfonium salt which can be suitably used in the present invention include sulfonium salts described in European Patents Nos. 370,693, 390, 214, 233, 567, 297,443, and 297,442, U.S. Pat. Nos. 4,933,377, 161,811, 410,201, 339,049, 4,760,013, 4,734,444, and 2,833,827, and German Patents Nos. 2,904,626, 3,604,580, and 3,604,581. From the viewpoint of stability and sensitivity, those substituted with an electron withdrawing group are preferable. It is preferable that a Hammett's value of the electron withdrawing group is more than 0. Examples of the preferable electron withdrawing group include a halogen atom, a carboxylic acid, and the like.

Furthermore, examples of other preferable sulfonium salts include a sulfonium salt in which one of the substituents of a triarylsulfonium salt has a coumarin or anthraquinone structure, and which has absorption at 300 nm or more. Examples of still other preferable sulfonium salts include a sulfonium salt in which a triarylsulfonium salt is substituted with an aryloxy group or an arylthio group, and which has absorption at 300 nm or more.

Furthermore, examples of the onium salt compound include onium salts such as selenonium salts described in J. V. Crivello, et al., Macromolecules, 10 (6), 1307 (1977) and J. V. Crivello, et al., J. Polymer Sci., Polymer Chem. Ed., 17, 1047 (1979), arsonium salts described in C. S. Wen, et al., Tech. Proc. Conf. Rad. Curing ASIA, p. 478, Tokyo, Oct (1988) and the like, and others.

Examples of the acyl phosphine (oxide) compound include IRGACURE 819, DAROCURE 4265, DAROCURE TPO, and the like, all of which are manufactured by Ciba Specialty Chemicals, and others.

As (B-2) another photopolymerization initiator used in the present invention, one or two or more suitable photopolymerization initiators may be selected in relation to the use purpose of the colored curable composition of the present invention and in relation to (a-1) the pigment and (C) the polymerizable compound that are used. Preferable from the viewpoint of exposure sensitivity is a compound selected from the group consisting of a trihalomethyl triazine-based compound, a benzyldimethyl ketal compound, an α-hydroxyketone compound, an α-aminoketone compound, an acyl phosphine-based compound, a phosphine oxide-based compound, a metallocene compound, a triallyl imidazole dimer, an onium-based compound, a benzothiazole-based compound, a benzophenone-based compound, an acetophenone-based compound and a derivative thereof, a cyclopentadiene-benzene-iron complex and a salt thereof, a halomethyl oxadiazole compound, and a 3-aryl-substituted coumarin compound.

The content of (B-2) another photopolymerization initiator that may be contained in the colored curable composition of the present invention is preferably from 0 to 20% by mass, more preferably from 0 to 15% by mass, and even more preferably 0 to 10% by mass, based on the total solid content of the curable composition.

<Compound Having an Adhesive Group>

For the purpose of improving the adhesiveness between a cured coating film and a support or a substrate, a compound having an adhesive group may be used in the colored curable composition of the present invention. Particularly, in the case where the colored curable composition of the present invention is used for formation of a colored region of a color filter, this compound is preferably used particularly from the viewpoint of improving the adhesiveness between the colored region and a substrate.

The adhesive group possessed by the compound may be any substituent having adhesiveness to a substrate used in a color filter, and the compound is particularly preferably a compound having adhesiveness to a glass substrate or a silicon substrate.

The adhesive group is preferably a group selected from acid groups such as a sulfonic acid group, a phosphonic acid group, a carboxyl group, and the like; ester groups of these acids; metal salts of these acids, onium salts of these metals; onium groups such as an ammonium group, a pyridinium group, and the like; substituents that form a silanol group by hydrolysis, such as an alkoxysilyl group and the like; amphoteric ionic groups such as a phenolic hydroxyl group, an N-oxide group, and the like; and chelating groups such as iminodiacetic acid and the like.

From the viewpoint of adhesiveness, the adhesive group is preferably an alkoxysilyl group and/or its hydrolyzed group.

Furthermore, the compound having an adhesive group that can be used in the present invention may be a compound further having, in the molecule, a group for improving developability or a group for improving sensitivity, such as a group having a carbon-carbon double bond, a cyclic alkoxy group, and the like.

The group for improving developability is preferably a functional group having a heteroatom and examples thereof include an alkoxy group, an alkoxycarbonyl group, a carboxyl group, a hydroxyl group, an amino group, a urethane group, an amide group, a thiol group, a sulfo group, a urea group, and the like, and the compounds having such functional group are preferably used in combination.

Preferable examples of the group for improving sensitivity include a methacryl group, an acryl group, a styryl group, a vinyl ether group, an allyl group, a cyclic alkenyl group, a furyl group, an oxetane group, an epoxy group and a tetrahydrofuran group. From the viewpoint of sensitivity, the compounds having a methacryl group, an acryl group or a styryl group are preferably used in combination.

<Sensitizer>

The curable composition of the present invention may contain a sensitizer for the purpose of improvement in radical generating efficiency of the radical initiator and achievement of a longer sensitizing wavelength. As the sensitizer to be used in the present invention, those capable of sensitizing the above-mentioned photopolymerization initiators by the electron transfer mechanism or the energy transfer mechanism are preferable.

As the sensitizer to be used in the present invention, those belonging to the compounds listed below, and having the absorption wavelength in the wavelength region from 300 nm to 450 nm are presented.

Preferable examples of the sensitizer include those belonging to the following compound group, and having the absorption wavelength in the wavelength region from 330 nm to 450 nm.

For example, polynuclear aromatic compounds (such as phenanthrene, anthracene, pyrene, perylene, triphenylene, and 9,10-dialkoxyanthracene), xanthenes (such as fluorescein, eosin, erythrosine, rhodamine B, and rose bengal), thioxantones (isopropylthioxantone, diethylthioxanthone, and chlorothioxantone), cyanines (for example, thiacarbocyanine and oxacarbocyanine), merocyanines (for example, merocyanine and carbomerocyanine), phthalocyanines, thiazines (for example, thionine, methylene blue, and toluidine blue), acrydines (for example, acrydine orange, chloroflavin, and acryflavin), anthraquinones (for example, anthraquinone), squariums (for example, squarium), acrydine orange, coumarines (for example, 7-diethylamino-4-methylcoumarin), ketocoumarin, phenothiadines, phenadines, styrylbenzenes, azo compounds, diphenylmethane, triphenylmethane, distyrylbenzenes, carbazole, porphilin, spiro compounds, quinacridones, indigo, styryl, pyrylium compounds, pyromethene compounds, pyrazolotriazole compounds, benzothiazole compounds, barbituric acid derivatives, thiobarbituric acid derivatives, acetophenone, benzophenone, thioxantone, aromatic ketone compounds such as Michler's ketone and the like, heterocyclic compounds such as N-aryl oxazolidinone and the like, and others are also included. Furthermore, the compounds described in European Patent No. 568,993, U.S. Pat. Nos. 4,508,811 and 5,227,227, JP-A No. 2001-125255 and JP-A No. 11-271969, or the like, and others are also included.

More preferable examples of sensitizers include the following compounds represented by the following general formulae (i) to (v).

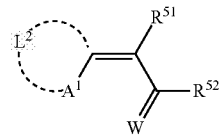

(i)

(In the formula (i), $A^1$ represents a sulfur atom or $NR^{50}$, $R^{50}$ represents an alkyl group or an aryl group, $L^2$ represents a nonmetallic atomic group which forms a basic nucleus of the pigment in association with adjacent $A^1$ and an adjacent carbon atom, $R^{51}$ and $R^{52}$ each independently represent a hydrogen atom or a monovalent nonmetallic atomic group, and $R^{51}$ and $R^{52}$ may be bonded to each other to form an acidic nucleus of the pigment. W represents an oxygen atom or a sulfur atom.)

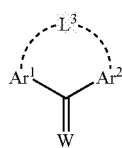

(ii)

(In the formula (ii), $Ar^1$ and $Ar^2$ each independently represent an aryl group, which are linked via a bond by $-L^3-$, wherein $L^3$ represents —O— or —S—. W has the same definition as in the general formula (i).)

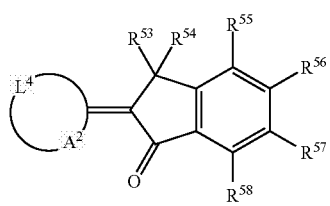

(iii)

(In the formula (iii), $A^2$ represents a sulfur atom or $NR^{59}$, $L^4$ represents a nonmetallic atomic group which forms a basic nucleus of the pigment in association with adjacent $A^2$ and an adjacent carbon atom, $R^{53}$, $R^{54}$, $R^{55}$, $R^{56}$, $R^{57}$, and $R^{58}$ each independently represent a monovalent nonmetallic atomic group, and $R^{59}$ represents an alkyl group or an aryl group.)

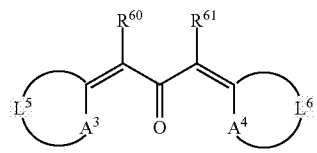

(iv)

(In the formula (Iv), $A^3$ and $A^4$ each independently represents —S— or $-NR^{62}-$, or $-NR^{63}-$. $R^{63}$ and $R^{64}$ each independently represent a substituted or unsubstituted alkyl group, or a substituted or unsubstituted aryl group, $L^5$ and $L^6$ each independently represent a nonmetallic atomic group which forms a basic nucleus of the pigment in association with adjacent $A^3$ or $A^4$ and an adjacent carbon atom, and $R^{60}$ and $R^{61}$ each independently represent a monovalent nonmetallic atomic group, and may be bonded to each other to form an aliphatic or aromatic ring.)

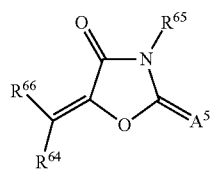

(v)

In the formula (v), $R^{66}$ represents an aromatic or heterocyclic ring which may have a substituent, $A^5$ represents an oxygen atom, a sulfur atom, or $-NR^{67}$. $R^{64}$, $R^{65}$, and $R^{67}$ each independently represent a hydrogen atom or a monovalent nonmetallic atomic group, and $R^{67}$ and $R^{64}$, and $R^{65}$ and $R^{67}$ may be bonded to each other to form an aliphatic or aromatic ring, respectively.)

Specific preferable examples of the compounds represented by the general formulae (i) to (v) include those shown below.

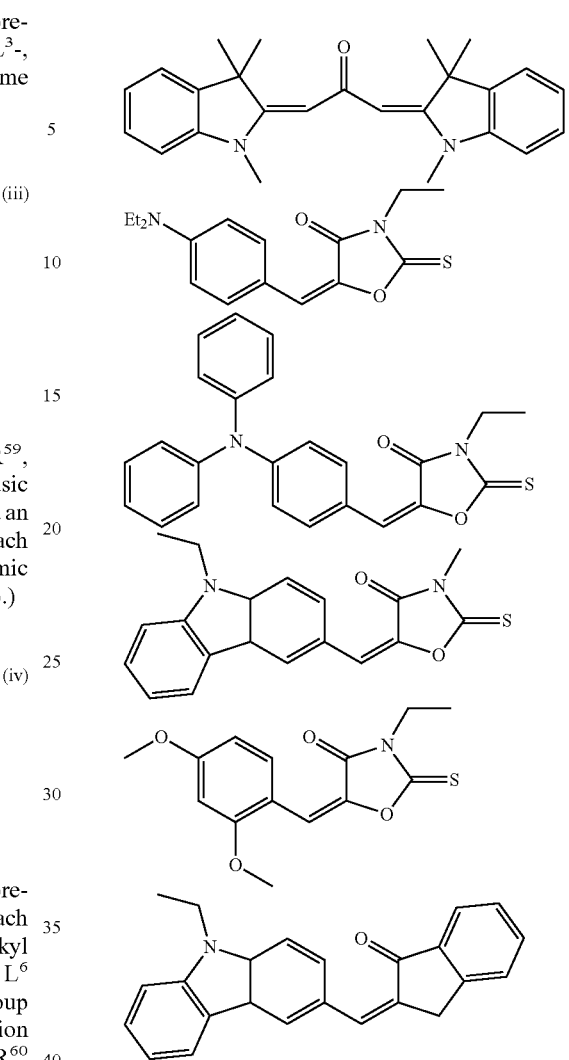

The sensitizers may be used singly or in a combination of two or more kinds thereof.

The content of the sensitizer in the curable composition of the present invention with respect to the total solid content of the curable composition is preferably from 0.1 to 20% by mass, and more preferably from 0.5 to 15% by mass in view of the light absorption efficiency at the deeper portion and the initial decomposition efficiency.

<Cosensitizer>

The curable composition of the present invention preferably contains a cosensitizer. In the present invention, the cosensitizer has the effects of further improving the sensitivity with respect to the actinic radiation of the sensitizing dye or the photopolymerization initiator, or restraining the polymerization inhibition of the polymerizable compound due to oxygen, or the like.

Examples of such a cosensitizer include the amines such as the compounds described in for example "Journal of Polymer Society" vol. 10, page 3,173 (1972) written by M. R. Sander et al., JP-B No. 44-20189, JP-A No. 51-82102, JP-A No. 52-134692, JP-A No. 59-138205, JP-A No. 60-84305, JP-A No. 62-18537, and JP-A No. 64-33104, and Research Disclosure No. 33825, and the like, and specifically, triethanolamine, ethyl p-dimethylaminobenzoate, p-formyl dimethylaniline, p-methylthio dimethylaniline, and the like.

Other examples of the cosensitizer include thiols and sulfides, for example, thiol compounds described in JP-A No. 53-702, JP-B No. 55-500806, and JP-A No. 5-142772, disulfide compounds described in JP-A No. 56-75643, and the like, and specifically, 2-mercaptobenzothiazole, 2-mercaptobenzoxazole, 2-mercaptobenzimidazole, 2-mercapto-4(3H)-quinazoline, β-mercaptonaphthalene, and the like.

In addition, other examples of the cosensitizer include amino acid compounds (for example, N-phenylglycine and the like), organic metal compounds (for example, tributyltin acetate and the like) described in JP-B No. 48-42965, hydrogen donating compounds described in JP-B No. 55-34414, sulfur compounds (for example, trithiane and the like) described in JP-A No. 6-308727, and others.

From the viewpoint of the improvement of the curing speed according to the balance of the polymerization growth speed and the chain transfer, the content of the cosensitizer with respect to the weight of the total solid content of the curable composition is preferably in a range from 0.1 to 30% by mass, more preferably in a range from 1 to 25% by mass, and even more preferably in a range from 0.5 to 20% by mass.

<Polymerization Inhibitor>

In the present invention, it is desirable to add a small amount of a thermal polymerization inhibitor for inhibiting the unnecessary thermal polymerization of the compound having a polymerizable ethylenically unsaturated double bond during the production or the storage of the curable composition.

Examples of the thermal polymerization inhibitor to be used in the present invention include hydroquinone, p-methoxyphenol, di-t-butyl-p-cresol, pyrogarol, t-butylcatechol, benzoquinone, 4,4'-thiobis(3-methyl-6-t-butylphenol), 2,2'-methylenebis(4-methyl-6-t-butyl phenol), a N-nitrosophenylhydroxyamine cerium salt, and the like.

An addition amount of the thermal polymerization inhibitor is preferably from about 0.01% by mass to about 5% by mass with respect to a weight of the total composition. If desired, in order to prevent polymerization inhibition due to oxygen, a higher fatty acid derivative such as behenic acid and behenic amide, and the like may be added to be distributed on a surface of a photosensitive layer during a drying process after coating. An addition amount of the higher fatty acid derivative is preferably from about 0.5% by mass to about 10% by mass of the total composition.

<Thermal Polymerizable Component>

It is effective to add a thermal polymerizable component in the colored curable composition of the present invention. If necessary, an epoxy compound may be added to increase the strength of a coating film. The epoxy compound is a compound having two or more epoxy rings in the molecule, such as a bisphenol A epoxy compound, a cresol novolac epoxy compound, a biphenyl epoxy compound, an alicyclic epoxy compound, and the like. Examples of the bisphenol A epoxy compound include EPOTOHTE YD-115, YD-118T, YD-127, YD-128, YD-134, YD-8125, YD-7011R, ZX-1059, YDF-8170, YDF-170, and the like (all manufactured by Tohto Kasei Co., Ltd.), DENACOAL EX-1101, EX-1102, EX-1103, and the like (all manufactured by Nagase Chemicals Ltd.), PLAQUCELL GL-61, GL-62, G101, and G102 (all manufactured by Daicel Chemical Industries, Ltd.), as well as bisphenol F epoxy compounds and bisphenol S epoxy compounds similar thereto. Epoxy acrylates such as EBECRYL 3700, 3701, and 600 (all manufactured by Daicel UCB), and the like may also be used. Examples of the cresol novolac epoxy compound include EPOTOHTE YDPN-638, YDPN-701, YDPN-702, YDPN-703, YDPN-704, and the like (all manufactured by Tohto Kasei Co., Ltd.), DENACOAL EM-125 (manufactured by Nagase Chemicals Ltd.), and the like. Examples of the biphenyl epoxy compound include 3,5,3',5'-tetramethyl-4,4'-diglycidyl biphenyl, and the like, and examples of the alicyclic epoxy compound include CEROXIDE 2021, 2081, 2083, and 2085, EPOLEAD GT-301, GT-302, GT-401, GT-403, and EHPE-3150 (all manufactured by Daicel Chemical Industries, Ltd.), and SUN TOHTO ST-3000, ST-4000, ST-5080, ST-5100, and the like (all manufactured by Tohto Kasei Co., Ltd.), and the like. Further, 1,1,2,2-tetrakis(p-glycidyloxyphenyl)ethane, tris(p-glycidyloxyphenyl)methane, triglycidyl tris(hydroxyethyl) isocyanurate, diglycidyl o-phthalate, diglycidyl terephthalate, as well as glycidyl esters modified with dimer acid in the skeletons of an amine epoxy resin such as EPOTOHTO YH-434 or YH-434L, a bisphenol A epoxy resin, and the like may also be used.

<Surfactant>

From the viewpoint of improving coating property, the colored curable composition of the present invention preferably contains various surfactants, and various surfactants such as fluorine-containing, nonionic, cationic and anionic surfactants may be used. Among these, the fluorine-containing surfactants and nonionic surfactants are preferable.

Compound having a fluoroalkyl group or a fluoroalkylene group at least a terminal, main chain, and/or side chain of the compound can be preferably used as the fluorine surfactant.

Examples of the specific commercial products thereof include MEGAFAC F142D, MEGAFAC F172, MEGAFAC F173, MEGAFAC F176, MEGAFAC F177, MEGAFAC F183, MEGAFAC 780, MEGAFAC 781, MEGAFAC R30, MEGAFAC R08, MEGAFAC F-472 SF, MEGAFAC BL20, MEGAFAC R-61, and MEGAFAC R-90 (trade names, manufactured by DIC Corporation), FLUORAD FC-135, FLUORAD FC-170C, FLUORAD FC-430, FLUORAD FC-431, and NOVEC FC-4430 (trade name, manufactured by Sumitomo 3M), ASAHI GUARD AG7105, 7000, 950, and 7600, SURFLON S-112, SURFLON S-113, SURFLON S-131, SURFLON S-141, SURFLON S-145, SURFLON S-382, SURFLON SC-101, SURFLON SC-102, SURFLON SC-103, SURFLON SC-104, SURFLON SC-105, and SURFLON SC-106 (trade names, manufactured by Asahi Glass Co., Ltd.) and EFTOP EF351, EFTOP 352, EFTOP 801, and EFTOP 802 (trade name, manufactured by JEMCO), and the like.

A fluorine surfactant is particularly effective in preventing irregular application and irregular thickness when forming a thin coating film using the colored curable composition of the present invention. In addition, the fluorine surfactant is effective also when the colored curable composition of the present invention is applied in slit coating which often causes lack of liquid.

Particularly preferable examples of the nonionic surfactants include nonionic surfactants such as polyoxyethylene alkyl ethers, polyoxyethylene alkylaryl ethers, polyoxyethylene alkyl esters, sorbitan alkyl esters, monoglyceride alkyl esters, and the like. Specific examples thereof include nonionic surfactants such as polyoxyethylene alkyl ethers such as polyoxyethylene lauryl ether, polyoxyethylene stearyl ether or polyoxyethylene oleyl ether; polyoxyethylene aryl ethers such as polyoxyethylene octylphenyl ether, polyoxyethylene polystyrylated ether, polyoxyethylene tribenzylphenyl ether, polyoxyethylene-propylene polystyryl ether, polyoxyethylene nonylphenyl ether, and the like; polyoxyethylene dialkyl esters such as polyoxyethylene dilaurate, polyoxyethylene distearate, and the like; sorbitan fatty acid esters, polyoxyethylene sorbitan fatty acid esters, ethylene diamine polyoxyethylene-polyoxypropylene condensates, and the like. As such nonionic surfactants, products commercially available from Kao Corporation, NOF Corporation, Takemoto Oil & Fat Co., Ltd., ADEKA Corporation, Sanyo Chemical Industries, Ltd., or the like can be suitably used. Besides those mentioned above, the dispersant described above may also be used.

<Other Additives>

Besides those described above, various additives may be added to the colored curable composition of the present invention. Specific examples of the additives include UV absorbing agents such as 2-(3-t-butyl-5-methyl-2-hydroxyphenyl)-5-chlorobenzotriazole, alkoxybenzophenone, and the like, aggregation inhibitors such as sodium polyacrylate, and the like, fillers such as glass, alumina, and the like; alkali-soluble resins such as an itaconic acid copolymer, a crotonic acid copolymer, a maleic acid copolymer, a partially esterified maleic acid copolymer, an acidic cellulose derivative, those prepared by adding an acid anhydride to a hydroxyl group-containing polymer, alcohol-soluble nylon, a phenoxy resin formed from bisphenol A and epichlorohydrin, and the like; and others.

For the purpose of further improving the developability of the colored curable composition by promoting alkali solubility in an uncured portion, an organic carboxylic acid, preferably a low molecular weight organic carboxylic acid having a molecular weight of 1000 or less, may be added in preparing (A) the pigment dispersion. Specific examples thereof include an aliphatic monocarboxylic acids such as formic acid, acetic acid, propionic acid, butyric acid, valeric acid, pivalic acid, caproic acid, diethylacetic acid, enanthic acid, caprylic acid, and the like; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, citraconic acid, and the like; aliphatic tricarboxylic acids such as tricarballylic acid, aconitic acid, camphoronic acid, and the like; aromatic monocarboxylic acids such as benzoic acid, toluic acid, cuminic acid, hemellitic acid, mesitylenic acid, and the like; aromatic polycarboxylic acids such as phthalic acid, isophthalic acid, terephthalic acid, trimellitic acid, trimesic acid, mellophanic acid, pyromellitic acid, and the like; and other carboxylic acids such as phenylacetic acid, hydroatropic acid, hydrocinnamic acid, mandelic acid, phenylsuccinic acid, atropic acid, cinnamic acid, methyl cinnamate, benzyl cinnamate, cinnamylideneacetic acid, coumaric acid, umbellic acid, and the like.

Further, known additives such as inorganic fillers for improving the physical properties of a cured film, plasticizers, fat-sensitizers capable of improving the ink receiving property on the surface of the photosensitive layer, and the like may be added.

Examples of the plasticizers include dioctyl phthalate, didodecyl phthalate, triethylene glycol dicaprylate, dimethyl glycol phthalate, tricresyl phosphate, dioctyl adipate, dibutyl sebacate, triacetyl glycerin, and the like. In the case where a binder is used, the plasticizer can be added in an amount of 10% by mass or less with respect to the total mass of the binder and the compound having an ethylenically unsaturated double bond.

The colored curable composition of the present invention is cured with high sensitivity and is excellent in storage stability. The curable composition shows high adhesiveness to the surface of a rigid material such as a substrate to which it is applied. Accordingly, the curable composition of the present invention can be used preferably in image-forming materials for a 3-dimensional optical shaping, holography and color filter and in fields such as an ink, a paint, an adhesive, a coating agent, and the like.

<Method for Preparing Color Filter Using Colored Curable Composition>

The colored curable composition of the present invention can be prepared through a mixing and dispersing step in which the previously described (A) pigment dispersion is allowed to contain (B) the oxime ester initiator, (C) the polymerizable compound, and an alkali-soluble resin used if necessary (preferably together with a solvent) and mixed with additives such as a surfactant and the like, if necessary, and mixed and dispersed by using various mixers or dispersing machines.

Further, the mixing and dispersing step preferably includes kneading dispersion and subsequent finely dispersing treatment, wherein kneading dispersion may be omitted.

One example of the method for manufacturing the colored curable composition of the present invention is described below.

(1. Preparation of Pulverized Pigment)

A kneader such as a twin roll, a triple roll, a ball mill, a trommel mill, a disper, a kneader, a co-kneader, a homogenizer, a blender, a single- or twin-screw extruder, and the like is used to apply strong shear force to a mixture of a pigment, a water-soluble organic solvent and a water-soluble inorganic salt, thereby finely pulverizing the pigment, and then the mixture is introduced into water and formed into slurry by a stirrer or the like. Then, this slurry is filtered and washed with water, and the water-soluble organic solvent and the water-soluble inorganic salt are removed followed by drying, whereby a finely pulverized pigment is obtained.

(2. Preparation of (A) Pigment Dispersion)

(a-1) The pigment, (a-3) the specific dispersion resin, (a-2) the specific pigment derivative, and a solvent are mixed, and dispersed by means of beads. By using mainly a vertical or horizontal sand grinder, a pin mill, a slit mill, an ultrasonic dispersing machine, and the like, the mixture is finely dispersed by beads made of glass or zirconia having a particle size from 0.01 mm to 1 mm, to obtain (A) a pigment dispersion. The treatment of finely pulverizing the pigment may be omitted.

Details of kneading and dispersion are described in T. C. Patton, "Paint Flow and Pigment Dispersion" (1964, published by John Wiley and Sons), and the like.

To (A) the pigment dispersion obtained in the manner described above are added (C) the polymerizable compound, (B) the oxime ester initiator, and (B-2) optional another polymerization initiator, an alkali-soluble resin, or the like used if necessary, whereby the colored curable composition of the present invention is obtained.

Hereinafter, the color filter of the present invention is described in detail by reference to the method for preparing the same (the method for preparing the color filter of the present invention).

The method for manufacturing the color filter of the present invention includes a step of applying, on a support, the colored curable composition of the present invention thus obtained to form a curable composition layer (hereinafter suitably and simply referred to as "the curable composition layer-forming step"), a step of exposing the curable composition layer through a mask (hereinafter suitably and simply referred to as "the exposure step"), and a step of developing the curable composition layer after exposure to form colored regions (hereinafter suitably and simply referred to as "the development step").

Hereinafter, the respective steps in the preparation method of the present invention are described.

<Curable Composition Layer-Forming Step>

Using the above-described colored curable composition of the present invention, the color filter of the present invention is formed on a substrate such as glass and can be preferably prepared by applying the colored curable composition of the present invention directly or via another layer on a substrate by slit coating for example, to form a coating film and then drying the coating film followed by pattern exposure and subsequent developing treatment with a developer. A color filter used in a liquid crystal display device or in a solid-state imaging device can be thereby produced inexpensively with high quality with no difficulty in the process.

The colored curable composition of the present invention can be applied directly or via another layer onto a substrate by a coating method such as spin coating, slit coating, casting coating, roll coating, bar coating, and the like.

Examples of the substrate include alkali-free glass, soda glass, PYREX (registered trademark) glass and quartz glass, which are used in a liquid crystal display device or the like, or those having a transparent electrically conductive film adhering thereto, and a photoelectric conversion device substrate, such as a silicon substrate and the like, which is used in a solid-state imaging device or the like, as well as plastic substrates. These substrates usually has thereon a black matrix for isolating each pixel or a transparent resin layer for promoting adhesiveness or the like.

The plastic substrate preferably has, on the surface thereof, a gas barrier layer and/or a solvent-resistant layer. A patterned coating film including the colored curable composition of the present invention can be formed on a driving substrate on which a thin film transistor (TFT) of a thin film transistor (TFT) color liquid crystal display device is arranged (hereinafter referred to as "TFT liquid crystal driving substrate") to form a color filter. A photomask used in this case is provided not only with a pattern for forming pixels but also with a pattern for forming a through-hole or a U-shaped hollow. The substrate in the TFT liquid crystal driving substrate may be, for example, glass, silicon, polycarbonate, polyester, aromatic polyamide, polyamide imide, or polyimide. These substrates may be subjected if desired to suitable pretreatment such as chemical treatment with a silane coupling agent or the like, plasma treatment, ion plating, sputtering, a gaseous phase reaction method, vacuum deposition, and the like. Examples of such substrates include TFT-mode liquid crystal driving substrates and TFT-mode liquid crystal driving substrates having on the surface thereof a passivation film such as a silicon nitride film and the like.

The method of applying the colored curable composition of the present invention onto a substrate is not particularly limited. A method of using a slit nozzle (hereinafter referred to as "slit nozzle coating method"), such as a slit-and-spin method, or a spin-less coating method, is preferable. In the slit nozzle coating method, the slit-and-spin coating method and the spin-less coating method are carried out under different conditions depending on the size of a substrate onto which the composition is applied. For example, when a fifth-generation glass substrate (1100 mm×1250 mm) is coated by the spin-less coating method, the amount of the photocurable composition discharged from a slit nozzle is usually from 500 to 2000 μL/sec, preferably from 800 to 1500 μL/sec, and the coating speed is usually from 50 to 300 mm/sec, preferably from 100 to 200 mm/sec. The solid content of the photocurable composition is usually from 10 to 20%, and preferably from 13 to 18%. When a coating film of the colored curable composition of the present invention is formed on a substrate, the thickness of the coating film (after pre-baking treatment) is generally from 0.3 to 5.0 μm, preferably from 0.5 to 4.0 μm, and most preferably from 0.8 to 3.0 μm.

Further, when the colored curable composition of the present invention is used in forming a color filter for a high-resolution solid-state imaging device, a film of the composition most preferably has a thickness in a range from 0.4 μm to 2.0 μm.

The present invention is particularly effective in forming a colored region having a film thickness from 0.4 μm to 1.0 μm, especially from 0.45 μm to 0.8 μm.

Usually, the composition after application onto a substrate is subjected to pre-baking treatment. If necessary, the composition on the substrate may be subjected to vacuum treatment before the pre-baking. Vacuum drying is conducted under conditions where the degree of vacuum is usually about from 0.1 to 1.0 torr, and preferably about from 0.2 to 0.5 torr.

Pre-baking treatment can be carried out with a hot plate, an oven, or the like at a temperature in a range from 50 to 140° C., preferably from about 70 to 110° C., and for a period from 10 to 300 seconds. Treatment such as high-frequency treatment and the like may also be simultaneously conducted. Alternatively, the high-frequency treatment may be conducted alone.

<Exposure Step>

In the exposure step, the curable composition layer formed in the curable composition layer-forming step is exposed through a mask having a predetermined mask pattern.

In this step, the pattern exposure of the coating film can be carried out by exposing the coating film through a predetermined mask pattern to cure the radiated portion only and then developing it with a developer to form a patterned coating film consisting of pixels of the respective colors (3 or 4 colors). Radiations that may be used in exposure are preferably ultraviolet rays such as g-line, i-line, and the like. The irradiation amount is preferably 5 to 1500 mJ/cm$^2$, more preferably from 10 to 1000 mJ/cm$^2$, and most preferably from 10 to 500 mJ/cm$^2$.

When the color filter of the present invention is used in a liquid crystal display device, the irradiation amount in the above-defined range is preferably from 5 to 200 mJ/cm$^2$, more preferably from 10 to 150 mJ/cm$^2$, and most preferably from 10 to 100 mJ/cm$^2$. When the color filter of the present invention is used in a solid-state imaging device, the irradiation amount in the above-defined range is preferably from 30 to 1500 mJ/cm$^2$, more preferably from 50 to 1000 mJ/cm$^2$, and most preferably from 80 to 500 mJ/cm$^2$. When a color filter for a solid-state imaging device is prepared, i-line in a stepper exposure device is preferably mainly used because formation of a high-definition pattern is required.

<Development Step>

In developing treatment, the uncured portion of the coating film after exposure is dissolved in a developer so that the cured portion only remains. The development temperature is usually from 20 to 30° C., and the development time is from 20 to 90 seconds.

As the developer, any developer may be used as long as the coating film in the uncured portion of the photocurable composition which is photocurable is dissolved in the developer while the cured portion is not dissolved therein. Specifically, a combination of various organic solvents or an alkaline aqueous solution may be used.

Examples of the organic solvents include the previously described solvents usable in preparing the pigment dispersion composition or photocurable composition of the present invention.

Examples of the alkaline aqueous solution include alkaline aqueous solutions wherein an alkaline compound such as sodium hydroxide, potassium hydroxide, sodium carbonate, sodium hydrogen carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, 1,8-diazabicyclo-[5,4,0]-7-undecene, and the like is dissolved at a concentration from 0.001 to 10% by mass, preferably from 0.01 to 1% by mass. To the alkaline aqueous solution, a suitable amount of a water-soluble organic solvent such as methanol, ethanol, and the like, a surfactant, and the like can be added.

The development system may be any of a dipping system, a shower system or a spray system, which may be combined with a swing system, a spinning system, an ultrasonic system, or the like. Before contact with the developer, the surface of the coating film to be developed may previously be moistened with water or the like in order to prevent uneven development. The substrate may be inclined during development.

When a color filter for a solid-state imaging device is prepared, paddle development may be used.

After the developing treatment, the coating film on the substrate is subjected to rinsing treatment where an excess of the developer is removed with washing, followed by drying and subsequent heat treatment (post-baking) to ensure complete curing.

The rinsing step is usually carried out with pure water. For saving rinsing water (pure water), pure water is used in final washing only, and when washing is initiated, used pure water may be used, or the substrate may be inclined during washing, or ultrasonic irradiation may be used during washing.

After rinsing, water is drained off, and then the coating film on the substrate is dried and then subjected to heat treatment usually at about from 200° C. to 250° C. The heat treatment (post-baking) of the coating film after development may be carried out in a continuous or batch system under the above-mentioned conditions with a heating means such as a hot plate, a convection oven (hot air-circulating dryer), a high-frequency heater, and the like.

The operation described above is repeated for each color by a number of desired color hues to prepare a color film having a cured film of a plurality of colors formed thereon.

Application of the colored curable composition of the present invention containing (A) the pigment dispersion has been described mainly by reference to application to a color filter, but the colored curable composition can also be applied to formation of a black matrix for isolating the respective colored pixels constituting a color filter.

The black matrix can be formed by exposing and developing the colored curable composition of the present invention using a black pigment such as carbon black, titanium black, and the like, if necessary, followed by post-baking to promote the curing of the film.

The colored curable composition of the present invention is excellent in pigment dispersion stability, is curable with high sensitivity and is also excellent in developability and can thus form a high-resolution colored region excellent in color property in a thin layer even if a pigment is contained at a high concentration, and the colored curable composition is particularly useful in forming a colored region of a color filter, and thus has a broad range of applications.

EXAMPLES

Hereinafter, the present invention will be described in more detail by reference to Examples, but the present invention is not limited to the following Examples and may be modified without departure from the gist of the present invention.

Unless otherwise noted, "%" and "parts" refer to % by mass and parts by mass, respectively.

Synthesis Example 1

Preparation of Specific Dispersion Resin solution 1

800 parts of cyclohexanone was introduced into a reaction container and then heated to 100° C. while nitrogen gas was injected into the container, and a mixture of 60.0 parts of styrene, 80.0 parts of methacrylic acid, 68.0 parts of methyl methacrylate, 62.0 parts of butyl methacrylate, and 9.0 parts of azobisisobutyronitrile was added dropwise at the same temperature for 1 hour and subjected to a polymerization reaction. After the dropwise addition, the reaction was continued at 100° C. for additional 3 hours, and a solution obtained by dissolving 2.0 parts of azobisisobutyronitrile in 50 parts of cyclohexanone was added thereto and subjected to reaction at 100° C. for an additional 1 hour to obtain a solution of a specific dispersion resin 1 having a weight-average molecular weight of about 30,000 and an acid value of 3.44 mmol/g. The weight-average molecular weight was measured by means of Gel Permeation Chromatography (GPC) using polystyrene as a standard material. The acid value was determined by means of titration.

After cooling to room temperature, about 2 g of the resin solution was sampled, then dried under heating at 180° C. for 20 minutes, and its nonvolatile content was measured. The previously synthesized resin solution was mixed with cyclohexanone such that its nonvolatile content was adjusted to 20% by mass, to prepare a specific dispersion resin solution 1.

Synthesis Example 2

Preparation of Specific Dispersion Resin Solution 2

To the specific dispersion resin solution 1 obtained in Synthesis Example 1 were added 10 parts by mass of glycidyl methacrylate and 1 part by mass of tetraethylammonium bromide, followed by stirring at 90° C. for 2 hours to obtain a solution of a specific dispersion resin 2 having a double bond group introduced in the side chain, and having a weight-average molecular weight of about 32,000 and an acid value of 3.1 mmol/g.

To the solution of the specific dispersion resin 2 cyclohexanone (solvent) was added to prepare a specific dispersion resin solution 2 having a nonvolatile content of 20% by mass.

Synthesis Example 3

Preparation of Specific Dispersion Resin Solution 3

To 333 parts by mass of propylene glycol monomethyl ether acetate solution containing 100 parts by mass of poly acrylic acid/methyl methacrylate (mass ratio 50/50) having a weight-average molecular weight of 10,000 and an acid value of 6.9 mmol/g were added 50 parts by mass of glycidyl methacrylate and 1 part by mass of tetraethylammonium bromide, followed by stirring at 90° C. for 3 hours to obtain a solution of a specific dispersion resin 3 having a double bond group introduced in the side chain, and having a weight-average molecular weight of 12,000 and an acid value of 1.95 mmol/g.

To the solution of the specific dispersion resin 3 was added propylene glycol monomethyl ether acetate (solvent) to prepare a specific dispersion resin solution 3 having a nonvolatile content of 20% by mass.

Synthesis Example 4

Preparation of Specific Dispersion Resin Solution 4

To a 1000-ml three-necked flask, 100 g of 1-methyl-2-pyrrolidone was charged, followed by heating to 90° C. under nitrogen flow. A solution obtained by mixing 84 g of Compound (i-1) below, 33 g of benzyl methacrylate, 14 g of methacrylic acid, and 100 g of the 1-methyl-2-pyrrolidone solution containing 5.2 g of V-601 (manufactured by Wako Pure Chemical Industries, Ltd.) was added dropwise thereto for 2 hours. After the dropwise addition, the solution was further stirred for 2 hours. Then, the reaction solution was cooled to room temperature and then poured into 7 L of water to precipitate a polymer compound. The precipitated polymer compound was collected by filtration, washed with water, and dried to obtain 131 g of a polymer compound.

The weight-average molecular weight of the obtained polymer compound was measured by means of Gel Permeation Chromatography (GPC) using polystyrene as a standard material, and the result obtained was 11,800. Further, the acid value obtained by titration was 69.6 mgKOH/g (calculated value 69.7 mgKOH/g).

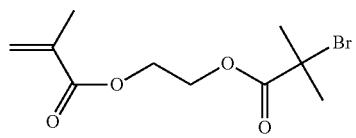

Compound (i-1)

To 131 g of the obtained polymer compound was added 1.0 g of p-methoxyphenol, and 580 g of 1-methyl-2-pyrrolidone was added thereto and dissolved, and then cooled in an ice bath filled with ice water. When the temperature of the mixed solution reached 5° C. or lower, 150 g of 1,8-diazabicyclo [5.4.0]-7-undecene (DBU) was further added dropwise through a dripping funnel for 1 hour. After the dropwise addition, the ice bath was removed and the mixed solution was further stirred for 8 hours. To the reaction solution, concentrated hydrochloric acid was added to adjust the pH to 7, and then the solution was poured into 7 L of water to precipitate a specific dispersion resin 4. The precipitated specific dispersion resin 4 was collected by filtration, washed with water, and dried to obtain 105 g of a desired specific dispersion resin 4. Then, the specific dispersion resin 4 was dissolved in propylene glycol monomethyl ether to give a specific dispersion resin solution 4 (solution having a solid content of 20%).

Synthesis Example 5

Preparation of Specific Dispersion Resin 5

To a 1000-ml three-necked flask, 120 g of propylene glycol monomethyl ether was charged, followed by heating to 90° C. under nitrogen flow. A solution obtained by mixing 75 g of benzyl methacrylate, 40 g of methacrylic acid, and 120 g of the N-methyl-2-pyrrolidone solution containing 7.0 g of V-601 (manufactured by Wako Pure Chemical Industries, Ltd.) was added dropwise thereto for 2 hours. After the dropwise addition, the solution was further stirred for 2 hours. Then, the reaction solution was cooled to room temperature and then poured into 8 L (liters; the same applies hereinafter) of water to precipitate a polymer compound. The precipitated polymer compound was collected by filtration, washed with water, and dried to obtain 114 g of a polymer compound (ii-1).

The weight-average molecular weight of the obtained polymer compound (ii-1) was measured by means of Gel Permeation Chromatography (GPC) using a polystyrene as a standard material, and the result obtained was 12,000. Further, the acid value of the polymer compound (ii-1) as determined by titration was 258 mgKOH/g (calculated value 260 mgKOH/g), which confirms that polymerization was carried out in a normal manner.

Thereafter, to a 300-ml three-necked flask, 40 g of the obtained polymer compound (ii-1) was added, 110 mg of p-methoxy phenol was charged thereto, and 60 g of N-methyl pyrrolidone was further added and dissolved therein. 820 mg of tetrabutylammonium bromide was further added thereto and heated to 80° C., and then 10 g of glycidyl methacrylate was added thereto, followed by stirring for 6 hours. By means of gas chromatography, it was confirmed that a glycidyl methacrylated-derived peak was not present. This reaction solution was poured into 7 L of water to precipitate a polymer compound. The precipitated polymer compound was collected by filtration, washed with water, and dried to obtain 54 g of a polymer compound (ii-2).

The weight-average molecular weight of the obtained polymer compound (ii-2) was measured by means of Gel Permeation Chromatography (GPC) using a polystyrene as a standard material, and the result obtained was 17,800. Further, the acid value of the polymer compound (ii-2) as determined by titration was 128 mgKOH/g (calculated value 129 mgKOH/g).

To a 300-ml three-necked flask, 54 g of the obtained polymer compound (ii-2) was added, 110 mg of p-methoxy phenol was charged thereto, and 70 g of N-methylpyrrolidone was further added and dissolved therein. 5.1 g of triethylamine was further added thereto and heated to 50° C., and then 5 g of succinic acid anhydride was added thereto, followed by stirring for 5 hours. By means of NMR, it was confirmed that the unreacted succinic acid anhydride was lost. This reaction solution was poured into 7 L of water to precipitate a specific dispersion resin 5. The precipitated specific dispersion resin 5 was collected by filtration, washed with water, and dried to obtain 54 g of a desired specific dispersion resin 5.

The weight-average molecular weight of the obtained specific dispersion resin 5 was measured by means of Gel Permeation Chromatography (GPC) using polystyrene as a standard material, and the result obtained was 20,100. Further, the acid value of the polymer compound as determined by titration was 115 mgKOH/g (calculated value 117 mgKOH/g). The specific dispersion resin 5 was dissolved in propylene glycol monomethyl ether to give a specific dispersion resin solution 5 (solution having a solid content of 20%).

Synthesis Example 6

Preparation of Specific Dispersion Resin 6

In a 500-ml 3-necked round-bottom flask equipped with a condenser and a stirrer, 8.2 g (0.05 mole) of 2,2-bis(hydroxymethyl)butanoic acid and 13.0 g (0.05 moles) of the diol compound (1) shown below were dissolved in 100 ml of N,N-dimethylacetamide. To the solution were added 25.5 g (0.102 mole) of 4,4-diphenylmethane diisocyanate and 0.1 g of dibutyltin dilaurate, and the mixture was heated at 100° C. for 8 hours under stirring. Then, the reaction mixture was diluted with 100 ml of N,N-dimethylformamide and 200 ml of methyl alcohol, and stirred for 30 minutes. The reaction solution was poured into 3 liters of water while stirring to precipitate a white specific dispersion resin 6. This specific dispersion resin 6 was collected by filtration, washed with water, and dried under vacuum to obtain 37 g of a specific dispersion resin 6.

As a result of measurement of a molecular weight by gel permeation chromatography (GPC), the weight-average molecular weight (in terms of standard polystyrene) of the polymer was 95,000, and the acid value was 1.06 mmol/g.

Synthesis Example 7

Preparation of Specific Dispersion Resin 7

In a 500-ml 3-necked round-bottom flask equipped with a condenser and a stirrer, 5.9 g (0.04 mole) of 2,2-bis(hydroxymethyl)butanoic acid and 15.9 g (0.06 mole) of Diol compound (2) shown below were dissolved in 100 ml of N,N-dimethylacetamide. To the solution were added 20.4 g (0.082 mole) of 4,4-diphenylmethane diisocyanate, 3.4 g (0.02 mole) of 1,6-hexamethylene diisocyanate, and 0.3 g of dibutyltin dilaurate, and the mixture was heated at 100° C. for 8 hours under stirring. Then, the reaction mixture was diluted with 100 ml of N,N-dimethylformamide and 200 ml of methyl alcohol, and stirred for 30 minutes. The reaction solution was poured into 3 liters of water under stirring to precipitate a white specific dispersion resin 7. This specific dispersion resin 7 was collected by filtration, washed with water, and dried under vacuum to obtain 34 g of a specific dispersion resin 7.

As a result of measurement of a molecular weight by gel permeation chromatography (GPC), the weight-average molecular weight (in terms of standard polystyrene) of the polymer was 50,000, and the acid value was 0.88 mmol/g.

Synthesis Example 8

Preparation of Specific Dispersion Resin 8

In a 500-ml 3-necked round-bottom flask equipped with a condenser and a stirrer, 5.4 g (0.04 mole) of 2,2-bis(hydroxymethyl)propionic acid and 15.6 g (0.06 mole) of Diol compound (3) shown below were dissolved in 100 ml of N,N-dimethylacetamide. To the solution were added 21.4 g (0.102 mole) of naphthalene diisocyanate and 0.1 g of dibutyltin dilaurate, and the mixture was heated at 100° C. for 4 hours under stirring. Then, the reaction mixture was diluted with 100 ml of N,N-dimethylformamide and 200 ml of methyl alcohol, and stirred for 30 minutes. The reaction solution was poured into 3 liters of water under stirring to precipitate a white specific dispersion resin 8. This specific dispersion resin 8 was collected by filtration, washed with water, and dried under vacuum to obtain 34 g of a specific dispersion resin 8.

As a result of measurement of a molecular weight by gel permeation chromatography (GPC), a weight-average molecular weight (in terms of standard polystyrene) of the polymer was 28,000, and the acid value was 0.93 mmol/g.

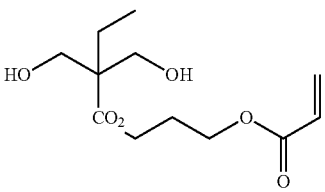

Diol Compound (1)

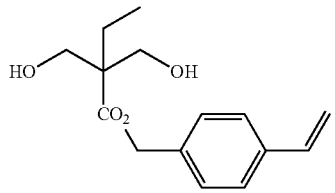

Diol Compound (2)

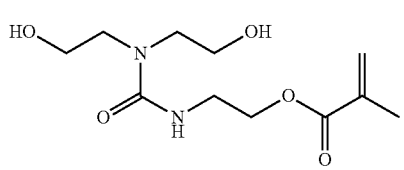

Diol Compound (3)

(Comparative Resin 1)

A resin having a weight-average molecular weight of 12,000 and an acid value of 2.06 mmol/g, obtained by radical polymerization using a well-known method at a molar ratio of methyl methacrylate to methacrylic acid of 80/20 was taken as a comparative resin 1.

(Comparative Resin 2)

A resin having a weight-average molecular weight of 30,000 and an acid value of 2.85 mmol/g, obtained by radical polymerization using a well-known method at a molar ratio of benzyl methacrylate to methacrylic acid of 60/40 was taken as a comparative resin 2.

Examples 1 to 5 and Comparative Examples 1 and 2

Preparation 1 of Pigment Dispersion

The components in Composition (1) below were mixed, and then stirred and mixed at a revolution number of 3,000 r.p.m. for 3 hours with a homogenizer to prepare pigment-containing mixed solutions (A to D, and H-1 to H-2).

[Composition (1)]

| | |
|---|---|
| C.I. Pigment Red 254 | 80 parts |
| C.I. pigment Yellow 139 | 20 parts |
| Specific dispersion resin or comparative resin (described in Table 1 below) | 275 parts |
| 1-Methoxy-2-propyl acetate | 630 parts |
| Specific pigment derivative or comparative compound (described in Table 1 below) | 8 parts |

Subsequently, each of the mixed solutions (A to D, and H-1 to H-2) obtained above was dispersed for 6 hours with a beads-dispersing machine DISPER MAT (manufactured by GETZMANN) using 0.3 mmφ zirconia beads and then further dispersed with a high-pressure dispersing machine NANO-3000-10 with a depressurization mechanism (manufactured by Beryu Co., Ltd.) under a pressure of 2000 kg/cm³ and at a flow rate of 500 g/min. This dispersing treatment was repeated 10 times to obtain red pigment dispersions (A to D, and H-1 to H-2).

TABLE 1

| | (a-2) Specific pigment derivative or comparative compound | (a-3) Specific dispersion resin or comparative resin | Viscosity change (mPa · s) |
|---|---|---|---|
| Pigment dispersion A | Y-1 | 2 | 2 |
| Pigment dispersion B | Y-2 | 2 | 2 |
| Pigment dispersion C | Y-3 | 3 | 3 |
| Pigment dispersion D | Y-4 | 4 | 3 |
| Pigment dispersion H-1 | H-1 | 2 | 100 or more |
| Pigment dispersion | Y-1 | Comparative resin 2 | 3 |

TABLE 1-continued

| | (a-2) Specific pigment derivative or comparative compound | (a-3) Specific dispersion resin or comparative resin | Viscosity change (mPa · s) |
|---|---|---|---|
| H-2 | | | |

The structures of (a-2) the specific pigment derivatives (Y-1) to (Y-4) according to the present invention and the comparative compound (H-1) described in Table 1 above are shown below.

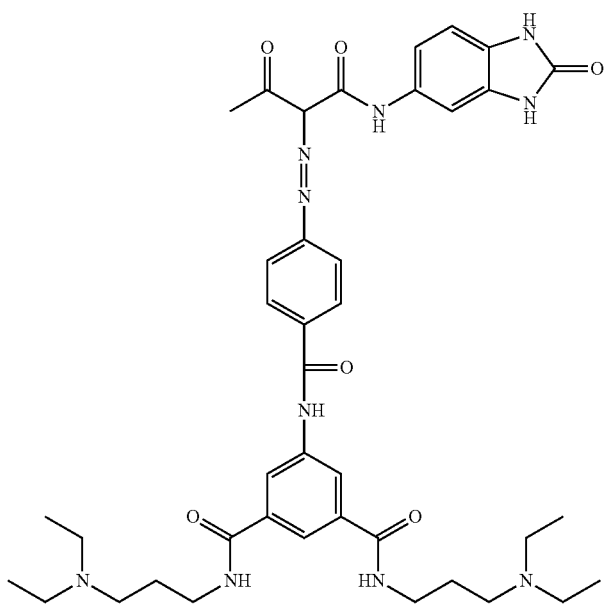

Y-1

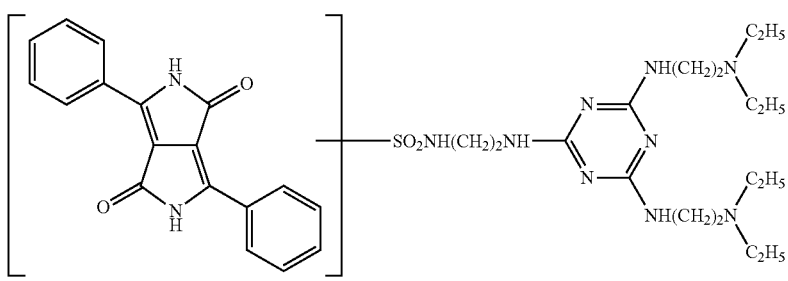

Y-2

Y-3

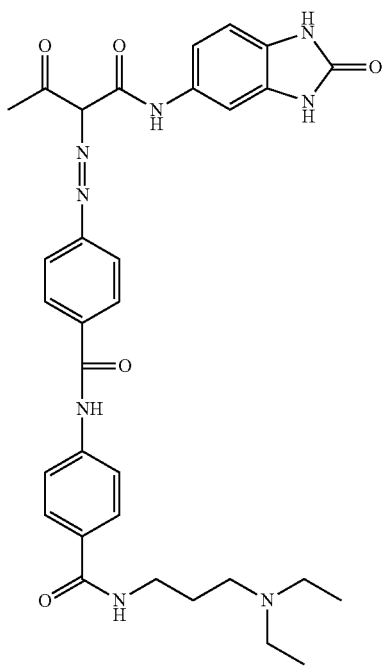

Y-4

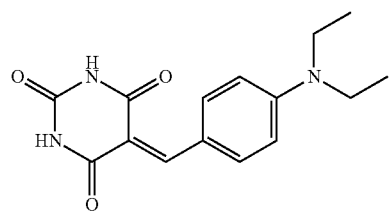

H-1

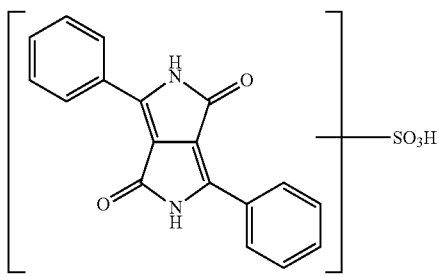

<Evaluation of the Pigment Dispersions>

The obtained pigment dispersions (A to D) according to the present invention and comparative pigment dispersions (H-1 to H-2) were evaluated as follows.

(1) Measurement and Evaluation of Viscosity

With respect to the resulting pigment dispersion composition, the viscosity $\eta^1$ of the pigment dispersion just after being dispersed, and the viscosity $\eta^2$ of the pigment dispersion one week after being dispersed (at room temperature of 25° C. to 28° C.), were measured with a type E viscometer, and the difference therebetween was calculated to evaluate the degree of thickening. When the difference between the viscosity $\eta^2$ of the pigment dispersion after 1 week and the viscosity $\eta^1$ of the pigment dispersion just after being dispersed is 5 (mPa·s) or less, the pigment dispersion is shown to be excellent in dispersion stability. The results are also shown in Table 1 above.

As is evident from Table 1, all of the pigment dispersions A to D prepared by incorporating (a-2) the specific pigment derivative and (a-3) the specific dispersion resin were excellent in dispersion stability.

On the other hand, it can be seen that the pigment dispersion H-1 in which only the acid-type derivative and specific resin were used had significant viscosity change and low stability.

Hereinafter, the present invention will be described with reference to an example of preparation of a coloring agent-containing colored curable composition for use in formation of a color filter for a solid-state imaging device.

[Preparation of Silicon Substrate with Undercoat Layer]

The components in Composition (2) below were mixed and dissolved to prepare a resist solution for an undercoat layer.

<Composition (2)>

| | |
|---|---|
| Propylene glycol monomethyl ether acetate (PGMEA: solvent) | 19.20 parts |
| Ethyl lactate | 36.67 parts |
| Binder polymer [40% PGMEA solution of a benzyl methacrylate/methacrylic acid/2-hydroxyethyl methacrylate copolymer (molar ratio = 60/22/18)] | 30.51 parts |
| Dipentaerythritol hexaacrylate (photopolymerizable compound) | 12.20 parts |
| Polymerization inhibitor (p-methoxy phenol) | 0.0061 parts |
| Fluorine-containing surfactant (F-475, manufactured by Dainippon Ink And Chemicals, Incorporated) | 0.83 part |
| Photopolymerization initiator (TAZ-107: trihalomethyltriazine-based photopolymerization initiator, manufactured by Midori Kagaku Co., Ltd.) | 0.586 parts |

A 6-inch silicon wafer was subjected to heat treatment in an oven at 200° C. for 30 minutes. Then, the resist solution above was applied onto this silicon wafer to give a thickness of 2 μm after drying, and then dried by heating in an oven at 220° C.

for 1 hour to form an undercoat layer, thereby obtaining a silicon wafer substrate with an undercoat layer.

1-1. Preparation of Colored Curable Composition (Coating Liquid)

The following components were added to the pigment dispersion obtained by dispersing treatment as described above, and then mixed under stirring to prepare a curable composition solution.

| | |
|---|---|
| Pigment dispersion [dispersion described in Table 2 below] | 100 parts by mass |
| DPHA (manufactured by Nippon Kayaku Co., Ltd.) | 3.5 parts by mass |
| Polymerization initiator [oxime ester initiator or comparative initiator described in Table 2 below] | 0.6 part by mass |
| Allyl methacrylate/methacrylic acid [molar ratio, 73/27, weight-average molecular weight 57,000] | 1.0 part by mass |
| Surfactant (trade name: TETRANIC 150R1, manufactured by BASF) | 0.2 part by mass |
| Solvent: PGMEA | 100 parts by mass |

TABLE 2

| | Pigment dispersion | Polymerization initiator | Sensitivity (mJ/cm$^2$) | Developability |
|---|---|---|---|---|
| Example 1 | A | I-1 | 85 | No residue |
| Example 2 | A | I-2 | 75 | No residue |
| Example 3 | B | I-1 | 80 | No residue |
| Example 4 | C | I-1 | 85 | No residue |
| Example 5 | D | I-2 | 75 | No residue |
| Comparative Example 1 | H-2 | I-1 | 120 | No residue |
| Comparative Example 2 | A | IH-1 | 140 | No residue |

The structures of (B) the oxime initiators (I-1) and (I-2), and the comparative polymerization initiator (IH-1) described in Table 2 above are shown below.

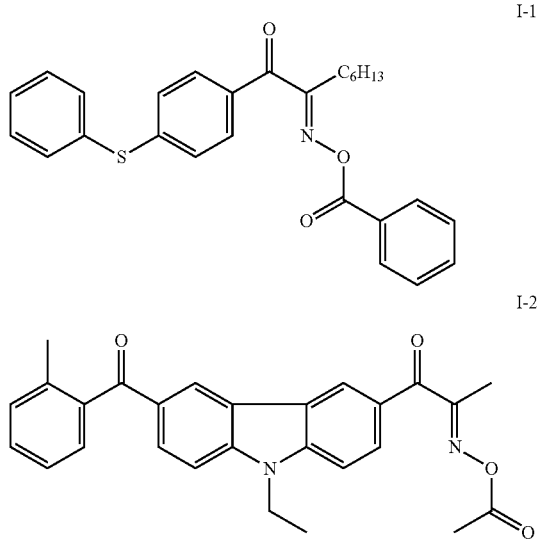

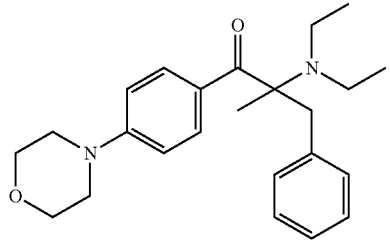

1-2. Preparation and Evaluation of Color Filter with Colored Curable Composition —Formation of Pattern and Evaluation of Sensitivity—

The coloring agent-containing curable composition prepared in each of Examples 1 to 5 and Comparative Examples 1 and 2 described above was applied onto the silicon substrate with an undercoat layer to form a curable composition layer (coating film) thereon. Then, the curable composition layer was subjected to heat treatment (pre-baking) on a hot plate at 100° C. for 120 seconds such that the coating film after drying became 0.9 µm in thickness.

Then, the coating film was exposed, through a 1.4-µm-square Island pattern mask, using light with a wavelength of 365 nm at a varying exposure amount from 50 mJ/cm$^2$ to 1600 mJ/cm$^2$ from an i-line stepper exposure device FPA-3000i5+ (manufactured by Canon Inc.) such that a 1.4-µm-square Island pattern having the same size as that of the mask pattern could be obtained. In this process, the exposure amount of 50 mJ/cm$^2$ was measured with an optical illumination system, and with this exposure amount regarded as standard, the irradiation time was changed and cumulative exposure amount (mJ/cm$^2$) was determined as sensitivity. As this numerical value is decreased, a high-resolution fine pattern can be formed with lower exposure, thus indicating that the composition has higher sensitivity. The results are also shown in Table 2 above.

Thereafter, the silicon wafer substrate on which the irradiated coating film had been formed was placed on a horizontal rotating table of a spin shower developer (DW-30, manufactured by Chemitronics Co., Ltd.) and subjected to paddle development at 23° C. for 60 seconds with CD-2000 (manufactured by FUJIFILM Electronics Materials Co., Ltd.) to form a colored pattern on the silicon wafer substrate.

The silicon wafer substrate having a colored pattern formed thereon was fixed to the horizontal rotating table by a vacuum chuck system, and the silicon wafer substrate was rotated at 50 r.p.m. with a rotating device and simultaneously rinsed with a shower of pure water supplied via a spraying nozzle from above the rotating center of the substrate and then spray-dried. Thereafter, a formed 1.4-µm-square colored pattern and its surrounding part were observed with a magnifying power of 20,000 using a length measuring SEM "S-9260A" (manufactured by Hitachi High-Technologies Corp.). Whether residues on the region not irradiated with light (unexposed portion) in the exposure step were present or not was observed to evaluate developability. The results are also shown in Table 2 above.

As is evident from Table 2, the colored curable composition of Examples 1 to 5 of the present invention can form a fine colored region with high sensitivity with no residues after development and thus can be seen to be excellent in developability in the unexposed portion.

On the other hand, it could be seen that Comparative Example 2 wherein the α-aminoacetophenone-based compound (IH-1) was used in place of (B) the oxime initiator cannot attain sufficient sensitivity.

On the other hand, it could be seen that Comparative Example 1 wherein (a-2) the specific dispersion resin was not used is inferior in sensitivity.

Examples 6 to 9 and Comparative Examples 3

Preparation 2 of Pigment Dispersion

The components in Composition (3) below were mixed and subjected to kneading dispersion with a twin roll to prepare pigment mixture.

[Composition (3)]

| | |
|---|---|
| C.I. pigment Green 36 | 50 parts by mass |
| C.I. pigment Yellow 150 | 50 parts by mass |
| Specific dispersion resin or comparative resin (described in Table 3 below) | 200 parts by mass |
| SOLSPERSE 32000 GR (manufactured by The Lubrizol Corporation; a polyester-based dispersant) | 20 parts by mass |
| Solvent: propylene glycol methyl ether acetate | 520 parts by mass |
| Specific pigment derivative or comparative compound (described in Table 3 below) | 5 parts by mass |

The following component was added to the pigment mixtures obtained above and finely dispersed for one day with a sand mill to obtain pigment dispersions (E to G) and comparative pigment dispersions (H-3 to H-4).

| | |
|---|---|
| Solvent [propylene glycol methyl ether acetate: PGMEA] | 350 parts by mass |

TABLE 3

| | (a-2) Specific pigment derivative or comparative compound | (a-3) Specific dispersion resin or comparative resin | Viscosity change (mPa · s) |
|---|---|---|---|
| Pigment dispersion E | Y-5 | 4 | 2 |
| Pigment dispersion F | Y-6 | 5 | 2 |
| Pigment dispersion G | Y-7 | 6 | 4 |
| Pigment dispersion H-3 | H-2 | 4 | 75 |
| Pigment dispersion H-4 | Y-5 | Comparative resin 2 | 5 |

The structures of (a-2) the specific pigment derivatives (Y-5) to (Y-7) according to the present invention and the comparative compound (H-2) described in Table 3 above are shown below.

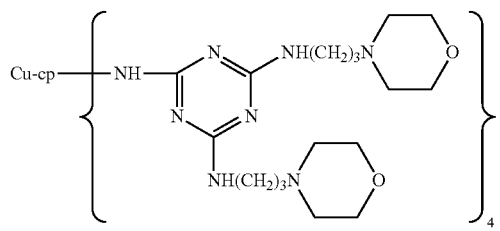

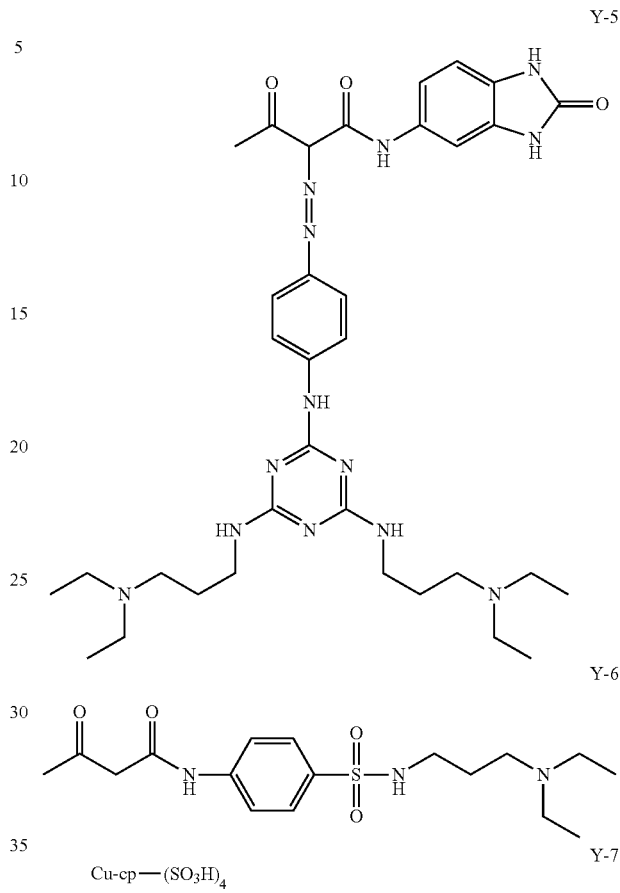

Cu-cp—(SO$_3$H)$_4$  Y-7

Cu-cp: Copper phthalocyanine residue
H-2
<Evaluation of the Pigment Dispersions>
The obtained pigment dispersions (E to G) according to the present invention and comparative pigment dispersions (H-3 to H-4) were measured and evaluated with respect to the viscosities in a similar manner to the pigment dispersions A to D. The results are also shown in Table 3.

As is evident from Table 3, the pigment dispersions E to G prepared by incorporating (a-2) the specific pigment derivative and (a-3) the specific dispersion resin are excellent in dispersion stability.

2-1. Preparation of Colored Curable Composition (Coating Liquid)

The following components were added to the pigment dispersion obtained by dispersing treatment as described above, and then mixed by stirring to prepare a curable composition solution.

| | |
|---|---|
| Pigment dispersion [described in Table 4 below] | 100 parts by mass |
| Pentaerythritol tetraacrylate | 3.8 parts by mass |
| Polymerization initiator [oxime ester initiator or comparative initiator described in Table 4 below] | 0.5 part by mass |
| Specific dispersion resin 4 above (powder) | 0.7 part by mass |
| Surfactant (trade name: TETRANIC 150R1, manufactured by BASF) | 0.2 part by mass |
| (3-Acryloxypropyl) methyldimethoxysilane | 0.05 part by mass |
| Solvent: PGMEA | 100 parts by mass |

TABLE 4

| | Pigment dispersion | Polymerization initiator | Sensitivity (mJ/cm²) | Developability |
|---|---|---|---|---|
| Example 6 | E | I-1 | 85 | No residue |
| Example 7 | E | I-2 | 75 | No residue |
| Example 8 | F | I-2 | 85 | No residue |
| Example 9 | G | I-3 | 80 | No residue |
| Comparative Example 3 | H-4 | IH-2 | 140 | Residue |

(B) The oxime initiators (I-1) and (I-2) described in Table 4 above are the above-described compounds. The structures of (B) the oxime initiator (I-3) and the comparative polymerization initiator (IH-2) are shown below.

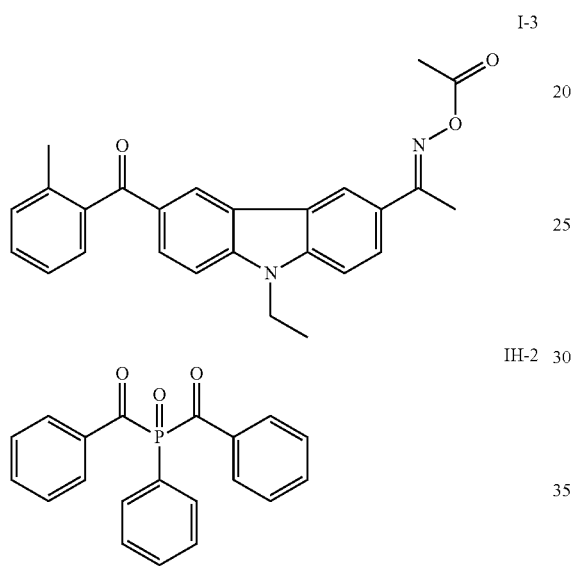

The coloring agent-containing curable composition prepared in each of Examples 6 to 9 and Comparative Example 3 described above was applied onto the 6-inch silicon substrate to form a curable composition layer (coating film) thereon. Then, the curable composition layer was subjected to heat treatment (pre-baking) on a hot plate at 100° C. for 120 seconds such that the coating film after drying became 0.8 µm in thickness.

Then, the coating film was exposed, through a 1.4-µm-square Island pattern mask, using light with a wavelength of 365 nm at a varying exposure amount from 50 to 1600 mJ/cm² from an i-line stepper exposure device FPA-3000i5+ (manufactured by Canon Inc.) such that a 1.4-µm-square Island pattern having the same size as that of the mask pattern could be obtained. In this process, the exposure amount of 50 mJ/cm² was measured with an optical illumination system, and with this exposure amount regarded as standard, the irradiation time was changed and cumulative exposure amount (mJ/cm²) was determined as sensitivity. As this numerical value is decreased, a high-resolution fine pattern can be formed with lower exposure amount, thus indicating that the composition has higher sensitivity. The results are also shown in Table 4 above.

Thereafter, the silicon wafer substrate on which the irradiated coating film had been formed was placed on a horizontal rotating table of a spin shower developer (DW-30, manufactured by Chemitronics Co., Ltd.) and subjected to paddle development at 23° C. for 60 seconds with CD-2000 (manufactured by FUJIFILM Electronics Materials Co., Ltd.) to form a colored pattern on the silicon wafer substrate.

The silicon wafer substrate having a colored pattern formed thereon was fixed to the horizontal rotating table by a vacuum chuck system, and the silicon wafer substrate was rotated at 50 r.p.m. with a rotating device and simultaneously rinsed with a shower of pure water supplied via a spraying nozzle from above the rotating center of the substrate and then spray-dried. Thereafter, a formed 1.4-µm-square colored pattern and its surrounding part were observed with a magnifying power of 20,000 using a length measuring SEM "S-9260A" (manufactured by Hitachi High-Technologies Corp.). Whether residues on the region not irradiated with light (unexposed portion) in the exposure step were present or not was observed to evaluate developability. The results are also shown in Table 4 above.

As is evident from Table 4, the colored curable composition of the present invention can form a fine colored region with high sensitivity with no residues after development and is thus can be seen to be excellent in developability in the unexposed portion. On the other hand, it could be seen that Comparative Example 3 wherein the acyl phosphine compound (IH-2) was used in place of (B) the oxime initiator and the pigment dispersion H-4 in which the comparative resin 2 was used in place of (a-3) the specific dispersion resin according to the present invention was used was inferior in sensitivity and developability.

Examples 10 to 14 and Comparative Examples 4 to 5

Preparation of Pigment Dispersion Composition

The components in Composition (5) below were mixed, and then stirred and mixed at a revolution number of 3,000 r.p.m. for 3 hours with a homogenizer to prepare pigment-containing mixed solutions (H to K, and H-5 to H-6).

[Composition (5)]

| | |
|---|---|
| C.I. Pigment Red 254 | 50 parts |
| C.I. pigment Red 177 | 50 parts |
| Specific dispersion resin (described in Table 5 below) | 200 parts |
| BYK111 (phosphate ester dispersant manufactured by BYK Chemie Japan) | 10 parts |
| Specific pigment derivative or comparative compound (described in Table 5 below) | 4 parts |
| 1-Methoxy-2-propyl acetate | 660 parts |

Subsequently, each of the mixed solutions obtained above was dispersed for 6 hours with a beads-dispersing machine DISPER MAT (manufactured by GETZMANN) using 0.3-mmφ zirconia beads and then further dispersed with a high-pressure dispersing machine NANO-3000-10 with a depressurization mechanism (manufactured by Beryu Co., Ltd.) under a pressure of 2000 kg/cm³ and at a flow rate of 500 g/min. This dispersing treatment was repeated 10 times to obtain red pigment dispersion compositions (H to K, H-5 to H-6).

TABLE 5

|  | (a-2) Specific pigment derivative or comparative compound | (a-3) Specific dispersion resin or comparative resin | Viscosity change (mPa·s) |
|---|---|---|---|
| Pigment dispersion H | Y-6 | 2 | 3 |
| Pigment dispersion I | Y-2 | 3 | 3 |
| Pigment dispersion J | Y-8 | 5 | 3 |
| Pigment dispersion K | Y-9 | 7 | 2 |
| Pigment dispersion H-5 | H-3 | 2 | 90 |
| Pigment dispersion H-6 | Y-1 | Comparative resin 1 | 3 |

The specific pigment derivatives (Y-1), (Y-2), and (Y-6) according to the present invention, described in Table 5, are the same compounds as above. The structures of the specific pigment derivatives (Y-8) and (Y-9), and the comparative compound (H-3) are shown below.

<Preparation of Curable Composition (Coating Liquid)>

The following components were added to the pigment dispersion obtained by dispersing treatment as described above, and then mixed under stirring to prepare a curable composition solution.

| Pigment dispersion [dispersion described in Table 6 below] | 100 parts by mass |
|---|---|
| DPHA (manufactured by Nippon Kayaku Co., Ltd.) | 3.8 parts by mass |
| Polymerization initiator [oxime ester initiator or comparative initiator described in Table 6 below] | 1.5 parts by mass |
| Benzyl methacrylate/methacrylic acid [molar ratio, 70/30, weight-average molecular weight 70,000] | 0.7 part by mass |
| Surfactant (trade name: Tetranic 150R1, manufactured by BASF) | 0.2 part by mass |
| Solvent: PGMEA | 100 parts by mass |

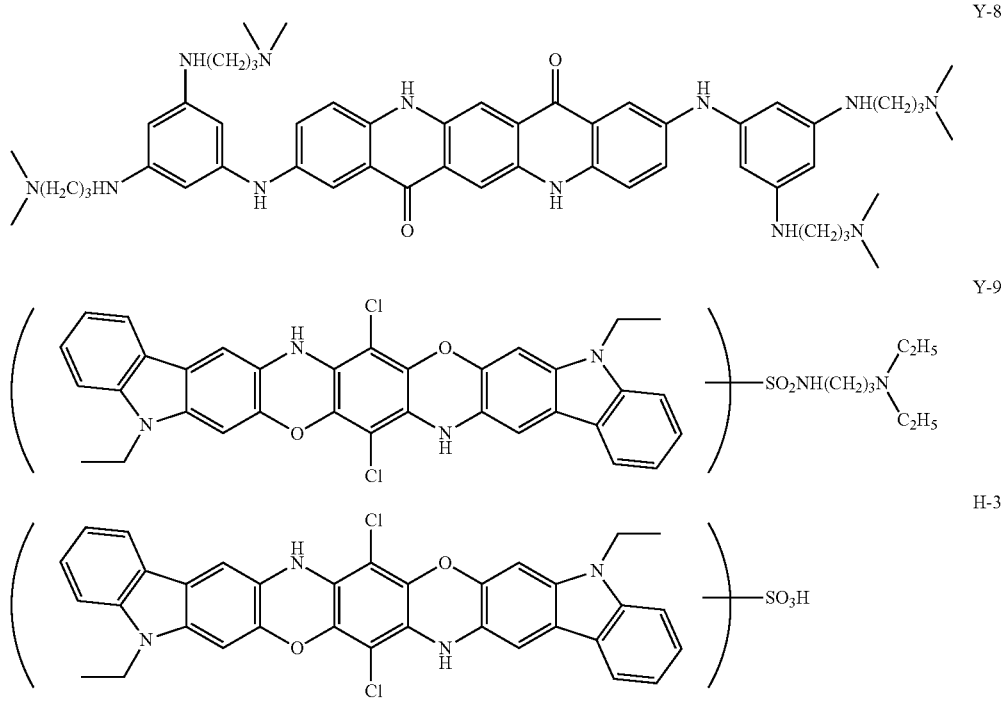

<Evaluation of Pigment Dispersions>

The resulting pigment dispersion compositions (H to K) and comparative pigment dispersions (H-5 to H-6) were evaluated with respect to dispersion stability in a similar manner to the pigment dispersions A to D. The obtained results are also shown in Table 5.

As is evident from Table 5, the pigment dispersions H to K prepared by incorporating (a-2) the specific pigment derivative and (a-3) the specific dispersion resin were excellent in dispersion stability.

Hereinafter, the present invention will be described with reference to an example of preparation of a coloring agent-containing curable composition for use in formation of a color filter for a liquid crystal display device.

TABLE 6

|  | Pigment dispersion | Polymerization initiator | Sensitivity (mJ/cm²) | Developability |
|---|---|---|---|---|
| Example 10 | H | I-1 | 85 | No residue |
| Example 11 | I | I-2 | 75 | No residue |
| Example 12 | J | I-2 | 75 | No residue |
| Example 13 | K | I-3 | 80 | No residue |
| Example 14 | H | I-3 | 80 | No residue |
| Comparative Example 4 | H-6 | I-1 | 110 | Residue |
| Comparative Example 5 | I | IH-1 | 145 | No residue |

(B) The oxime initiators (I-1), (I-2), (I-3), and (IH-1) described in Table 6 above were the above-described compounds.

<Preparation of Color Filter>

3-2. Formation of Curable Composition Layer

The pigment-containing curable composition as a resist solution was slit-coated on a 550 mm×650 mm glass substrate under the following conditions and then left for 10 minutes as it was, followed by vacuum drying and pre-baking (100° C., 80 seconds) to form a curable composition coating film (curable composition layer).

(Slit-Coating Conditions)

Space of an opening at the top of a coating head: 50 µm

Coating speed: 100 mm/sec

Clearance between the substrate and the coating head: 150 µm

Coating thickness (thickness after drying): 2 µm

Coating temperature: 23° C.

3-3. Exposure and Development

Thereafter, the photocurable coating film was subjected to patternwise exposure through a test photomask with a line width of 20 µm using a 2.5-kw ultrahigh pressure mercury lamp. After the exposure, the whole surface of the coating film was covered with 1% aqueous solution of alkali developer CDK-1 manufactured by FUJIFILM Electronics Materials Co., Ltd., and left for 40 seconds as it was.

3-4. Heat Treatment

After leaving it in the same condition, the coating film was sprayed with a shower of pure water to wash the developer away. The coating film thus subjected to photocuring treatment and developing treatment was then heated in an oven at 220° C. for 1 hour (post-baking). By this, a colored region of a resin film was formed on the glass substrate to give a colored pattern for a color filter.

[Evaluation of Performance]

The exposure amount necessary for curing the prepared curable composition coating film (colored layer) formed on the glass substrate by using the colored curable composition was measured as a sensitivity standard in a similar manner to that in Example 1. As this numerical value is decreased, the composition is shown to have higher sensitivity. The obtained results are shown in Table 6 above.

Further, the separately formed colored layer (20-µm-square) was exposed at an exposure amount of 100 mJ/cm$^2$ and then developed and post-baked under the same conditions as above. The formed colored region and its surrounding part were observed under similar conditions to those in Example 1 to confirm whether residues in the non-image portion were present or not. The obtained results are also shown in Table 6 above.

As is evident from Table 6, the colored curable composition of the present invention can form a fine colored region with high sensitivity with no residues after development and can thus be seen to be excellent in developability in the unexposed portion. On the other hand, it can be seen that in Comparative Example 5 wherein (IH-1) was used in place of (B) the oxime ester initiator and in Comparative Example 4 wherein the pigment dispersion H-6 not using (a-3) the specific dispersion resin according to the present invention was used, sensitivity and developability are inferior.

<Liquid Crystal Display Device>

Green and blue colored curable compositions were prepared in the same manner as the above-described curable composition, except that only the pigment was changed to a blue pigment and a green pigment as described in the specification.

First, a black matrix was formed on the substrate by a conventional method, and in the same manner as for the red curable composition, 20×20 µm red, green, and blue patterns were sequentially formed to prepare a color filter for a liquid crystal display device. The obtained color filter was introduced into the liquid crystal display device, and it was found that the liquid crystal display device was excellent in color property and contrast.

<Solid-State Imaging Device>

Green and blue colored curable compositions were prepared in the same manner as the above-described curable composition, except that only the pigment was changed to a blue pigment and a green pigment.

First, 1.6×1.6 µm red, green, and blue patterns were sequentially formed on the substrate in the same manner as for the red curable composition to prepare a color filter for a solid-state imaging device. The obtained color filter was introduced into the solid-state imaging device, and it was found that the solid-state imaging device was excellent in color separation property with high resolution.

The invention claimed is:

1. A colored curable composition comprising:

(A) a pigment dispersion containing (a-I) a pigment, (a-2) a compound having a pigment mother nucleus structure and an amino group in a molecule, and (a-3) a resin having an acid group and a polymerizable group;

(B) an oxime ester initiator; and (C) a polymerizable compound, wherein the compound (a-2) having a pigment mother nucleus structure and an amino group in a molecule is a compound having at least one of a cyclic amide structure or a cyclic urea structure, the pigment mother nucleus structure is a skeleton having an azo group, the content of the compound (a-2) is from 0.5 parts by mass to 50 parts by mass based on 100 parts by mass of the pigment (a-I), and the resin (a-3) having an acid group and a polymerizable group is a urethane resin having at least one functional group represented by general formula (1), (2) or (3) or a styrene-based resin having, in a side chain thereof, at least one of a styrenic double bond represented by general formula (23) or a vinylpyridinium group represented by general formula (24):

$$—X—\underset{R^1}{\overset{O}{\underset{\|}{C}}}—\underset{}{\overset{R^3}{\underset{R^2}{C=C}}}$$ General Formula (1)

wherein in general formula (1), $R^1$ to $R^3$ each independently represents a hydrogen atom or a monovalent organic group; and X represents an oxygen atom, a sulfur atom, or —N(R$^{12}$)—, and R$^{12}$ represents a hydrogen atom or a monovalent organic group;

$$—Y—\underset{R^5}{\overset{R^4}{\underset{|}{C}}}—\underset{R^6}{\overset{R^8}{\underset{|}{C}}}=\underset{R^7}{\overset{}{\underset{|}{C}}}$$ General Formula (2)

wherein in general formula (2), $R^4$ to $R^8$ each independently represents a hydrogen atom or a monovalent organic group; and Y represents an oxygen atom, a sulfur atom, or —N(R$^{12}$)—; and R$^{12}$ has the same meaning as R$^{12}$ in general formula (1);

General Formula (3)

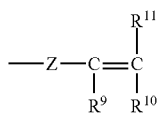

wherein in general formula (3), $R^9$ represents a hydrogen atom or an alkyl group which may have a substituent; $R^{10}$ and $R^{11}$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, or an arylsulfonyl group which may have a substituent;

Z represents an oxygen atom, a sulfur atom, —N($R^{13}$)—, or a phenylene group which may have a substituent, and $R^{13}$ represents an alkyl group which may have a substituent;

General Formula (23)

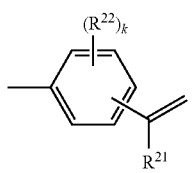

wherein in general formula (23), $R^{21}$ represents a hydrogen atom or a methyl group, $R^{22}$ represents an arbitrary atom or atomic group which can be substituted, and k represents an integer of 0 to 4;

General Formula (24)

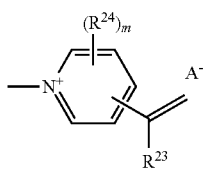

wherein in general formula (24), $R^{23}$ represents a hydrogen atom or a methyl group, $R^{24}$ represents an arbitrary atom or atomic group which can be substituted, m represents an integer of 0 to 4, and $A^-$ represents an anion, provided that the pyridinium ring may take the form of benzopyridinium where a benzene ring is condensed as a substituent, wherein the oxime ester initiator is compound I-2:

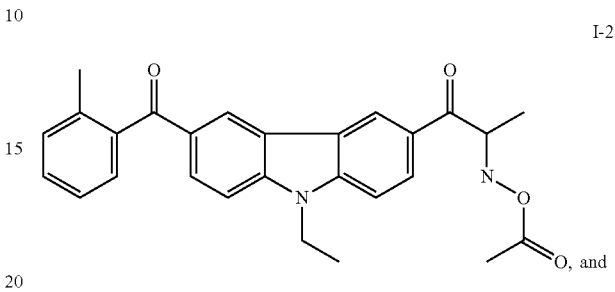

I-2 wherein the colored curable composition further comprises a binder polymer having an acid value of from 0.1 mmol/g to 10 mmol/g.

2. The colored curable composition of claim 1, wherein the compound (a-2) having a pigment mother nucleus structure and an amino group in a molecule is a compound having a heterocyclic structure.

3. The colored curable composition of claim 1, which is used for formation of a colored region of a color filter.

4. A color filter having a colored region formed by using the colored curable composition of claim 3.

5. A solid-state imaging device comprising the color filter of claim 4.

6. The solid-state imaging device of claim 5, wherein the binder polymer comprises an acid group selected from the group consisting of a carboxyl group, a sulfonamide group, a sulfonic acid group, a phosphonic acid group, and a phenol group.

7. The color filter of claim 4, wherein the binder polymer comprises an acid group selected from the group consisting of a carboxyl group, a sulfonamide group, a sulfonic acid group, a phosphonic acid group, and a phenol group.

8. The colored curable composition of claim 1, wherein the binder polymer comprises an acid group selected from the group consisting of a carboxyl group, a sulfonamide group, a sulfonic acid group, a phosphonic acid group, and a phenol group.

9. The colored curable composition of claim 1, wherein the compound (a-2) has a cyclic urea structure.

\* \* \* \* \*